(12) United States Patent
Atanackovic

(10) Patent No.: US 11,127,882 B2
(45) Date of Patent: Sep. 21, 2021

(54) RESONANT OPTICAL CAVITY LIGHT EMITTING DEVICE

(71) Applicant: Silanna UV Technologies Pte Ltd, Singapore (SG)

(72) Inventor: Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 16/846,704

(22) Filed: Apr. 13, 2020

(65) Prior Publication Data
US 2020/0243715 A1    Jul. 30, 2020

Related U.S. Application Data

(63) Continuation of application No. 16/160,868, filed on Oct. 15, 2018, now Pat. No. 10,622,514.

(51) Int. Cl.
*H01L 33/10* (2010.01)
*H01L 33/00* (2010.01)
(Continued)

(52) U.S. Cl.
CPC .......... *H01L 33/105* (2013.01); *H01L 33/007* (2013.01); *H01L 33/0012* (2013.01);
(Continued)

(58) Field of Classification Search
CPC . H01L 33/105; H01L 33/465; H01L 33/0025; H01L 33/007; H01L 33/0075;
(Continued)

(56) References Cited

U.S. PATENT DOCUMENTS 5,493,577 A    2/1996  Choquette et al.
5,677,924 A *  10/1997 Bestwick .............. H01L 33/105
                                                              372/96
(Continued)

FOREIGN PATENT DOCUMENTS

JP    2009505420 A    2/2009
JP    2009517870 A    4/2009
(Continued)

OTHER PUBLICATIONS

Blondelle et al, High efficiency Planar Microcavity LEDs: Comparison of Design and Experiment, IEEE Photonics Tech. Lett., vol. 7 No. 3, p. 287-289,Mar. 1995.
(Continued)

*Primary Examiner* — Sonya McCall-Shepard
(74) *Attorney, Agent, or Firm* — MLO, a professional corp.

(57) ABSTRACT

Resonant optical cavity light emitting devices are disclosed, where the device includes an opaque substrate, a first reflective layer, a first spacer region, a light emitting region, a second spacer region, and a second reflective layer. The light emitting region is configured to emit a target emission deep ultraviolet wavelength and is positioned at a separation distance from the reflector. The second reflective layer may have a metal composition comprising elemental aluminum and a thickness less than 15 nm. The device has an optical cavity comprising the first spacer region, the second spacer region and the light emitting region, where the optical cavity has a total thickness less than or equal to $K \cdot \lambda/n$. $K$ is a constant ranging from 0.25 to 10, $\lambda$ is the target wavelength, and $n$ is an effective refractive index of the optical cavity at the target wavelength.

17 Claims, 47 Drawing Sheets

(51) Int. Cl.
*H01L 33/06* (2010.01)
*H01L 33/60* (2010.01)
*H01L 33/32* (2010.01)
*H01L 33/46* (2010.01)
*H01S 5/183* (2006.01)

(52) U.S. Cl.
CPC ...... *H01L 33/0025* (2013.01); *H01L 33/0075* (2013.01); *H01L 33/06* (2013.01); *H01L 33/32* (2013.01); *H01L 33/465* (2013.01); *H01L 33/60* (2013.01); *H01S 5/18375* (2013.01); *H01L 2933/0058* (2013.01); *H01S 2301/173* (2013.01)

(58) Field of Classification Search
CPC ..... H01L 33/32; H01L 33/06; H01L 33/0012; H01L 2933/0058; H01L 33/60; H01L 33/405
See application file for complete search history.

(56) References Cited

U.S. PATENT DOCUMENTS

| | | | |
|---|---|---|---|
| 5,719,891 A | 2/1998 | Jewell | |
| 5,780,867 A | 7/1998 | Fritz et al. | |
| 6,969,874 B1 | 11/2005 | Gee et al. | |
| 8,053,978 B2 | 11/2011 | Hwang et al. | |
| 8,331,410 B2 | 12/2012 | Lebby et al. | |
| 9,082,735 B1 | 7/2015 | Sundararajan | |
| 9,240,517 B2 | 1/2016 | Johnston et al. | |
| 9,240,533 B2 | 1/2016 | Lee et al. | |
| 9,246,311 B1 | 1/2016 | Raring et al. | |
| 9,252,329 B2 | 2/2016 | Northrup et al. | |
| 9,269,788 B2 | 2/2016 | Gaska et al. | |
| 9,281,439 B2 | 3/2016 | Niwa et al. | |
| 9,281,441 B2 | 3/2016 | Shur et al. | |
| 9,281,445 B2 | 3/2016 | Donofrio | |
| 9,287,442 B2 | 3/2016 | Shatalov et al. | |
| 9,287,449 B2 | 3/2016 | Gaska et al. | |
| 9,287,455 B2 | 3/2016 | Shur et al. | |
| 9,293,670 B2 | 3/2016 | Toita et al. | |
| 9,299,880 B2 | 3/2016 | Grandusky et al. | |
| 9,312,428 B2 | 4/2016 | Shatalov et al. | |
| 9,312,448 B2 | 4/2016 | Lunev et al. | |
| 9,318,650 B2 | 4/2016 | Zhang | |
| 9,318,652 B1 | 4/2016 | Liao et al. | |
| 9,330,906 B2 | 5/2016 | Shatalov et al. | |
| 9,331,240 B2 | 5/2016 | Khan et al. | |
| 9,331,244 B2 | 5/2016 | Shatalov et al. | |
| 9,331,246 B2 | 5/2016 | Kneissl et al. | |
| 9,337,387 B2 | 5/2016 | Shatalov et al. | |
| 9,356,192 B2 | 5/2016 | Pernot et al. | |
| 9,368,580 B2 | 6/2016 | Shatalov et al. | |
| 9,368,582 B2 | 6/2016 | Kizilyalli et al. | |
| 9,385,271 B2 | 7/2016 | Shur et al. | |
| 9,397,260 B2 | 7/2016 | Jain et al. | |
| 9,397,269 B2 | 7/2016 | Chae et al. | |
| 9,401,452 B2 | 7/2016 | Northrup et al. | |
| 9,401,456 B2 | 7/2016 | Lee et al. | |
| 9,412,901 B2 | 8/2016 | Shur et al. | |
| 9,412,902 B2 | 8/2016 | Shatalov et al. | |
| 9,412,922 B2 | 8/2016 | Jang et al. | |
| 9,437,430 B2 | 9/2016 | Schowalter et al. | |
| 9,437,774 B2 | 9/2016 | Gaska et al. | |
| 9,437,775 B2 | 9/2016 | Takeuchi et al. | |
| 9,444,224 B2 | 9/2016 | Chua et al. | |
| 9,450,157 B2 | 9/2016 | Yamada et al. | |
| 9,455,300 B1 | 9/2016 | Collins et al. | |
| 9,461,198 B2 | 10/2016 | Liao et al. | |
| 9,466,761 B2 | 10/2016 | Choi et al. | |
| 9,468,695 B2 | 10/2016 | Liao et al. | |
| 9,496,455 B2 | 11/2016 | Park et al. | |
| 9,502,509 B2 | 11/2016 | Shatalov et al. | |
| 9,502,606 B2 | 11/2016 | Pernot et al. | |
| 2003/0209714 A1 | 11/2003 | Taskar et al. | |
| 2015/0214425 A1 | 7/2015 | Taylor | |

FOREIGN PATENT DOCUMENTS

| | | |
|---|---|---|
| KR | 20150053156 A | 5/2015 |
| KR | 20150069845 A | 6/2015 |

OTHER PUBLICATIONS

Ching et al, Optical Processes in Microcavities, Advanced Series in Applied Physics, vol. 3, World Scientific, Apr. 1996, 75 pages.
International Search Report dated May 17, 2017 for PCT Patent Application No. PCT/IB2017/050880.
Notice of Allowance dated Dec. 11, 2019 for U.S. Appl. No. 16/160,868.
Notice of Allowance dated May 1, 2019 for U.S. Appl. No. 16/115,942.
Notice of Allowance dated May 14, 2018 for U.S. Appl. No. 15/643,227.
Office Action dated Dec. 28, 2017 for U.S. Appl. No. 15/643,227.
Office Action dated Oct. 30, 2019 for U.S. Appl. No. 16/160,868.
Piestun and Miller, Electromagnetic degrees of freedom of an optical system, J. Opt. Soc. Am. A., vol. 17, No. 5, p. 892-902, May 2000.
Saleh and Teich, Fundaments of Photonics: Resonator Optics, Wiley, Jan. 1991, pp. 272-309.
Schubert et al, High Efficiency Light-Emitting Diodes with Microcavities, Science, New Series, vol. 256, Issue 5174, p. 943-945, Sep. 1994.
Vahala, Optical microcavities, Nature Publishing Group, vol. 424, p. 839-846, Aug. 2003.

* cited by examiner

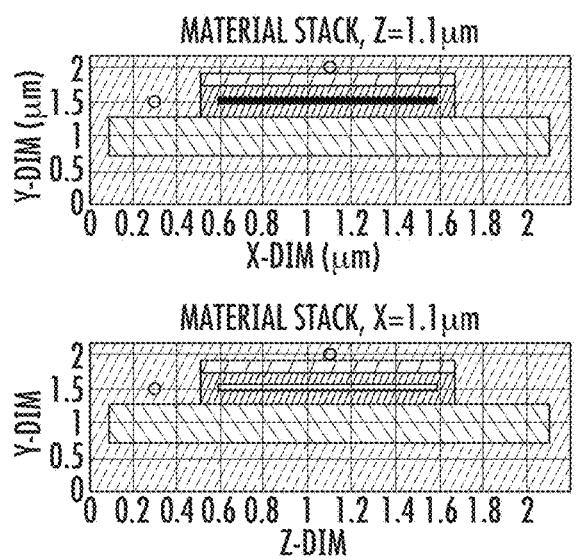
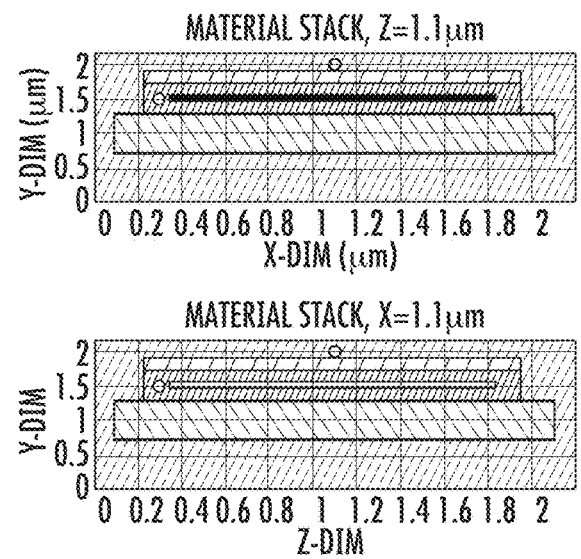
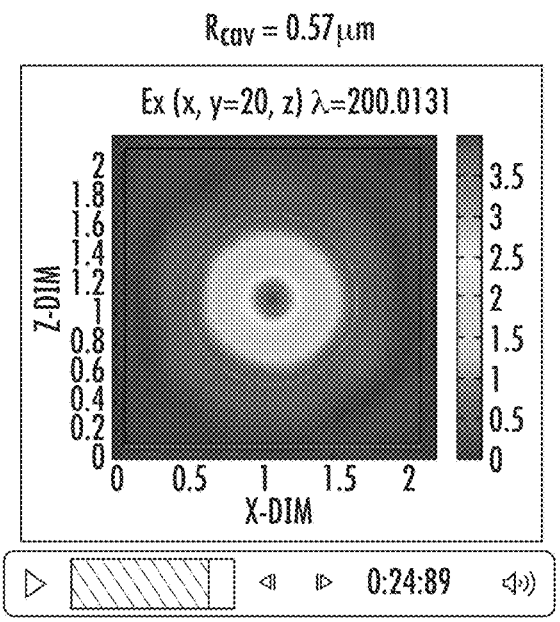
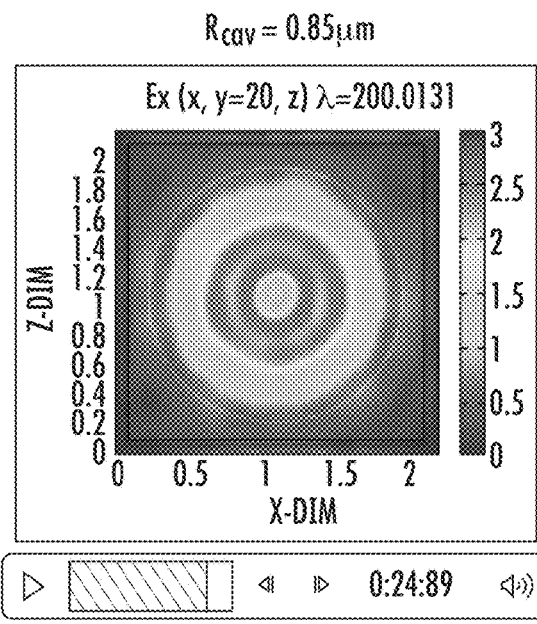
FIG. 18B  FIG. 18C

RESONANT OPTICAL CAVITY LIGHT EMITTING DEVICE

RELATED APPLICATIONS

This application is a continuation of U.S. patent application Ser. No. 16/160,868, filed on Oct. 15, 2018 and entitled Resonant Optical Cavity Light Emitting Device, which is hereby incorporated by reference. U.S. patent application Ser. No. 16/160,868 is related to U.S. patent application Ser. No. 16/115,942, filed on Aug. 29, 2018 and entitled "Resonant Optical Cavity Light Emitting Device"; U.S. patent application Ser. No. 15/643,227, filed on Jul. 6, 2017 and entitled "Resonant Optical Cavity Light Emitting Device"; and International Patent Application Number PCT/IB2017/050880, filed on Feb. 16, 2017 and entitled "Resonant Optical Cavity Light Emitting Device"; which claims priority to U.S. Provisional Patent Application No. 62/298,846 filed on Feb. 23, 2016 and entitled "Resonant Optical Cavity Light Emitting Device"; all of which are incorporated herein by reference in their entirety.

BACKGROUND

PIN diodes are diodes with p-type and n-type regions and an intrinsic region between. In light emitting diodes (LEDs), electrons and holes injected from the p-type and n-type source regions recombine within the intrinsic region, generating light. The type of materials used for the p-type, i-type and n-type regions in the LED determine the wavelength of light emitted from the device.

Simple PIN diodes typically exhibit poor light (radiation) extraction properties which ultimately limits the useful production of light. This is due to the high refractive index of the materials used to make LEDs and the large number of available optical modes within the LED which results in a small escape cone for emitted light from the device. Light generated within the device and having propagation vectors outside this cone do not escape the device and is subjected to total internal reflection, thus being attenuated within the device and not escaping as available light. Typically, known LEDs exhibit approximately less than 5% light extraction efficiency from a planar device, depending primarily upon the refractive index of the material through which the light travels.

One method for increasing efficiency of radiation extraction in such devices is texturing the surface through which radiation exits the device. Such a textured escape surface provides a slightly larger escape cone for radiation from the device. Another method is shaping the top or bottom surface of the LED, such as in a parabolic shape, to improve refraction and reflection of light beams and thus improve light extraction. Alternatively, researchers have also grown epitaxial semiconductors on a textured substrate surface to improve vertical light extraction; however, the penalty in disordered semiconductor crystal structure has severely limited this approach. Coatings can also be used in LEDs to affect emission of certain wavelengths of light, and thus improve the spectral light quality produced by the device.

Different structures of light emitting diodes also present specific design issues for extracting light. For example, edge emitting lasers are one type of light emitting device, where light is propagated in a direction substantially parallel to the device layers and is emitted from the edges of the device. Numerous edge emitting LEDs and lasers are fabricated from a semiconductor wafer and are diced into individual devices, where the cleaved, etched or cut edges become the facet surfaces from which light is emitted. For the case of waveguide LEDs, optical reflection from the facets into the active region is suppressed by Brewster angle configuration, whereas for lasers the facets at either end of the planar cavity must be precisely parallel and of high reflectance. Vertical cavity surface emitting diodes (VCSEDs) and lasers (VCSELs) are another type of light emitting diode where light is propagated substantially perpendicularly to the plane of the device layers and is emitted through the top or bottom surface of the device. The optical cavity can be designed with a resonance to improve emission of a particular wavelength. An advantage of planar VCSEDs and VCSELs is the ability to scale the output power of the device by increasing the planar area of the device. The vertical and lateral optical confinement can also be used to control the optical modes of the device and thus improve the spatial emission profile and spectral quality.

SUMMARY

In some embodiments, a resonant optical cavity light emitting device comprises a substrate, a first reflective layer, a first spacer region, a light emitting region, a second spacer region, and a second reflective layer. The first reflective layer is on the substrate, the first reflective layer having a metal composition comprising elemental aluminum and having a thickness greater than 15 nm. The first spacer region is coupled to the first reflective layer, the first spacer region being non-absorbing to the target emission deep ultraviolet wavelength (target wavelength), where at least a portion of the first spacer region comprises a first electrical polarity. The light emitting region is on the first spacer region, the light emitting region being configured to emit the target wavelength. The second spacer region is on the light emitting region, the second spacer region being non-absorbing to the target wavelength, where at least a portion of the second spacer region comprises a second electrical polarity opposite of the first electrical polarity. The second reflective layer is coupled to the second spacer region, the second reflective layer having a metal composition comprising elemental aluminum and having a thickness less than or equal to 15 nm. The first spacer region, the light emitting region and the second spacer region comprise AlN or AlGaN. The light emitting region is positioned at a separation distance from the second reflective layer. The resonant optical cavity light emitting device has an optical cavity between the second reflective layer and the first reflective layer, the optical cavity comprising the first spacer region, the second spacer region and the light emitting region. The optical cavity has a total thickness less than or equal to $K \cdot \lambda/n$, wherein K is a constant ranging from 0.25 to 10, $\lambda$ is the target wavelength, and n is an effective refractive index of the optical cavity at the target wavelength.

In some embodiments, a resonant optical cavity light emitting device comprises a substrate, a first reflective layer, a first spacer region, a light emitting region, a second spacer region, and a second reflective layer. The first reflective layer is on the substrate, the first reflective layer having a metal composition comprising elemental aluminum and having a thickness less than or equal to 15 nm. The first spacer region is coupled to the first reflective layer, the first spacer region being non-absorbing to the target emission deep ultraviolet wavelength (target wavelength), where at least a portion of the first spacer region comprises a first electrical polarity. The light emitting region is on the first spacer region, the light emitting region being configured to emit the target wavelength. The second spacer region is on the light emitting region, the second spacer region being non-absorbing to the target wavelength, where at least a portion of the second spacer region comprises a second electrical polarity opposite of the first electrical polarity. The second reflective layer is coupled to the second spacer region, the second reflective layer having a metal composition comprising elemental aluminum and having a thickness greater than 15 nm. The first spacer region, the light emitting region and the second spacer region comprise AlN or AlGaN. The light emitting region is positioned at a separation distance from the second reflective layer. The resonant optical cavity light emitting device has an optical cavity between the second reflective layer and the first reflective layer, the optical cavity comprising the first spacer region, the second spacer region and the light emitting region. The optical cavity has a total thickness less than or equal to $K \cdot \lambda/n$, wherein K is a constant ranging from 0.25 to 10, $\lambda$ is the target wavelength, and n is an effective refractive index of the optical cavity at the target wavelength.

In some embodiments, a resonant optical cavity light emitting device comprises a substrate, a first reflective layer, a first spacer region, a light emitting region, a second spacer region, and a second reflective layer. The substrate is opaque to a target emission deep ultraviolet wavelength (target wavelength). The first reflective layer is on the substrate, the first reflective layer being a distributed Bragg reflector (DBR) superlattice that has a reflectivity of greater than 90% for the target wavelength. The first spacer region is coupled to the first reflective layer, the first spacer region being non-absorbing to the target wavelength, where at least a portion of the first spacer region comprises a first electrical polarity. The light emitting region is on the first spacer region, the light emitting region being configured to emit the target wavelength. The second spacer region is on the light emitting region, the second spacer region being non-absorbing to the target wavelength, where at least a portion of the second spacer region comprises a second electrical polarity opposite of the first electrical polarity. The second reflective layer is coupled to the second spacer region, the second reflective layer having a metal composition comprising elemental aluminum and having a thickness less than 15 nm. The light emitting region is positioned at a separation distance from the second reflective layer. The resonant optical cavity light emitting device has an optical cavity between the second reflective layer and the first reflective layer, the optical cavity comprising the first spacer region, the second spacer region and the light emitting region. The optical cavity has a total thickness less than or equal to $K \cdot \lambda/n$, wherein K is a constant ranging from 0.25 to 10, $\lambda$ is the target wavelength, and n is an effective refractive index of the optical cavity at the target wavelength.

In some embodiments, a resonant optical cavity light emitting device comprises a substrate, a first reflective layer, a first spacer region, a light emitting region, a second spacer region, and a second reflective layer. The substrate is opaque to a target emission deep ultraviolet wavelength (target wavelength). The first reflective layer is on the substrate, the first reflective layer comprising a dielectric semiconductor. The first spacer region is coupled to the first reflective layer, the first spacer region being non-absorbing to the target wavelength, where at least a portion of the first spacer region comprises a first electrical polarity. The light emitting region is on the first spacer region, the light emitting region being configured to emit the target wavelength. The second spacer region is on the light emitting region, the second spacer region being non-absorbing to the target wavelength, where at least a portion of the second spacer region comprises a second electrical polarity opposite of the first electrical polarity. The second reflective layer is coupled to the second spacer region, the second reflective layer having a metal composition comprising elemental aluminum and having a thickness less than 15 nm. The light emitting region is positioned at a separation distance from the second reflective layer. The resonant optical cavity light emitting device has an optical cavity between the second reflective layer and the first reflective layer, the optical cavity comprising the first spacer region, the second spacer region and the light emitting region. The optical cavity has a total thickness less than or equal to $K \cdot \lambda/n$, wherein K is a constant ranging from 0.25 to 10, $\lambda$ is the target wavelength, and n is an effective refractive index of the optical cavity at the target wavelength.

BRIEF DESCRIPTION OF THE DRAWINGS

FIGS. 18B-18C are exemplary simulations of cylindrical devices corresponding to FIG. 18A.

DETAILED DESCRIPTION

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter covers all such modifications and variations within the scope of the appended claims and their equivalents.

Figure 1:
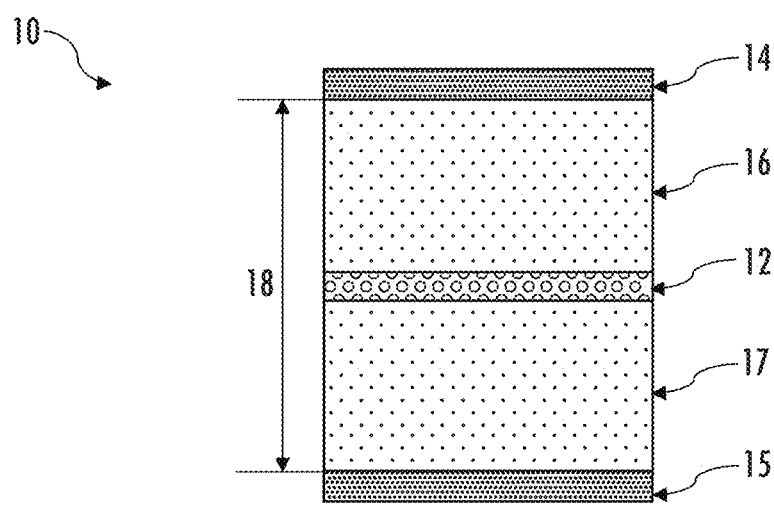
FIG. 1 is a vertical cross-section of a resonant optical cavity light emitting device known in the art.

Resonant optical cavity light emitting devices (ROCLEDs) are a type of light emitting device which are designed to create resonance at a particular wavelength using the principles of a Fabry-Perot resonator along a principal axis, to increase emission of that wavelength from the device. FIG. 1 shows a vertical cross-section of a general schematic of a ROCLED 10 known in the art as a Fabry-Perot type light emitting device, where a light emitting region 12 (LER, also referred to as an emission or active region) is placed between two reflectors 14 and 15. The reflectors 14 and 15 are typically selected from a high reflector (reflectance) and a partial reflector, where the partial reflector is used to extract a portion of the light from within the cavity. High quality reflectors can be made of metals, or of periodic bilayered dielectric or semiconductor materials to form distributed Bragg reflectors (DBRs). For the case of metallic reflectors, the overall length 18 of the optical cavity is the distance between the two reflectors 14 and 15. For the case of DBR reflectors, there is substantial spatial penetration of the optical field into the DBR which strongly depends upon the refractive index difference between the quarter-wave thickness materials used to form the DBR. This DBR penetration distance is particularly disadvantageous for application to ultraviolet application, as it may become of the same length scale as the desired optical cavity length, thereby rendering wavelength scale cavity formation challenging. Furthermore, for application to ultraviolet wavelengths the selection of materials suitable for DBR formation are severely limited and the desire for large refractive index difference between quarter wave layers further places limits on available materials.

In the description of FIG. 1, the device will be considered as a resonant optical cavity formed with negligible penetration depth reflectors. A spacer 16 is positioned between the upper reflector 14 and the LER 12, and another spacer 17 is between the lower reflector 15 and the LER 12. The resonant wavelength of the LED is determined by the dimensions of the optical cavity, such as the overall length 18 of the optical cavity and the lengths of the spacers 16 and 17. Note that in this disclosure, quantities labeled as a vertical length "L" in the figures may also be referred to as a thickness, such as a thickness of a particular region or layer. When electrical current is applied to the device 10, electrons and holes created in the n-type and p-type regions (spacers 16 and 17) are transported spatially into the i-region (LER 12) by drift and diffusion processes where they can recombine, generating spontaneous emission of light within the active region (LER 12). Furthermore, if excitation of simultaneously large electron and hole carrier densities in the LER can be achieved within upper excited states and with sufficiently long lifetime before relaxing to a lower energy state, then stimulated emission is possible. Such an electronic upper state configuration can be designed by appropriate design of semiconductor quantum mechanical states, such as quantum well and superlattice heterostructures. This excited LER active region can then be subject to stimulated emission process by virtue of the photon recycling within the cavity due to the mirrors (reflectors). A propagating photon within the cavity of energy equal to the transition energy of the electron-hole pair is stimulated to relax from the excited carrier states into a lower energy or ground state. Such a resonant optical cavity device can therefore become a semiconductor laser.

Although resonant optical cavity LEDs are known in the art, they have not been used for deep ultraviolet (deep UV, or DUV) wavelengths which operate in the 200-280 nm range. DUV wavelengths present new challenges in terms of the materials and design criteria that must be overcome, which are not a straightforward extension of existing designs. In the present disclosure, resonant cavity light emitting devices for deep ultraviolet wavelengths with improved efficiency are presented that overcome issues unique to this wavelength range.

Figure 2:
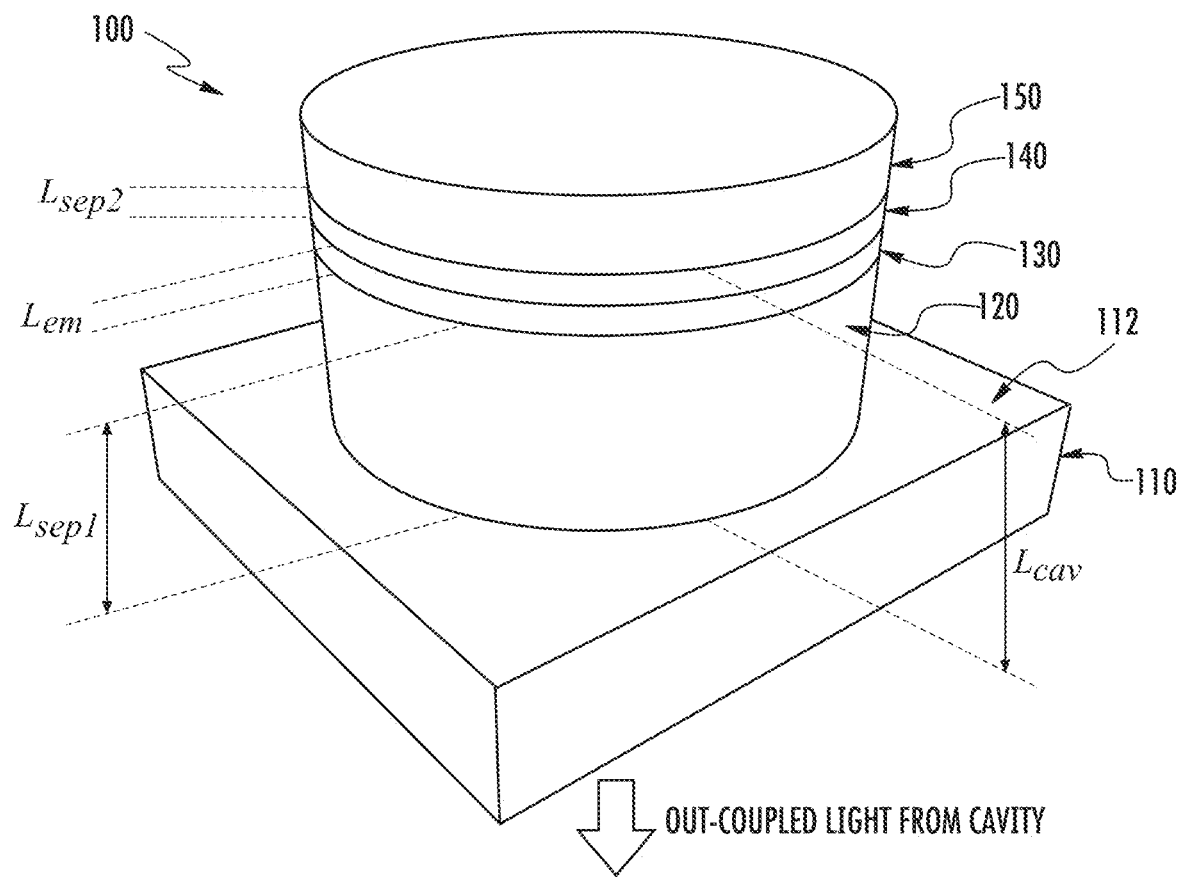
FIG. 2 is a perspective view of a deep ultraviolet resonant optical cavity light emitting device, in accordance with some embodiments of the present disclosure.

FIG. 2 is an exemplary embodiment of a deep ultraviolet resonant optical cavity light emitting device 100 according to the present disclosure. FIG. 2 is a perspective view showing a simplified diagram, for clarity. Device 100 has: a transparent substrate 110 which may be, for example, glass or sapphire or calcium fluoride; a first substantially transparent spacer 120 on the substrate 110; a radiation emission region 130 which is an active or intrinsic region where electrons and holes advantageously combine to emit UV radiation typically at about 280 nm or less; a second substantially transparent spacer 140; and a reflector 150 above the second spacer 140. Device 100 has a cylindrical geometry in this embodiment. The resonant optical cavity has a length $L_{CAV}$ between the reflector 150 and the first surface 112 of the transparent substrate 110. The radiation or light emission region or LER 130 has a length $L_{EM}$, first spacer 120 has a length $L_{SEP1}$, and second spacer 140 has a length $L_{SEP2}$. $L_{CAV}$ is typically chosen to be the equivalent to an optical thickness which can be selected to be a multiple of a half-wavelength of the target wavelength to be produced. In general, $L_{CAV}=m\cdot\lambda/n(\lambda)$, where m>0, $\lambda$ is the desired operating wavelength and n(λ) is the effective refractive index of the cavity material at λ.

A large variety of optical cavity devices are possible depending upon the reflector properties and the effective optical thickness with respect to the operating wavelength. For example, sub-wavelength and wavelength scale optical cavities are possible using low optical penetration depth reflectors such as metallic mirrors. Cavity lengths greater than the operating wavelength and multiples thereof are also possible. The effective optical thickness of the cavity determines the longitudinal mode density and frequency spacing of the modes within the device. Reducing the total number of non-propagating optical modes for light generated within the structure and increasing the overlap of propagating optical modes with the LER region may be beneficial for improving the light extraction efficiency.

The reflector 150 is a high UV reflectance metal, chosen preferably to be aluminum (Al) for the desired emitted radiation in the deep UV range. The aluminum metal reflector 150 of the present disclosure provides a very small penetration depth for the deep UV radiation emitted by the radiation emission region 130. For integration into group-III metal nitride epitaxy—the AlN-based semiconductors—at least a portion of the Al-metal reflector 150 can be deposited in-situ within the epitaxial deposition system by virtue of the Al metal being one of the constituent deposition sources. In conjunction with in-situ film thickness monitoring, this in-situ reflector process can be used to precisely form an optical cavity device as described herein.

The LER 130 is configured such that UV radiation with a wavelength of less than 280 nm is emitted. Possible materials for light emitting region 130 include, for example, group III-N materials such as AlN, GaN, and AlGaN, and superlattice configurations of these materials. In some embodiments, the LER 130 may include one or multiple quantum wells. In yet another embodiment, the LER 130 may be a bulk-like AlGaN alloy that is subject to external mechanical stressors to tune the desired optoelectronic properties. The first spacer 120 may comprise at least a portion of an n-type material with the second spacer 140 being at least a portion of p-type, or vice versa. The spacers 120 and 140 are substantially transparent—that is, non-absorbing or optically transparent—to the desired wavelength (also referred to as a target wavelength in this disclosure) emitted by the device. For example, the first and second spacer regions 120 and 140 may be at least 80% transparent to the target wavelength produced by device 100, such as greater than 90% transparent. The refractive index of the substrate 110 is preferably less than the refractive index of the spacers 120 and 140. The refractive index difference between the first spacer region 120 and the transparent substrate 110 forms a partially reflecting interface that can be further used to tune the optical cavity.

In other embodiments, substrate 110 may be opaque to the target wavelength. The opaque substrate can then have an optical port etched through the substrate and terminating at least at the first spacer region. An optional coating can further be deposited on the exposed portion of the first spacer to form a second reflector. For example, a Bosch etch process can be used to etch an optical via beneath the active region of the optical device. A partially transmitting metal reflector can then be deposited to form the optical cavity. Alternatively, one or more dielectric transparent coatings can be applied to the exposed portion of the first spacer, such as, a high-low index DBR or metalo-dielectric DBR, as disclosed herein.

Figure 3:
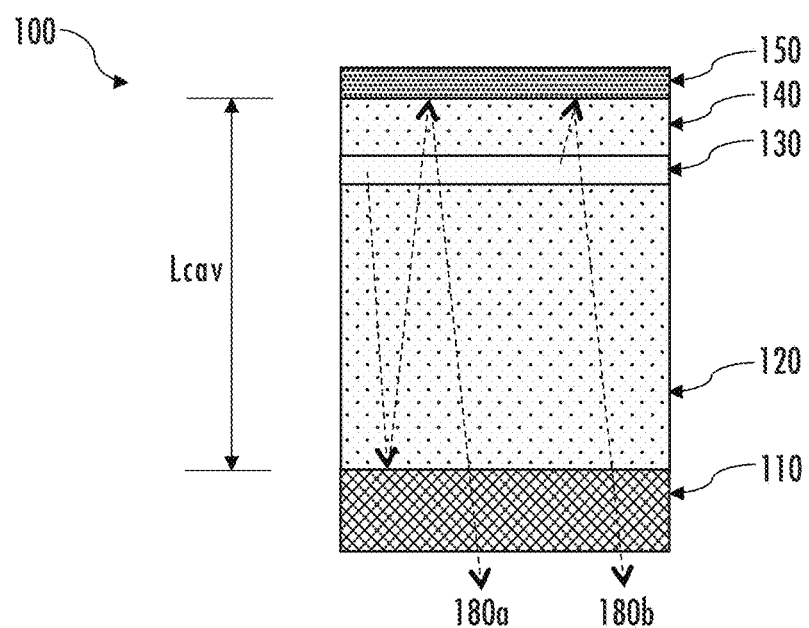
FIG. 3 is a vertical cross-section of the device of FIG. 2.

FIG. 3 shows a vertical cross-sectional view of the deep UV LED device 100, demonstrating the propagation of light. Light generated in the light emitting region 130 will propagate outward, such as in a downward direction as indicated by ray 180a and in an upward direction as indicated by ray 180b. For ray 180a, some light will be reflected at the interface between substrate 110 and first spacer 120, due to the difference in refractive indices of these two materials. Ray 180a will then reflect off reflector 150, and then ultimately will be emitted through transparent substrate 110 (or through an optical port in the substrate if substrate 110 is opaque). For ray 180b, light will be reflected off reflector 150 and then exit through substrate 110. Note that FIG. 3 is a simplified diagram, in that the light rays 180a and 180b will have additional propagation paths due to varying amounts of transmission and reflection at the interfaces between layers of the device 100. Furthermore, three dimensional devices will further have lateral features that participate in optical reflection and absorption.

Figure 22:
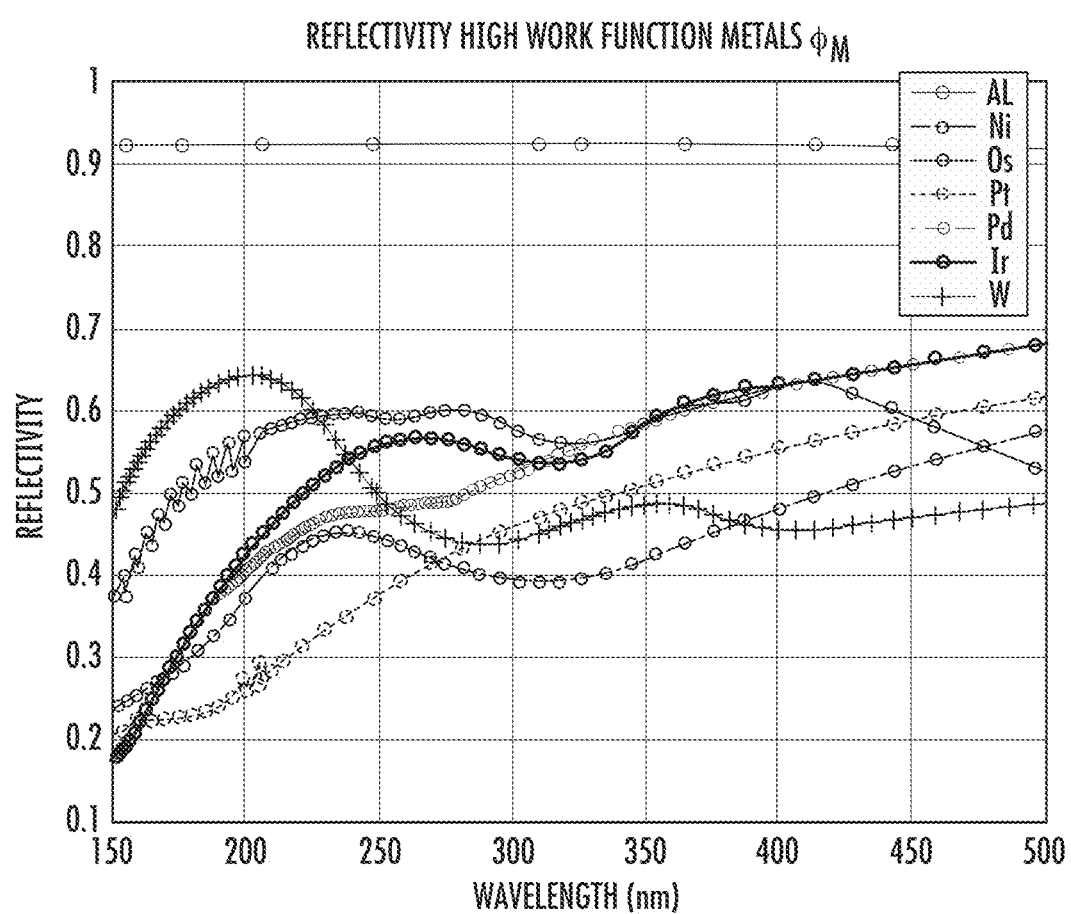
FIG. 22 is a graph of a reflection spectrum of metals.

The reflector 150 may consist of a planar Bragg grating or be a patterned metallic reflector. The material for reflector 150 must have a low absorption (i.e. high reflectance >80% at the target operating wavelength) and small penetration depth at the wavelength of the device if sub-wavelength optical cavities are desired. Typically, the penetration distance into an Al metal reflector is <1 Å. For deep ultraviolet wavelengths, metals other than aluminum tend to absorb too much of the radiation at the wavelength emitted by the device. Thus, aluminum is the material of choice for the reflector 150 of deep UV device 100. This is demonstrated in the graph of FIG. 22, where the reflectivity of aluminum (horizontal line with open circles) is greater than 0.9, compared to the other listed materials which have reflectivities less than 0.7. An aluminum reflector 150 may have a thickness large enough, such as greater than 15 nm thick, to reflect the emitted light out through the substrate 110. However, utilization of aluminum as a mirror material with a III-N device is challenging since the epitaxial processes that are needed for fabricating LEDs typically requires that p-type layers are grown last. Although aluminum is the only metal with high reflectance in the DUV range, it is a poor ohmic metal to serve as an electrical contact to p-type III-N. P-metal contacts are ideally high work function metals such as osmium, nickel and palladium for ohmic contact to p-type III-N. However, Os, Ni and Pd are high UV-absorbing materials. Therefore, using these materials as electrical contacts for the present deep UV device would result in placing a UV-absorbing material between the active layers of the device and the reflective mirror Al. Additionally, thin p-type GaN layers are generally necessary for metal polar "P-up" structures (devices with the p-type layer on upper end of the device, opposite the substrate at the bottom of the device), enabling a two-dimensional hole gas to exist at the pGaN/AlGaN or pGaN/pSL (superlattice "SL") interface. This helps pin the valence band structure for PIN diode operation. pGaN is also highly UV-absorbing, which also is not ideal for a UV device. In the present disclosure, these issues may be optimized for a given UV operating wavelength.

Figure 4A:
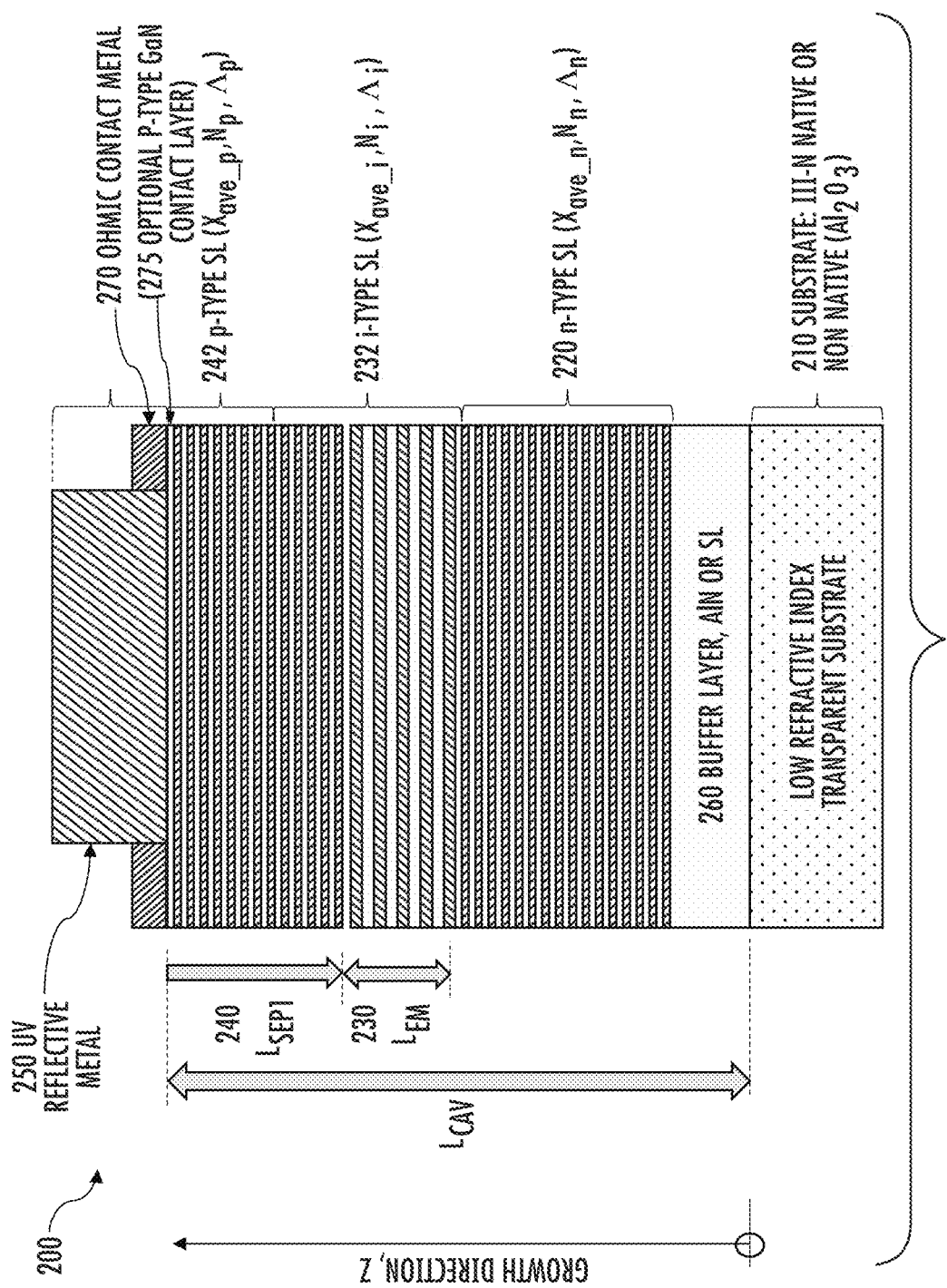
FIG. 4A is a vertical cross-section of a deep UV resonant optical cavity device having superlattice layers, in accordance with some embodiments.

FIG. 4A is a detailed cross-section of an exemplary deep UV resonant optical cavity light emitting device 200 in which electrical contacts are shown and the layers comprise superlattices. Device 200 includes substrate 210, n-type first spacer region 220, light emitting region 230 having thickness $L_{EM}$, p-type second spacer region 240 having length $L_{SEP1}$, and optical reflector 250. Thus, device 200 is a P-up device, since the p-type layers are furthest from the substrate 210. Device 200 also includes an optional buffer layer 260 between the substrate 210 and first spacer 220. An optical cavity having a total thickness $L_{CAV}$ between the upper surface of substrate 210 and the lower surface of reflector 250 is comprised of first spacer region 220, LER 230, and second spacer region 240. $L_{CAV}$ also includes buffer layer 260 in this embodiment. The buffer layer 260, n-type spacer 220 and p-type spacer 240 form the majority of the optical cavity. First spacer 220, light emitting region 230 and second spacer 240 are superlattice (SL) structures in this embodiment. First spacer 220 can include at least a portion of n-type SL and a portion of i-type SL, LER 230 is an i-type SL, and second spacer 240 can include both intrinsic and p-doped materials from superlattice layers 232 and 242. The selection of the SL structures comprising the n-type, i-type and p-type regions is to provide the desired electronic and optical functions necessary for the device operation (as disclosed in U.S. Patent Publication No. 2016/0149075 entitled "Optoelectronic Device"). Alternatively, the semiconductors can be formed using bulk-like semiconductors with the LER comprising one or more quantum well regions for wavelength tuning.

The material for reflector 250 is aluminum to provide the least absorption of the deep UV wavelengths and highest reflectance. However, as discussed above, Al does not provide optimum electrical contact with p-type materials. To overcome this issue, the electrical contact for the p-type layer of device 200 is configured as a compound metallic contact in which ohmic contact 270 is in contact with p-type second spacer 240, on the same layer and at opposite ends of the reflector 250. The ohmic contact 270 and reflective contact 250 are spatially separate across the p-type spacer 240, and this opens the design for near diffractive free axicon emitters. Various configurations are possible but must optimize the series resistance. An optional p-type GaN contact layer 275 may be placed between second spacer 240 and ohmic contact 270. To form the electrical contact area of the device 200, the Al metal reflector 250 may be deposited in-situ on top of the epilayer stack. Subtractive patterning may be used to form the remainder of the device geometry. The Al reflective portion 250 in the DUV device 200 may be created using a CMOS-style processing method free from a flip-chip process that is compatible with interlayer dielectric ($SiO_2$) and metal (Al) interconnect process.

In other embodiments, the device 200 may be configured as a p-type down epilayer stack where first spacer 220 is p-type and second spacer 240 is n-type. Al-metal for reflector 250 in such a P-down configuration is on top of n-type region. For a P-down device, pure Al or Ti/TiN/Al can be used as an n-type contact on the backside (above second spacer 240). Selecting the Ti and or TiN layers to be sufficiently non-absorbing assists in coupling the optical cavity to the Al reflector. The optical cavity or reflective backside LED for a P-down device can therefore use a simple Al-metal contact.

Figure 4B:
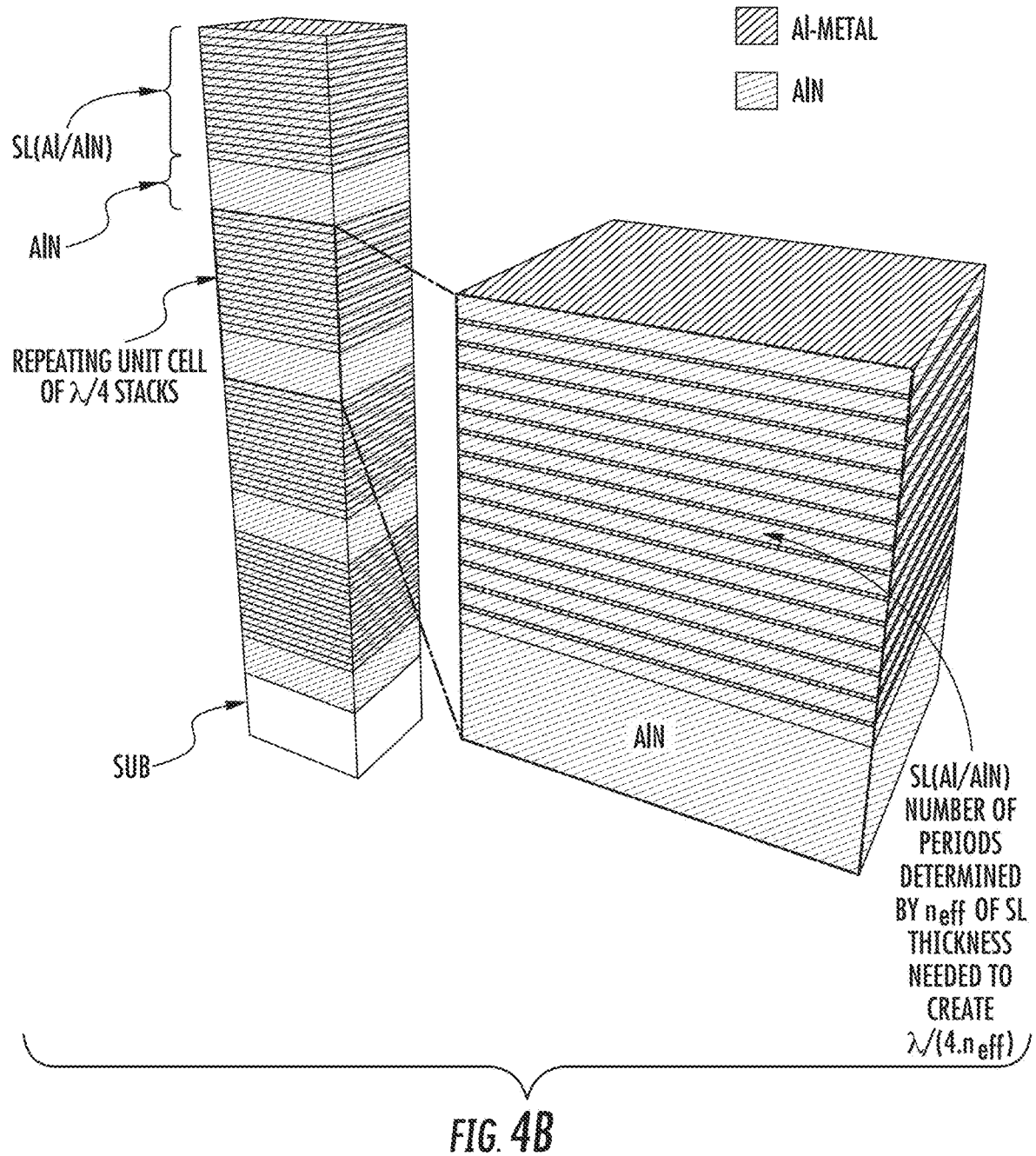
FIG. 4B is a perspective view of a deep UV resonant optical cavity light emitting device having a superlattice reflector, in accordance with some embodiments.
Figure 21A:
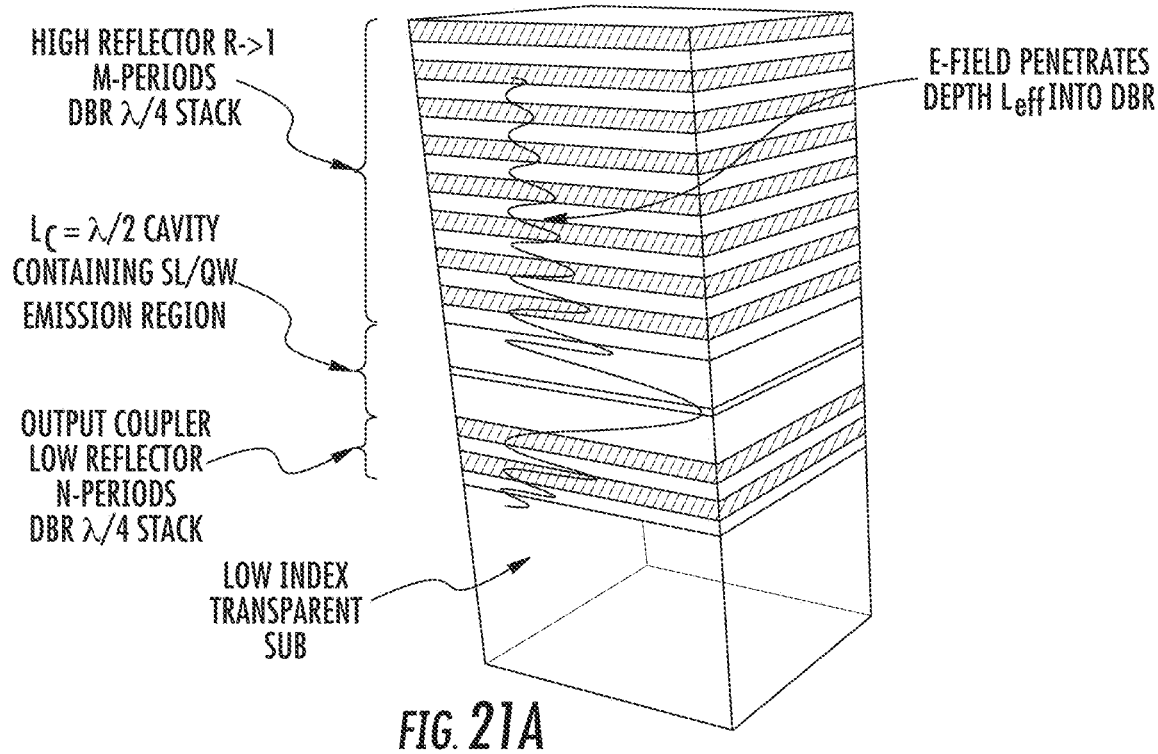
FIG. 21A is a perspective view of a resonant optical cavity light emitting device with distributed Bragg reflectors.
Figure 21B:
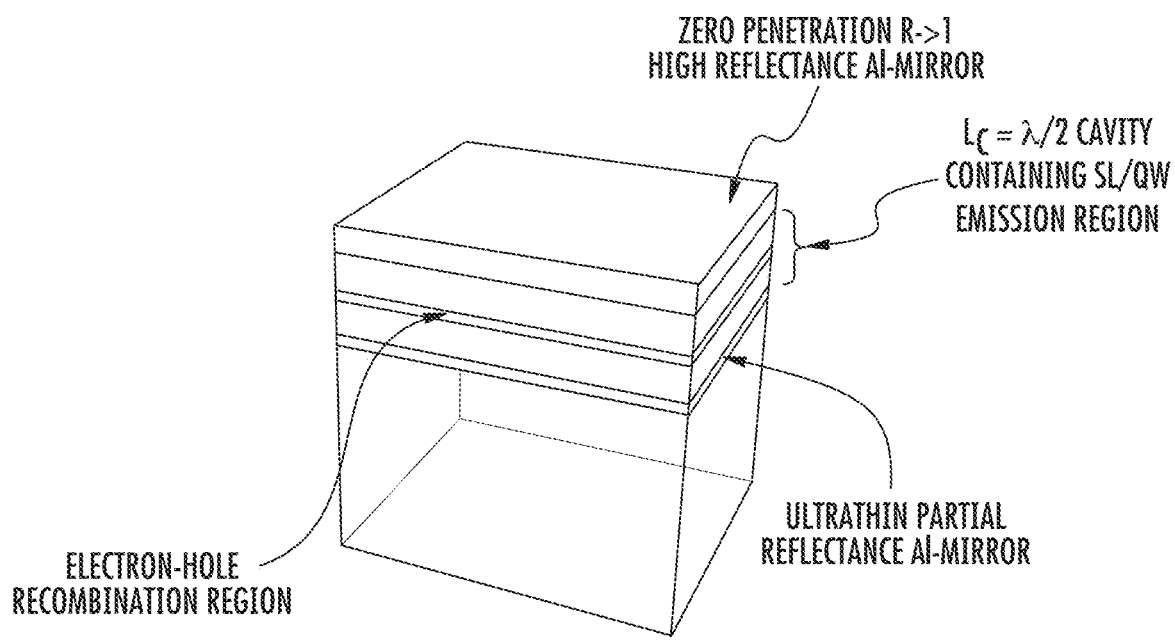
FIG. 21B a perspective view of a resonant optical cavity light emitting device with metal reflectors.

The reflector 250 may also be a superlattice structure, as shown in FIG. 4B. Deep UV reflectors using conventional AlN, AlGaN and GaN quarter wavelength ($\lambda/4$) layers for distributed Bragg reflectors (DBRs) are challenging for the target operating wavelength being less than 280 nm. This is because of the strong optical absorption of the bulk materials (particularly GaN), and an extremely large number of periods being required to achieve high reflectance (since GaN, AlGaN and AlN materials offer only a small change in refractive index for implementing DBR). Indium aluminum nitride (InAlN) is also possible but suffers the same limitations as well as being challenging to fabricate. Also, these materials are difficult to grow with low defect density and low microscopic and macroscopic film stress—as crystalline materials which are further challenging to electrically dope into n-type or p-type conductivity. Note also that a mole fraction of x>0.7 in $Al_xGa_{1-x}N$ is required to attain sufficient transparency for operating wavelength less than 280 nm, which further challenges the utility of DBRs for the present application using native materials. In embodiments of the present disclosure, a new class of optical structure based on ultrathin metallic layers forming an Al/AlN superlattice may be used to form one of the quarter wave layers comprising a DBR. This is advantageous since elemental Al-metal has an extremely low refractive index, and ultrathin (e.g., <2 nm) Al films can be tailored to have an absorption coefficient that is acceptable. This is by virtue of metallic quantum confinement of the dielectric-metal-dielectric AlN/Al/AlN structure which can be tailored for advantageous optical transparency at the desired operating wavelength. The resulting film is a metallic/dielectric superlattice, where the DBR is based on a plurality of λ/4 slabs comprising AlN and SL[Al/AlN]. Such a structure is defined herein as a metalo-dielectric reflector. The number of periods of the SL[Al/AlN] is determined by the effective refractive index $n_{EFF}$ of the superlattice thickness needed to create the $\lambda/(4\ n_{EFF})$. FIGS. 21A-21B show a comparison of reflector types, where FIG. 21A shows a ROCLED with DBR reflectors and FIG. 21B shows a ROCLED with metal reflectors. As can be seen, the aluminum reflectors of FIG. 21B enable an extremely thin structure for the ROCLED.

Figure 23:
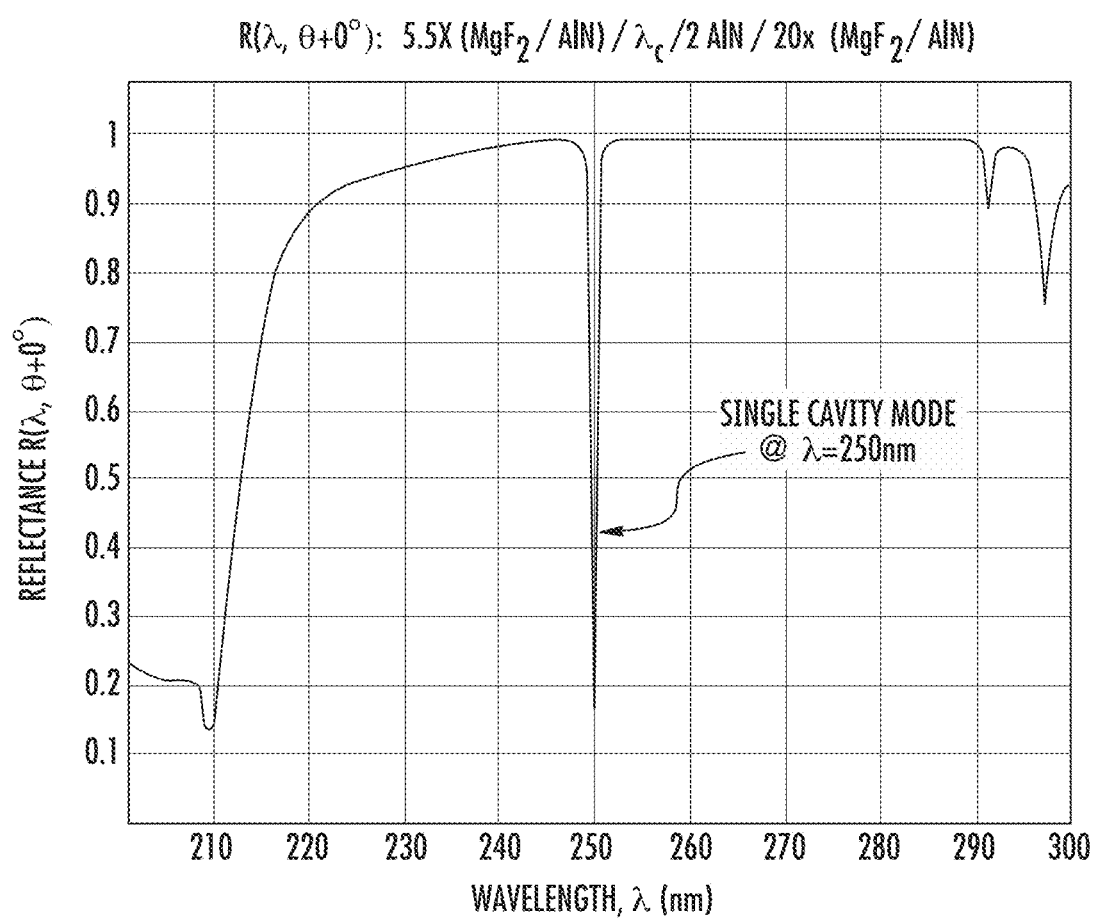
FIG. 23 is a graph of reflectance vs. wavelength for a resonant optical cavity light emitting device with distributed Bragg reflectors, forming a fully dielectric structure.

Yet a further embodiment for implementing a high quality DBR in the ultraviolet wavelength range uses quarter wavelength layers comprising AlN and magnesium fluoride (MgF$_2$). The DBR and metalo-dielectric reflector methods are alternatives to using a pure Al metal reflector. An exemplary reflectance spectrum for a resonant optical cavity device with DBR reflectors using AlN and MgF$_2$ quarter wave layers is shown in FIG. 23.

Figure 24:
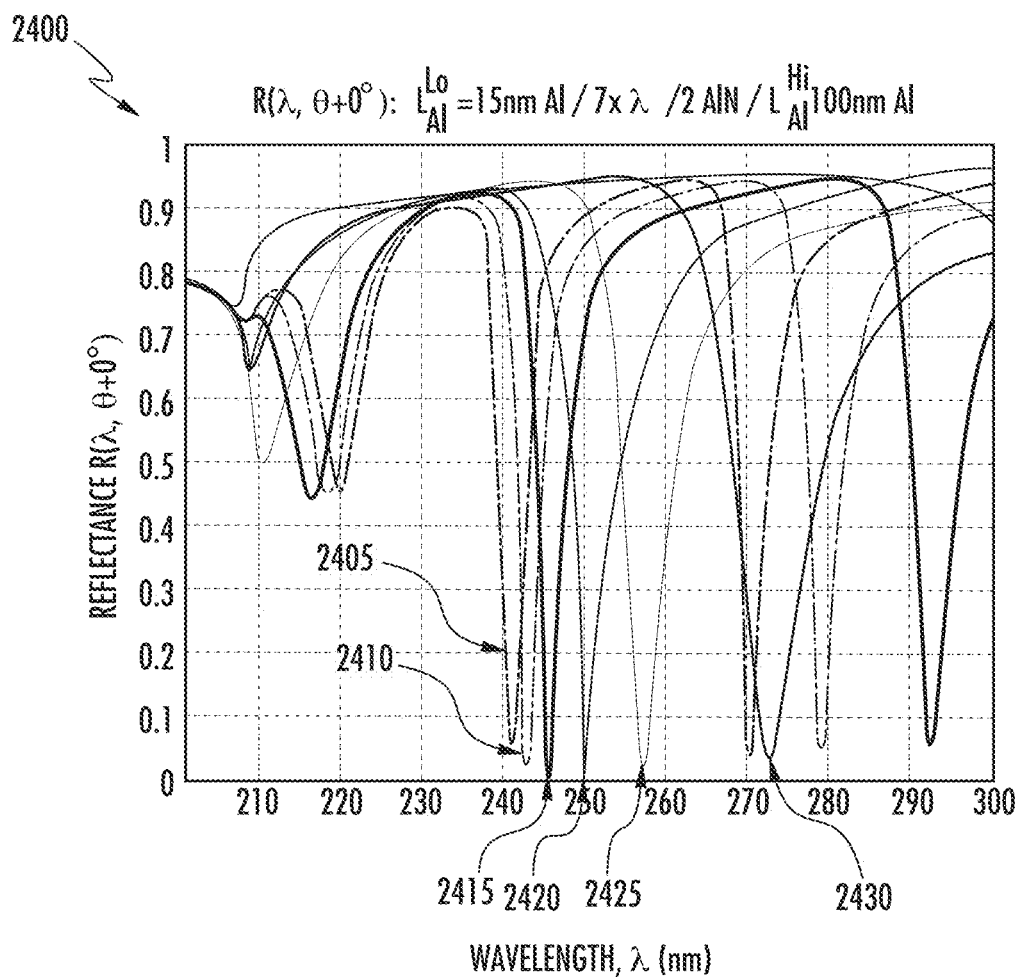
FIG. 24 is a graph of reflectance vs. wavelength for a resonant optical cavity light emitting device with aluminum metal high and partial reflectors forming a metal-dielectric-metal structure.

FIGS. 21A and 21B represent exemplary vertical optical devices, FIG. 21A forming a fully dielectric optical cavity with reflectors formed using two DBR structures, and FIG. 21B being a metal-dielectric-metal optical cavity formed using high reflectance and semitransparent metallic reflectors. The device in FIG. 21B attains very small optical cavity thicknesses less than the optical emission wavelength. Experimental results corresponding to an example fully dielectric optical cavity structure are shown in the graph of reflectance vs. wavelength in FIG. 23, using a high reflectance 20 period AlN/MgF$_2$ DBR, a half-wavelength thick AlN cavity and partially reflecting output coupler comprising a 5.5 period AlN/MgF$_2$ DBR. The normal incidence reflectance from the 5.5 period DBR is shown as function of wavelength. The single optical mode at λ=250 nm is clearly evident and the out of band rejection away from λ=250 nm exhibits extremely high reflection. A high reflectance indicates that optical modes at the out of band wavelengths are forbidden within the device and thus represent non-propagating optical modes vertically within the device. Conversely, the λ=250 nm optical mode is allowed and is the optical cavity mode desired. The DBRs are designed to have quarter wavelength thickness at λ=250 nm comprising the bilayer pairs. Note the additional phase matching half layer in the lower reflectance DBR to ensure optical phases are constructive. Conversely, the reflectance spectrum graph for a metal-dielectric-metal structure in FIG. 24 shows the normal incidence reflectance at the partially reflecting metal layer comprising 15 nm of Al. Various structures are shown with the AlN optical cavity having thickness ranging from ½ wavelength to 7×½ wavelength thickness. Tuning of the optical cavity mode is clearly evident ranging from 240 nm through to 290 nm. The metal-dielectric-metal optical cavity is therefore a versatile optical device being able to provide the required optical cavity tuning range and high out of band rejection.

Figure 31:
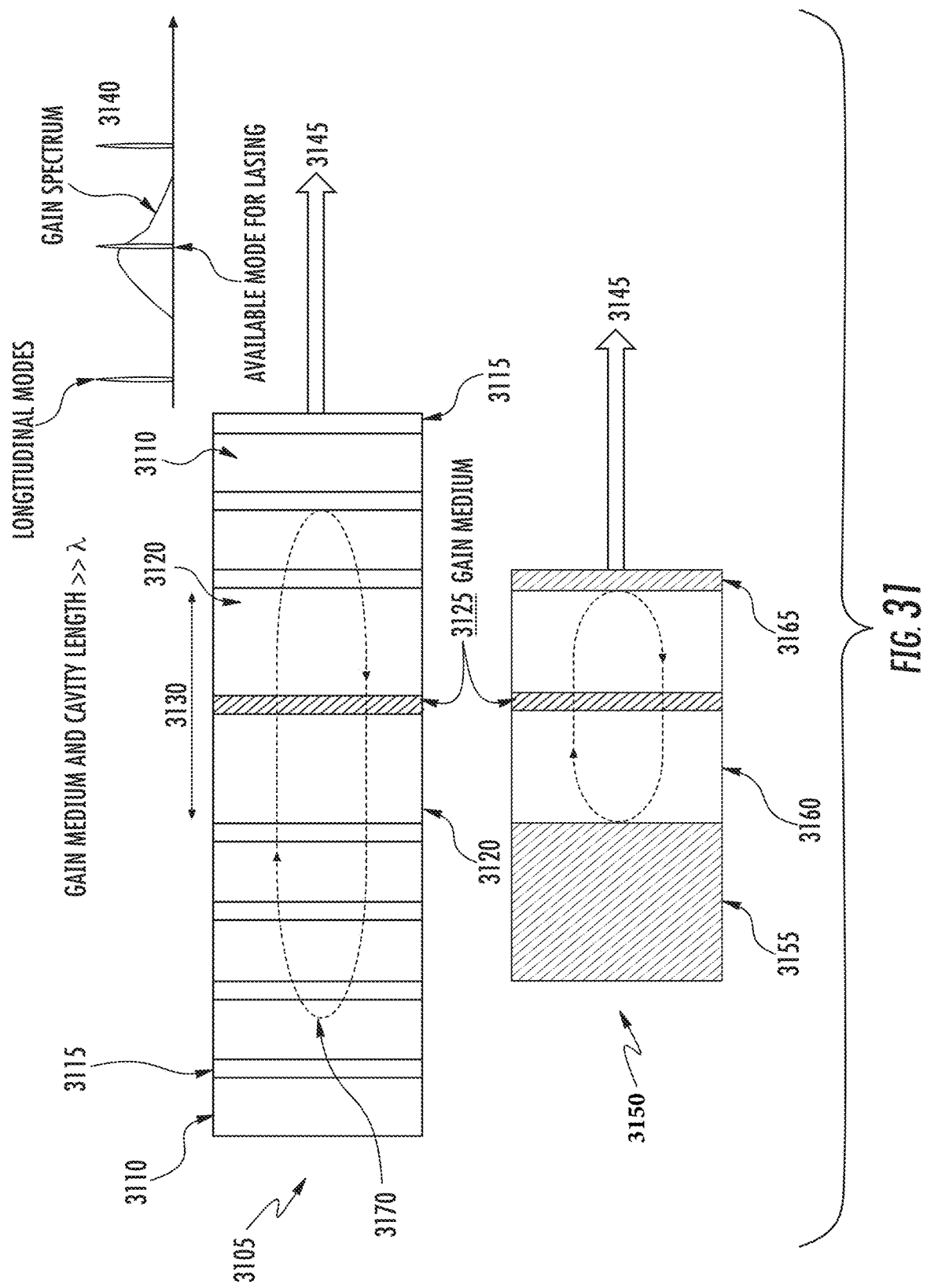
FIG. 31 shows optical cavities using dielectric mirrors and metal-dielectric-metal.

FIGS. 21A-21B represent various embodiments of low (i.e., partial) reflectors between the substrate (e.g., substrate 210 of FIG. 4A) and first spacer (e.g., first spacer region 220 of FIG. 4A). FIG. 21A represents a superlattice (SL) DBR having two types of regions (SL layers), each having quarter-wave thicknesses as explained in relation to FIG. 4B. One region of the DBR of FIG. 21A may be ultrathin Al/AlN SL layers having thicknesses of less than 20 nm, such as less than or equal to 15 nm (i.e., over an order of magnitude less than deep UV quarter wavelengths), and the other region may be an AlN region of deep UV quarter wavelength thickness. The number of repetitions of these two regions can be a low number of periods which is chosen to achieve the desired low reflectance, such as <10% reflectance. Additional examples corresponding to the use of partial reflector DBRs between the substrate and first spacer layer are shown in FIGS. 23, 31 (device structure 3105; note the substrate is not shown), 33, 34 and 35. FIG. 21B represents a partial reflector made of an ultrathin Al layer having thickness less than 20 nm, such as less than or equal to 15 nm (again, much less than deep UV quarter wavelengths) to achieve low reflectance of, for example, <10%. Additional examples corresponding to the use of partial reflectors using thin film Al-metal are shown in FIGS. 18A, 19, 24, 25 and 31 (device 3150 of FIG. 31; note the substrate is not shown in all examples).

In other embodiments, the device of FIG. 21A or 21B may omit the partially reflecting (low reflector) output coupler; that is, no DBR or thin Al layer is present between the substrate and first spacer. In such a device, the substrate can be directly coupled to the first spacer region and be optically transparent to a target emission deep ultraviolet wavelength. The high reflector on the second spacer is highly reflective of the target wavelength, such as having a reflectivity of greater than 90% for the target wavelength. The high reflector can be a bulk-like aluminum metal layer, or a DBR comprising one or more of Al, MgF$_2$ or AlN as described above. Light emitted from the LER will be output through the transparent substrate. The device may be either p-up or p-down.

In some embodiments, partial reflection between the substrate and first spacer region can be achieved without the presence of a physical partial reflector layer. For example, the partial reflector layer may be omitted in embodiments in which a particular selection of III-N materials is selected to have a sufficient difference in refractive index to the substrate material. The difference in refractive index between the substrate material and other layers can provide the partial reflectance such that the need for a specific partial reflector layer is eliminated. For instance, the first and second spacer layers, active layers, p-type layers and n-type layers may all be implemented to have a sufficient difference in refractive index from the substrate material. Removing the requirement for an additional partial reflector layer between the first spacer region and the substrate greatly simplifies the manufacturability of the device. A typical substrate material is single crystal sapphire, whereby the difference in the ordinary refractive indices Δn between a first spacer layer comprising AlN (n=2.396 at 250 nm) and the substrate of Al$_2$O$_3$ (n=1.845 at 250 nm) is Δn=(2.396−1.845)=0.551. This is a sufficiently large discontinuity in the optical property of the layers at the interface Δn (difference in refractive index between the substrate and first spacer region) to produce a substantial refection for light rays directed from within the AlN layer toward the AlN/sapphire interface. In embodiments without a partial reflector between the substrate and first spacer, it is this AlN/sapphire interface that serves as the output coupler or partial reflector of the device. This property has been overlooked in the prior art as a method for producing microcavity effects. The effect described above may also be further enhanced by use of AlGaN ternary or AlN/GaN superlattice materials comprising the first spacer layer and a sapphire substrate. Indeed, an Al$_x$Ga$_{1-x}$N alloy (for example x=0.7) or AlN/GaN superlattice material (with average Al alloy content of 70%) comprising the first spacer region will also have sufficient Δn even if a bulk single crystal AlN substrate is used. The partial reflectance as described by the abrupt discontinuity in refractive index at the first spacer layer and substrate is further exploited when a high reflector is placed as described on the opposite portion of the device from the substrate thereby forming the optical cavity. The high reflector will exacerbate the effect of the partial reflector interface by virtue of multiple reflections of light rays within the volume of the device cavity.

Figure 5:
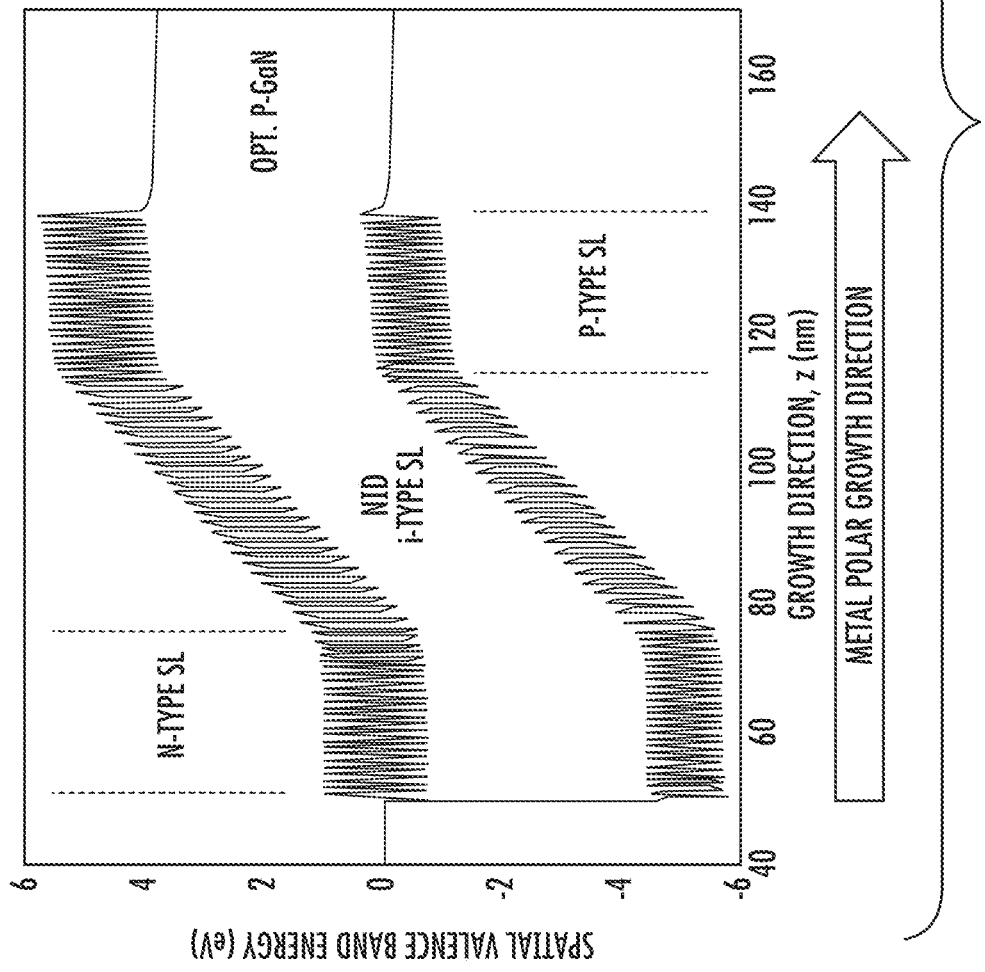
FIG. 5 shows an exemplary valence band energy gap graph for the device of FIG. 4A.

FIG. 5 shows a graph of the lowest energy zone center conduction and valence bands of the direct energy gap materials GaN and AlN forming the superlattice layers of device 200 of FIG. 4A, in certain embodiments. The superlattice of GaN/AlN ultrathin layers forms a pseudo-alloy with the lowest energy quantized energy states forming the majority of the electronic and optical properties. The graph of FIG. 5 illustrates a P-up device, where the n-type layers are grown first and the p-type layers are grown last. An optional pGaN contact layer is also shown (growth layer starting at 140 nm). In the graph of FIG. 5, the p-type and n-type superlattice (SL) layers of FIG. 4A are designed to be substantially transparent to the desired emission wavelength $\lambda_{EM}$. The NID (non-intentionally doped) i-type SL region is designed for emission at the desired emission wavelength $\lambda_{EM}$. The vast majority of the probability for electron and heavy-hole wavefunction overlap is spatially confined within the i-SL region. In the present disclosure, the i-SL region can therefore be positioned vertically within the PIN structure and also placed optimally between the Al-metal reflector and the low refractive index substrate (e.g., sapphire). For application to ultraviolet operation using polar and non-polar group-III metal nitride semiconductors, the utility of superlattice structures comprising designed AlN/GaN layers enables vertically emissive devices and the ability to bandgap engineer the device with only two material compositions. However, other methods such as using conventional bulk-like $Al_xGa_{1-x}N$ ternary alloys are also possible for the doped, spacer and LER regions. Yet further embodiments include the use of superlattices comprising $Al_yGa_{1-y}N/Al_xGa_{1-x}N$ and trilayered $AN/Al_xGa_{1-x}N/GaN$, where x≠y.

Figure 6:
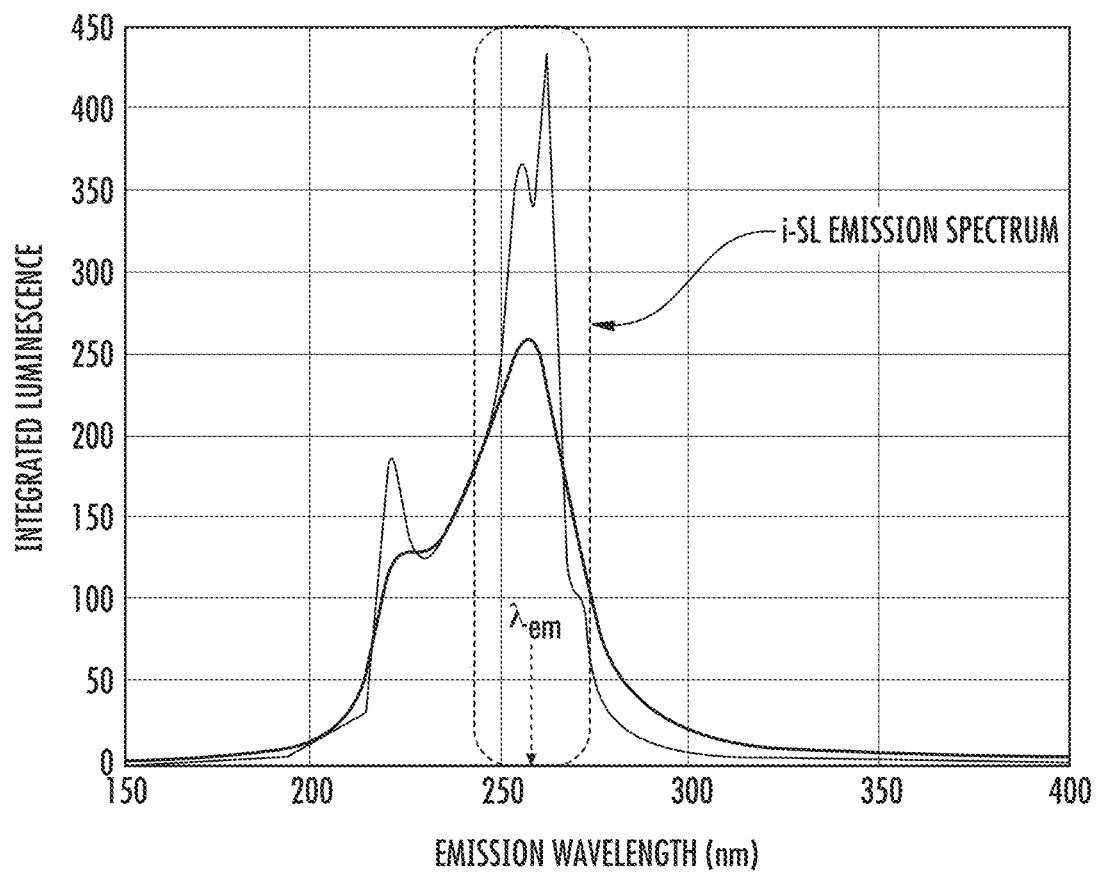
FIG. 6 shows an exemplary luminescence graph for the device of FIG. 4A.

FIG. 6 shows an exemplary transverse electric (TE) luminescence spectrum for device 200, where the LED stack has been designed such that the i-type SL region has a narrow emission spectrum clear of the absorption edge of the doped cladding layers. The lowest energy quantized states of the SL structure generate an emission spectrum according to the spatial overlap of the electron and hole quantized wavefunctions. The AlN/GaN superlattice optical emission is dominated by the lowest energy quantized electron wavefunction spatial overlap with the lowest energy quantized heavy-hole wavefunctions. There are three important valence bands comprising the superlattice, namely, the heavy-hole (HH), light-hole (LH) and spin-split off (SO) band. Using a GaN/AlN superlattice ensures the vertical emission is dominated by the advantageous TE emission due to recombination between the lowest energy electron states with those from the HH band. The optical modes of the device dictate which spatial and wavelength modes are coupled out of the device. That is, the i-SL emission energy generating the desired emission spectrum must therefore be matched to propagating optical modes out of the device. That is, the optical modes of the device are determined by the optical constants of the materials comprising the device and the specific 1D and 3D structure. That is, forming a device that is comparable in length scale to the emission wavelength requires careful attention to the way light interacts at interfaces and discontinuities. This method offers the highest extraction efficiency possible. In embodiments of the present disclosure, the optical geometry of the device stack can be simulated using a three-dimensional electromagnetic spatial and temporal simulator, such as three-dimensional finite-difference time domain (3D FDTD) methods, to maximize the emission of light from the device at the desired emission wavelength. Another method that can be used to perform the optical design is the one-dimensional transfer matrix method (1D TMM), which utilizes the reciprocity between: (i) absorption within spatial regions of the device when illuminated through the substrate; and (ii) emission of light from a spatial position within the device and detected external to the substrate. While the 3D FDTD method provides 3D details of the physical device fabricated, namely, sidewall slopes and surface roughness and the like, the 1D TMM provides a fast method of determining the longitudinal modes of the target structure and advantageous positioning of the LER with respect to the allowed optical longitudinal modes.

Figure 7:
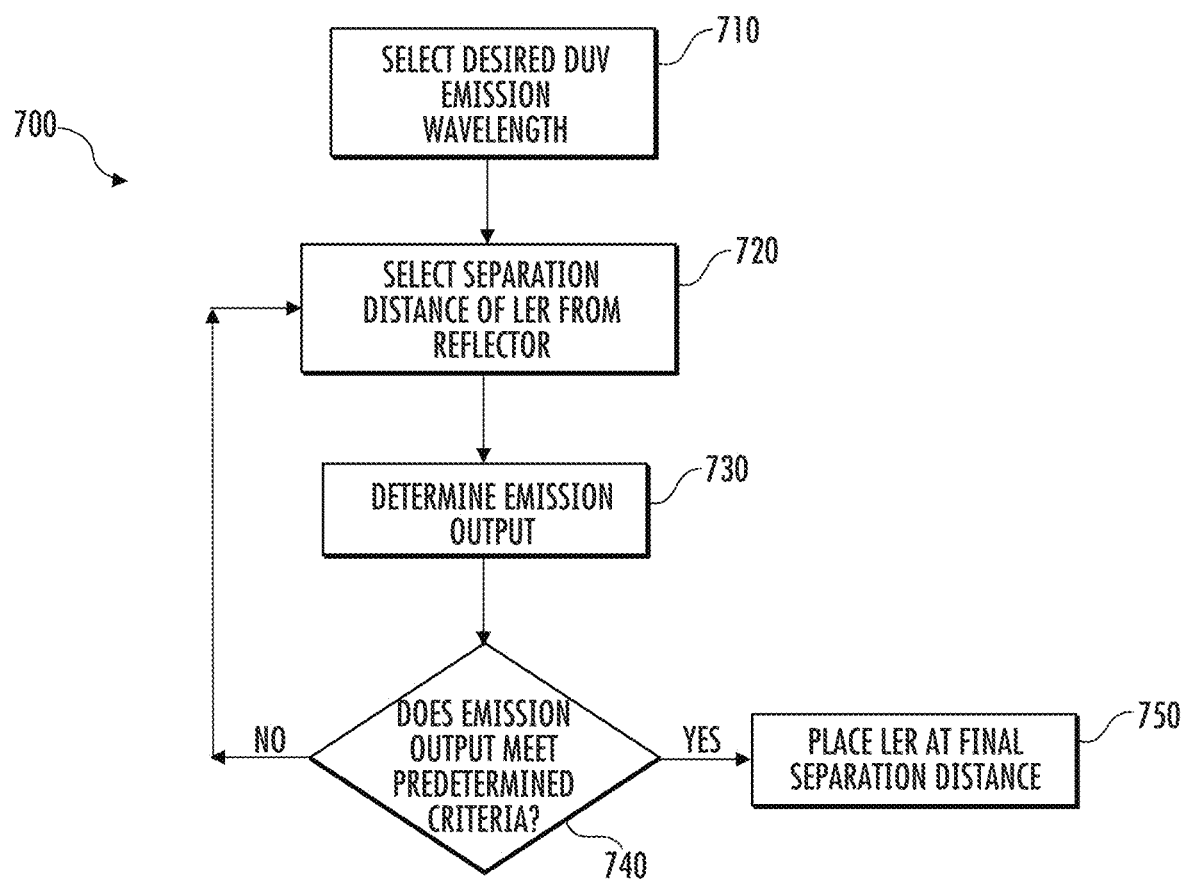
FIG. 7 is a flowchart of methods for producing a deep UV resonant optical cavity light emitting device, in accordance with some embodiments.

FIG. 7 provides a flowchart 700 of methods for producing a resonant optical cavity light emitting device that meets a predetermined criterion at a target emission deep ultraviolet wavelength. The target light emission output at a selected wavelength frequency is dependent upon the positioning of the LER provided by the two spacers within the cavity. The process illustrated in FIG. 7 shows how the structure of the device may be arrived at. First, in step 710, a target emission deep ultraviolet wavelength of the ROCLED is selected. The wavelength is less than or equal to 300 nm, such as between 190-300 nm, or 200-280 nm, or 250-280 nm. The LED has a light emitting region between a substrate and a reflector, where a first spacer region is between the light emitting region and the substrate, and a second spacer region is between the light emitting region and the reflector. The reflector for the deep UV device comprises a metal composition comprising elemental aluminum. At least one of the light emitting region, the first spacer region, and the second spacer region may comprise a superlattice. In some embodiments, the material for the substrate may be selected as part of the process for producing the ROCLED, such as by choosing an optically transparent substrate with optical properties suitable for the emission wavelength to be generated.

Next in step 720, the desired dimensions are selected, including a separation distance between the light emitting region and the reflector. The particular location of the LER within the cavity length $L_{CAV}$ may be expressed as, for example, $L_{SEP1}$ and/or $L_{SEP2}$. In some embodiments, step 720 may selecting a thickness of the first spacer region and selecting a thickness of the second spacer region to match the target wavelength to at least one allowed optical mode formed by the optical cavity and the reflector. In other embodiments, the simulator may be used to calculate a possible separation distance between the light emitting region and the reflector.

In step 730 the magnitude of the radiation emission at an exit plane relative to the substrate is determined using a three-dimensional electromagnetic spatial and temporal simulator, such as a 3D FDTD. The predetermined criterion is selected from i) an optical extraction efficiency at an exit plane with respect to the light generated from the light emission region at the target wavelength, ii) a target spatial profile of light emitted at the exit plane at the target wavelength, and iii) light extracted from the device being emitted substantially perpendicular to the substrate. The quantized states generate an emission spectrum. The optical modes of the device dictate which spatial and wavelength modes are coupled out of the device. The i-SL emission energy must be matched to propagating optical modes out of the device. In some embodiments, the optical geometry of the device stack can be simulated using at least one of a 3D FDTD and a 1D TMM. For example, the 1D TMM can be used to directly simulate the electromagnetic field propagation within the entire structure including the wavelength dependent refractive indices and absorption coefficients for all the constituent materials. Using the optical reciprocity between absorption and emission, the 1D optical structure can be illuminated through the transparent substrate with a range of wavelengths. By further using a sufficiently thin absorption test layer that is scanned as a function of position within the optical cavity, the absorption coefficient within the test layer can be calculated to reveal the 1D longitudinal optical modes. Positioning the LER at an allowed optical mode (namely, high absorption) is advantageous for optimizing the light absorption at the LER. Conversely, light emitted at this selected LER position also enables light to be out coupled through the substrate with the highest extraction efficiency.

Figure 16A:
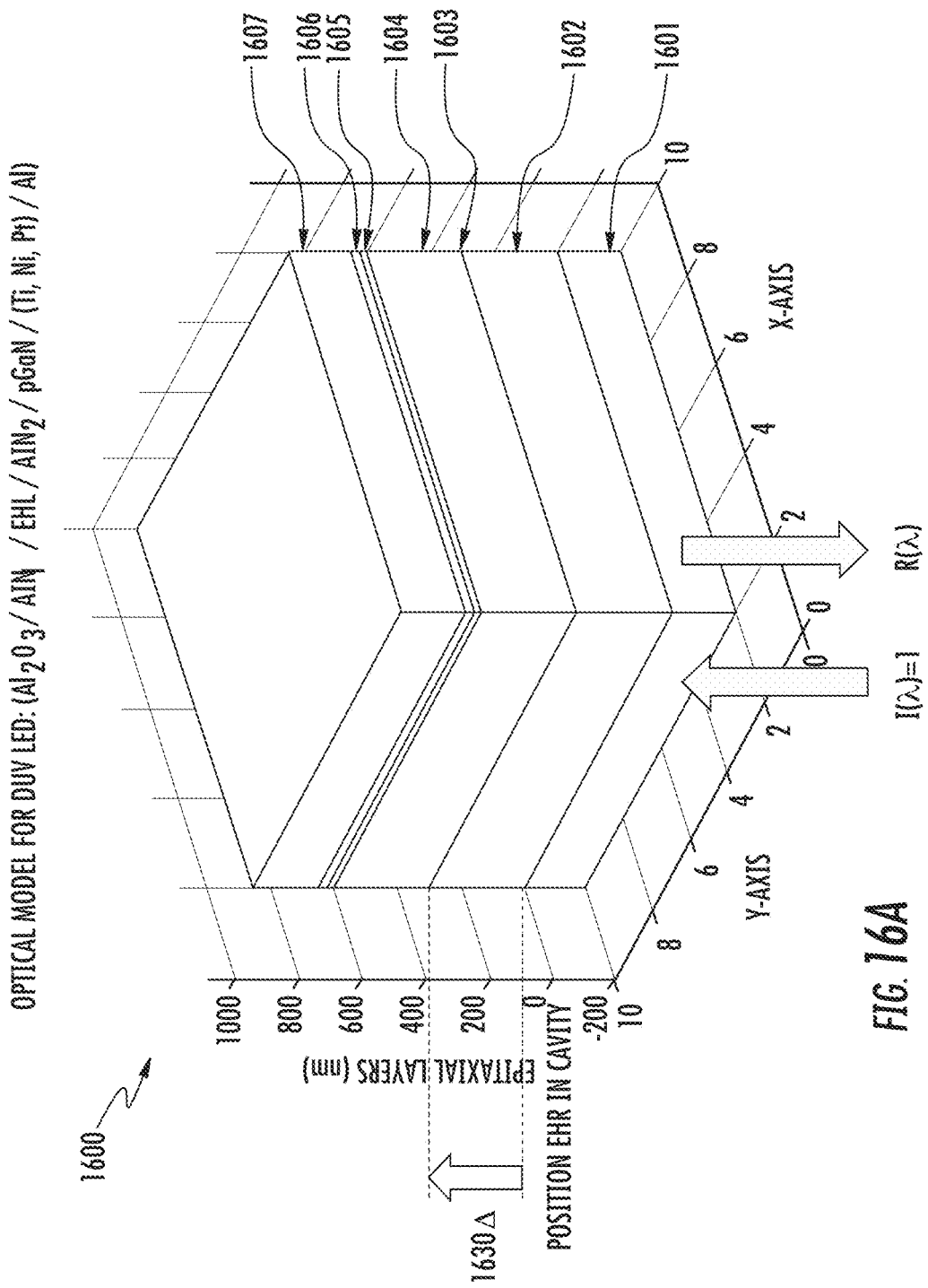
FIG. 16A illustrates an exemplary ROCLED device.
Figure 16B:
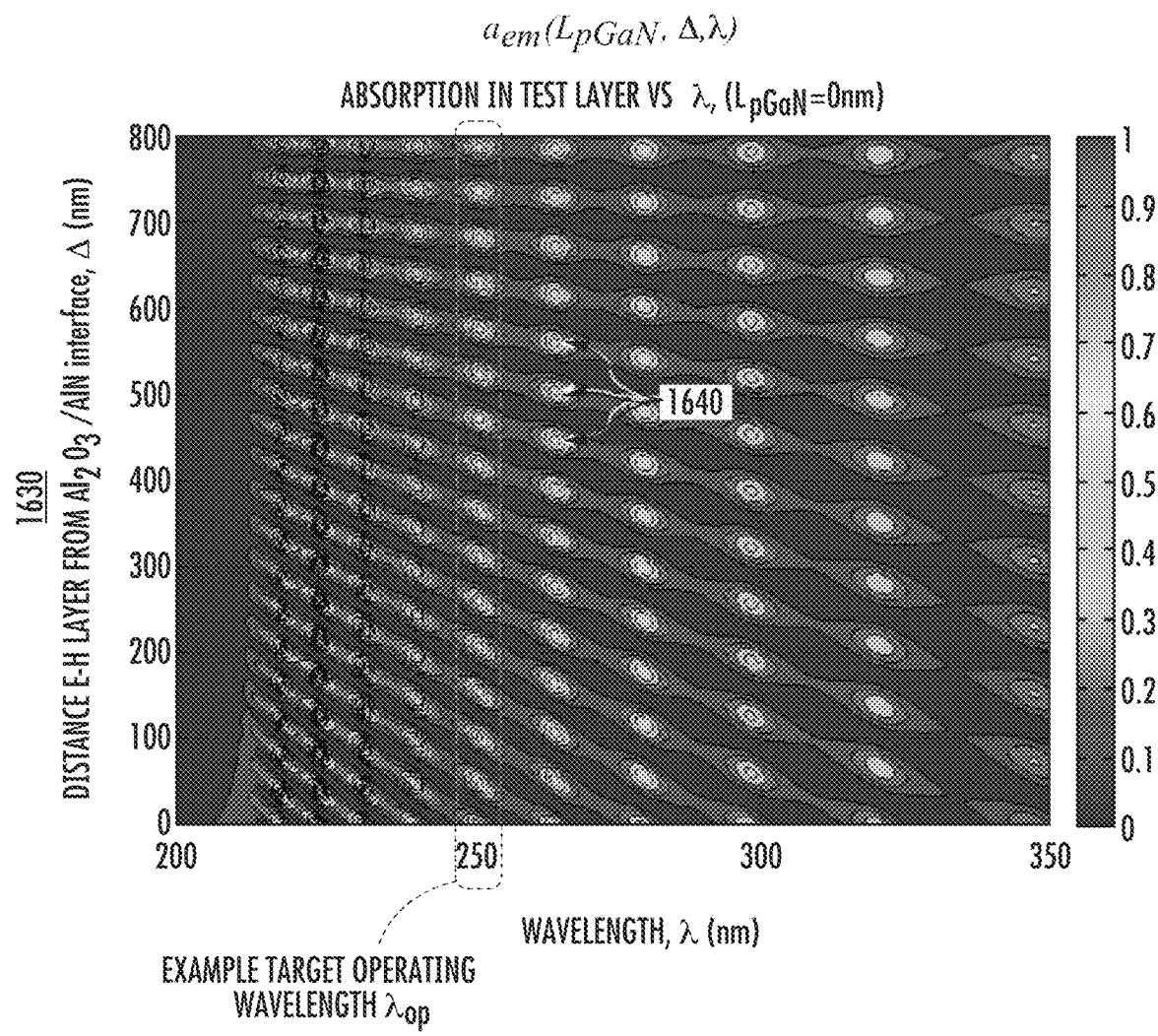
FIG. 16B shows calculated optical modes for the device of FIG. 16A.
Figure 16C:
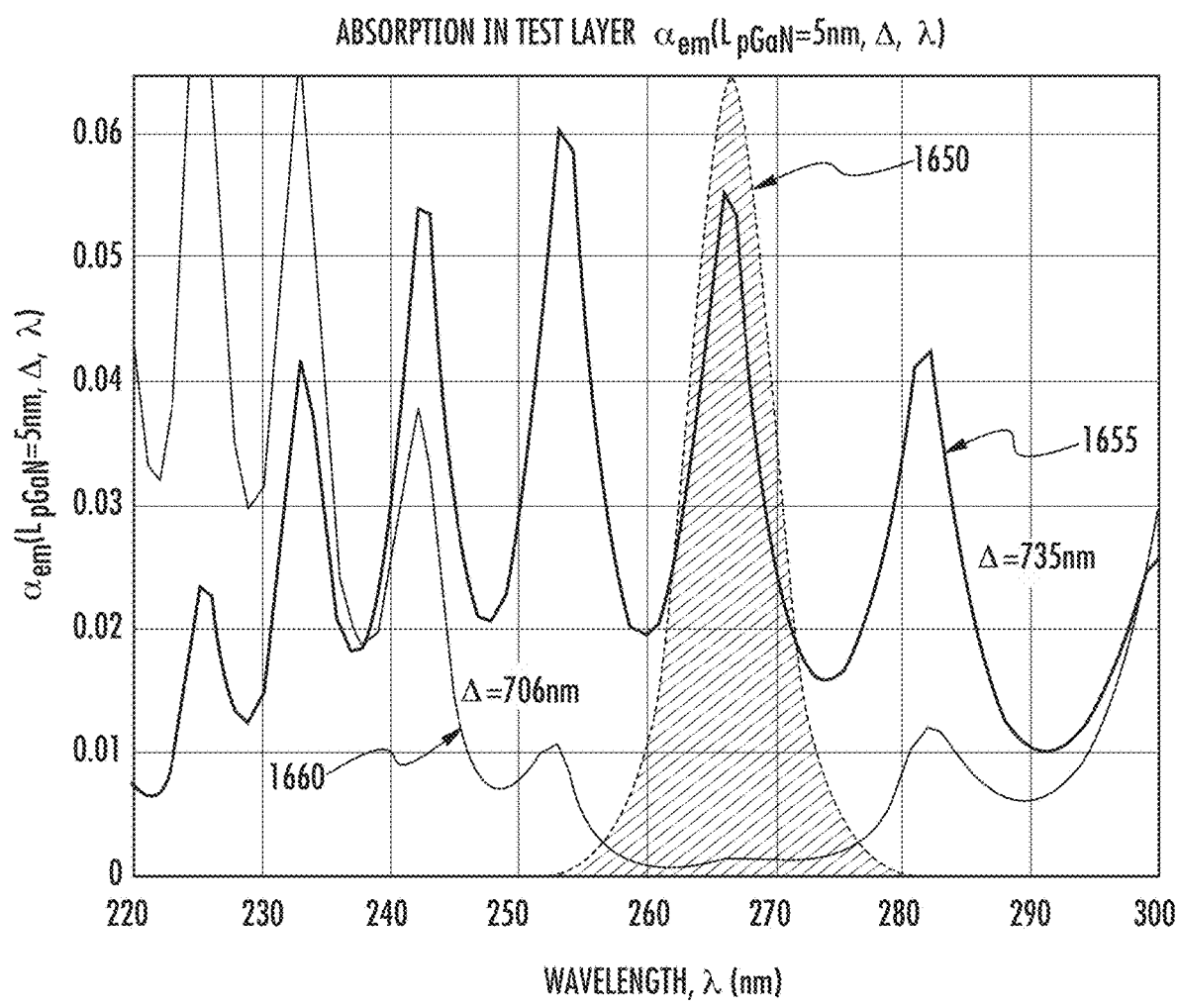
FIG. 16C shows optical modes for the device of FIG. 16A, for different LER positions.

For example, FIGS. 16A-16C can be used to describe the method. FIG. 16A shows how the 1D (longitudinal) optical modes can be discovered for the case of an exemplary AlN cavity with a sapphire substrate and Al reflector. In practice P-up structures require the use of interposing p-GaN and ohmic metal (such as, Os, Pt or Ni) layers between the AlN cavity and the Al reflector. Optimizing the absorptive properties of the p-GaN and ohmic metal layer thickness for minimizing disadvantageous abruption at the desired ultraviolet operating wavelength is possible by minimizing the respective thicknesses. FIG. 16A is an example optical cavity device 1600 comprising sapphire substrate 1601, and spacer 1602 with length $L_{cav1}$ (indicated as distance Δ 1630) and made of AlN or high percentage Al superlattice. Optical cavity device 1600 also includes LER 1603 (also referred to as electron-hole recombination region, EHR), spacer 1604 with length $L_{cav2}$ and made of AlN or high percentage Al superlattice, p-region 1605 of pGaN (UV absorbing), high work function metal 1606 (UV absorbing), and aluminum UV high reflector 1607. The substrate 1601 has lower refractive index than the dielectric materials. LER (i.e., EHR) region 1603 is advantageously positioned within the dielectric cavity at distance A 1630. This example AlN-based device that includes a p-type contact stack (1605 and 1606) positioned between the high reflector 1607 and spacer 1604 is optically absorptive with respect to the operating wavelength of the device. The optically absorptive layers 1605 and 1606 form the ohmic contact stack to the p-type gallium nitride (GaN) layer 1605. The optical emission/absorption operation of the device can be simulated by optimizing the emission/absorption within the EHR for optical wavelengths of interest.

FIG. 16B shows the calculated optical modes as a function of input wavelength to the device through the substrate and represented as absorption resonances 1640 of test layer (i.e., LER or EHR region) 1603 as a function of vertical position 1630 within the stack of optical cavity 1600. Clearly, high absorption optical modes can be determined uniquely for a given structure. FIG. 16C exemplifies the requirement for positioning the LER region having a specific optical emission spectrum 1650 within the cavity. For example, FIG. 16C shows an LER spectrum 1650 peaked at λ=265 nm, which overlaps an allowed optical mode spectrum 1655 of the cavity 1600 if and only if the LER is positioned at a distance of Δ=735 nm from the substrate (e.g., sapphire) surface. In contrast, if the LER is positioned at Δ=706 nm with optical mode spectrum 1660 which represents an interference null within the cavity, the LER spectrum 1650 cannot couple to an allowed optical propagating mode and thus light is not emitted from the sapphire due to an LER positioned at Δ=706 nm.

Alternatively, in step 730 of FIG. 7, a more complex and computer intensive 3D FDTD method can be used to simulate the germane light propagation as a function of time at a given LER position within the optical cavity. The propagated electromagnetic radiation can be time sequentially stepped until the light propagates throughout the structure and sampled at a desired exit plane. In one embodiment of a method for simulating the 3D ROCLED is the construction of a discrete 2D ensemble of randomly polarized electric dipole emitters forming the LER region. Furthermore, these electric dipoles are simultaneously excited by an ultrashort optical pulse that is specifically constructed to support a sufficiently wide optical spectrum. For example, a Gaussian femtosecond pulse can be constructed to support a continuous range of wavelengths spanning from 170 nm to about 2 microns. The optical pulse is propagated in discrete time steps (using the leap frog method of the known Lee Algorithm) until the entire structure is illuminated by the ultrashort pulse and for a sufficiently long time so that the propagated electromagnetic waves pass through the desired exit plane. The discrete time sequence of the electromagnetic field vectors as sampled at the exit plane can then be applied to a Fourier transform to reveal the frequency spectrum. That is, the impulse response transfer spectrum of the device as sampled at the exit plane is established for a given optical cavity and LER position configuration. This method also enables revealing the spatial mode pattern for a particular wavelength at the exit plane and is beneficial for understanding the impact of the lateral structure on the resulting optical spatial profiles.

The LER position within the optical cavity has a cavity pulling effect on the luminescence spectrum. That is, if the emission spectrum of the LER overlaps a single and narrower optical mode then the resulting light extracted through the substrate will be commensurate with the allowed optical mode linewidth. Changing the LER position results in different absorption vs. wavelength responses. If injected electrons and holes recombine spatially within an allowed node in the cavity structure, then the light can be generated. Otherwise, spontaneous emission is inhibited. Therefore, the LER needs to be placed at a predetermined position within the epi-stack forming the cavity. In some embodiments, periodic electron-hole recombination sections of the superlattices can be grown in the epi-stack to match the cavity modes. The light emitting region may include a plurality of light emission regions separated by further spacer layers, thereby forming a periodic emission region that overlaps allowed spatial modes of the optical cavity.

In step 740, if the determined emission output of step 730 does not meet the predetermined criterion, such as by not meeting a specified magnitude within a certain tolerance, then a different position for the LER is selected. The steps of selecting a separation distance in step 720, determining the emission output in step 730, and determining if the emission output meets the predetermined criterion are then repeated using alternative values for the separation distance. The process is repeated until an optimized value of the separation distance, which shall be defined as a final separation distance in this disclosure, results in the predetermined criterion meeting a desired efficiency. Thus, after the emission output is acceptable at step 740, the light emitting region is placed at the final separation distance from the reflector in step 750.

FIGS. 8-12 provide exemplary illustrations of the simulation process for determining the position of the light emitting region within the deep UV device. FIG. 8A is an isometric view of an exemplary resonant optical cavity light emitting device 800 and a two-dimensional exit plane 801 where a desired output or efficiency is to be evaluated. FIGS. 8B and 8C are vertical cross-sections taken orthogonally to each other (across the x- and z-dimensions), showing a device 805 similar to device 800, where the substrate 810 is facing upward. First spacer 820 is between the substrate 810 and LER 830, and second spacer 840 is between the LER 830 and reflector 850. FIG. 8D is a top view, showing that the device 800 has a square cross-section. The side walls of the device 800 are angled, where the layers have a decreasing area toward the reflector 850 in this embodiment. For example, a cross-section of the first spacer 820 is greater than a cross-section of the second spacer 840. FIG. 8D shows the outlines of the various layers: substrate 810 (SUB boundary), first spacer 820 (Base MESA), LER 830 (Active-SL volume), and reflector 850 (AL-metal). FIGS. 8B-8D also show three locations above substrate 810—port 1, port 2, and port 3—defining a two-dimensional exit plane at which a desired output, such as a magnitude of radiation emission, will be evaluated. FIG. 8E shows a source volume polarization map for $E_z$-dipoles in the active layer 830 demonstrating the 2D discrete ensemble of emitters each of which is excited by the Gaussian ultrashort pulse used to form the impulse response transfer spectrum. The dimensions of the LED are input into the FDTD simulation, including the position $L_{SEP}$ of the light emitting region 830 relative to the reflector 850. $L_{SEP}$ may be input as an absolute distance, such as in micrometers, or as a proportion, such as a fraction of the length of the cavity.

Figure 8A:
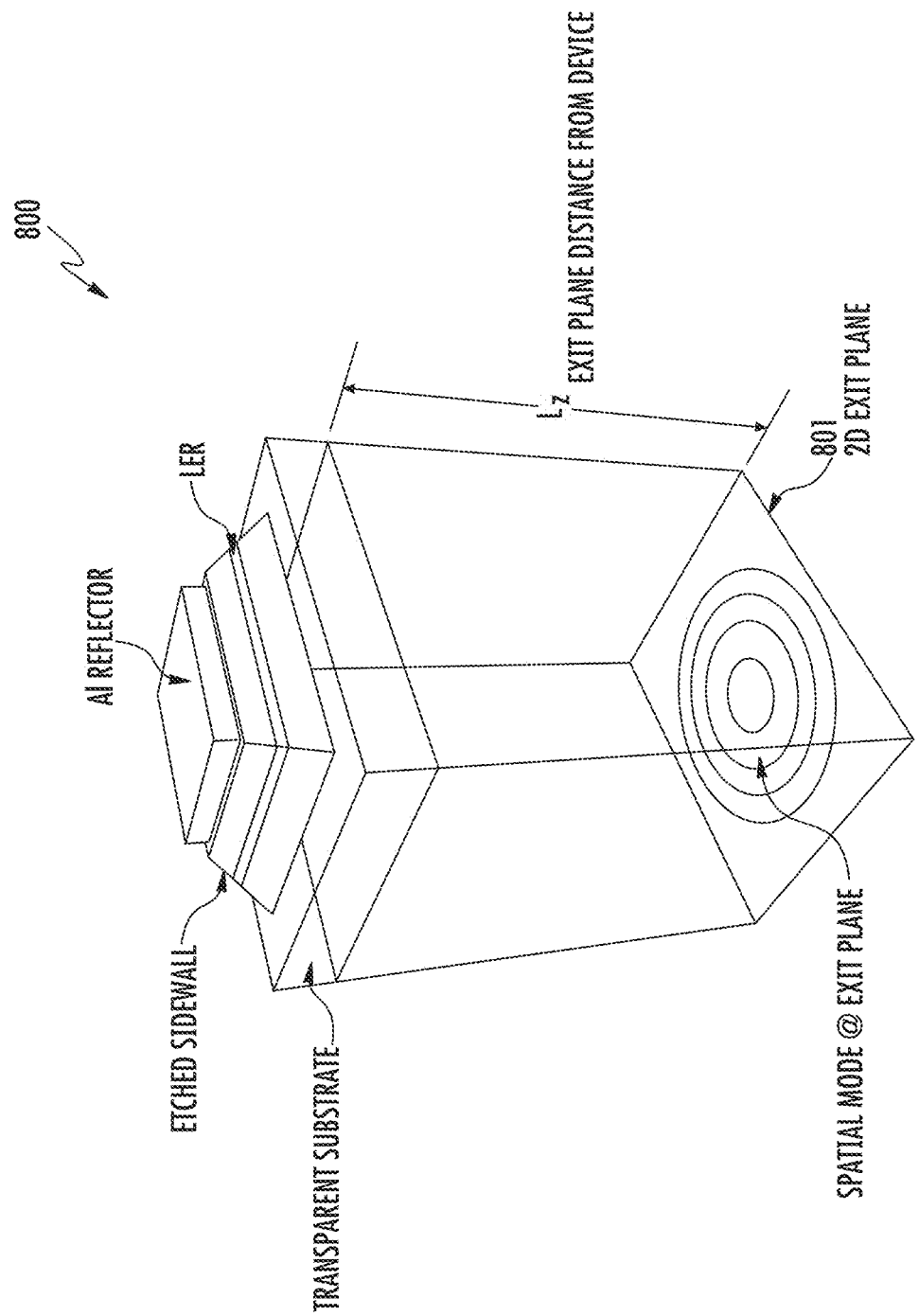
FIG. 8A shows a schematic representation of an exemplary 3D optical device and exit plane.
Figure 8B:
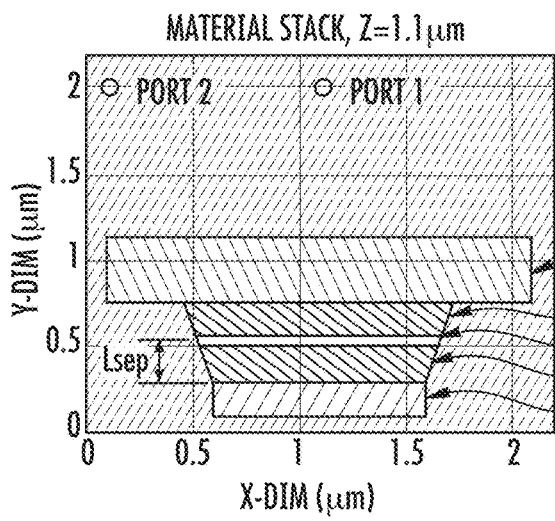
FIGS. 8B-8E demonstrate simulation of a deep UV resonant optical cavity light emitting device, where the device has a square cross-section.
Figure 8C:
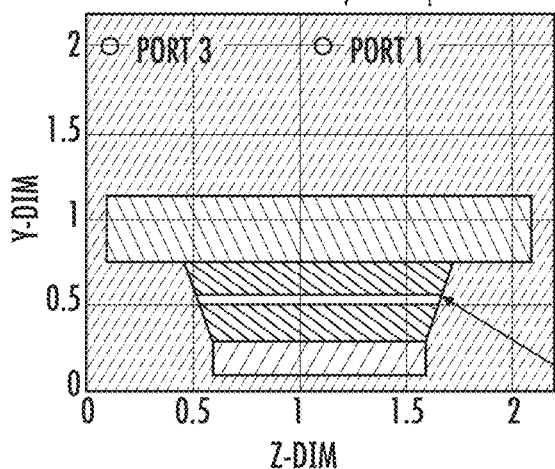
Figure 8D:
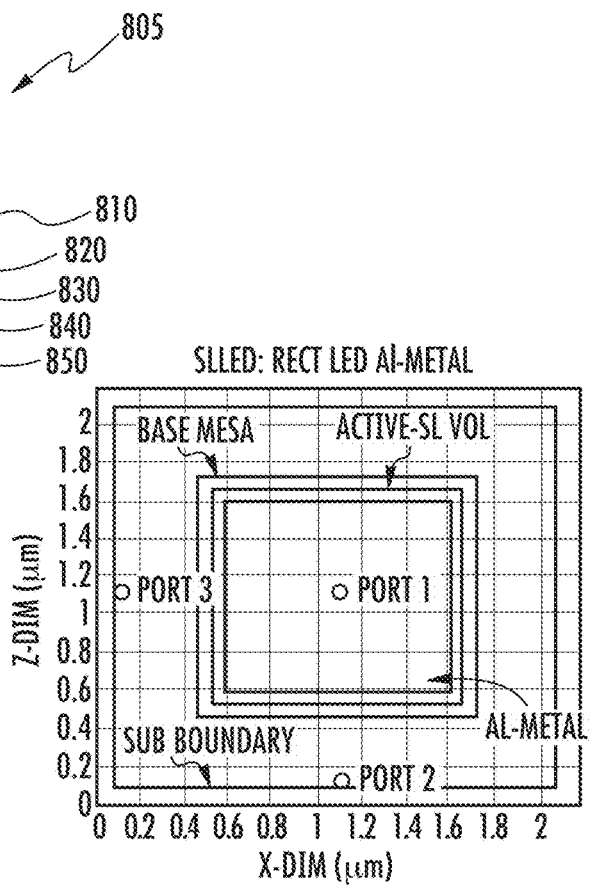
Figure 8E:
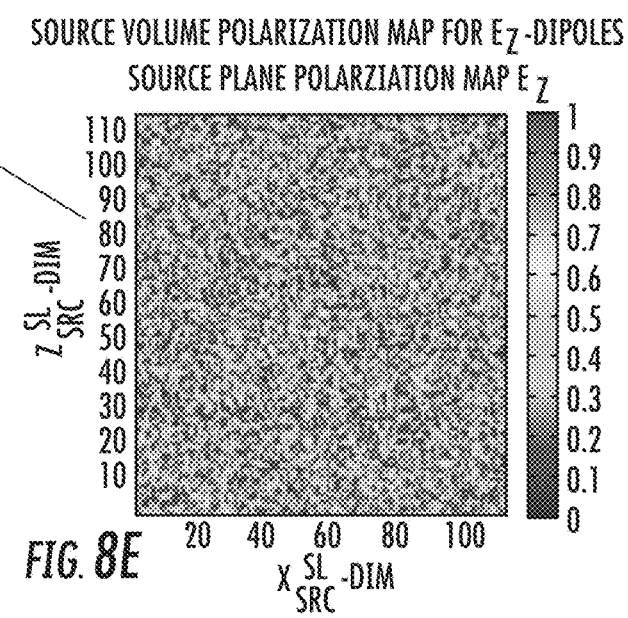
Figure 9:
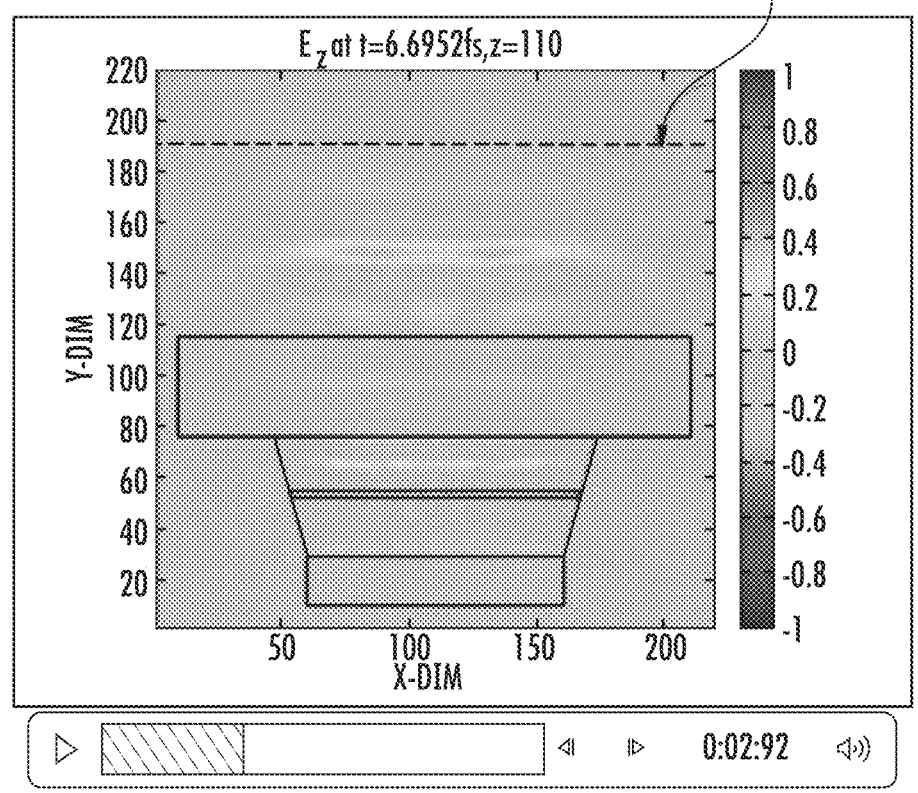
FIG. 9 shows an exemplary simulation output corresponding to the model of FIGS. 8B-8E.

FIG. 9 shows an exemplary output of the modeling at an instant of time, t=6.7 fs in this sample result. Since the light from LER 830 undergoes multiple reflections that interact with each other as they propagate, the spatial $E_z$ fields are time-dependent. Furthermore, the three-dimensional geometry of the device affects the emission of light from the device. The two-dimensional exit plane defined by ports 1, 2 and 3 of FIGS. 8B-8D is indicated by the red dashed line. The exit plane is where the magnitude of radiation emission will be measured. In FIG. 9, some radiation fields at this time point exist within the device while some have been emitted from the device toward the exit plane.

Figure 10B:
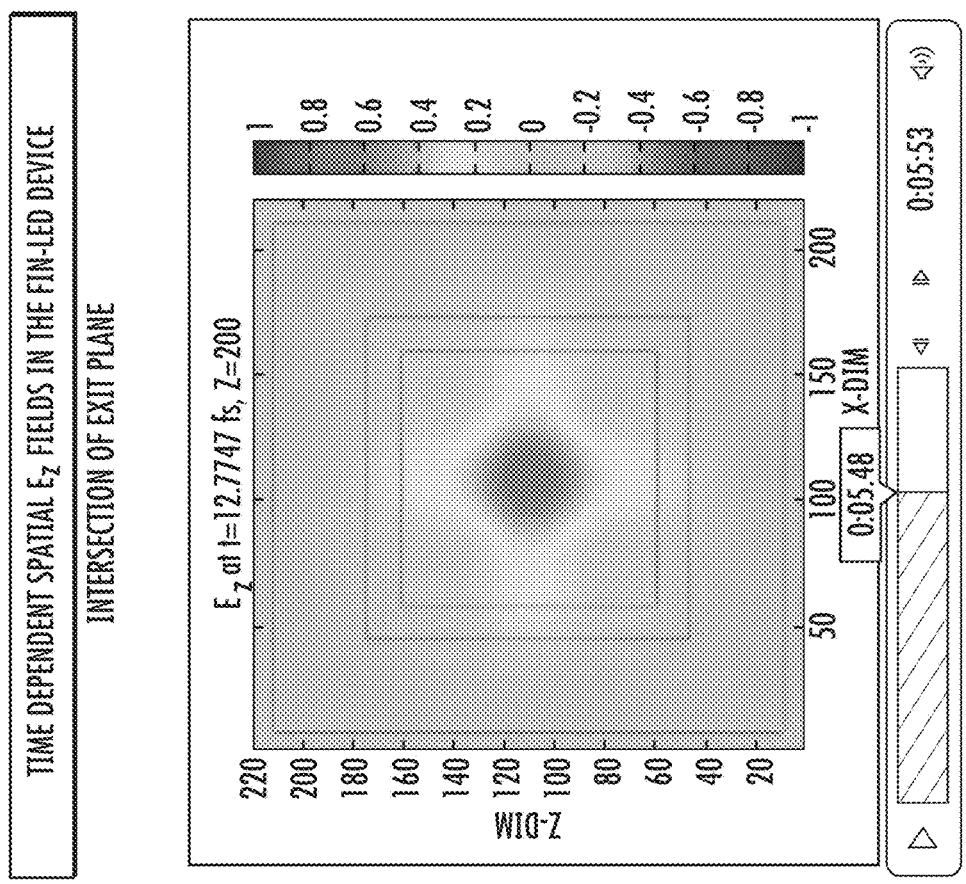
FIGS. 10A-10B show additional simulation outputs corresponding to the model of FIGS. 8B-8E.
Figure 10A:
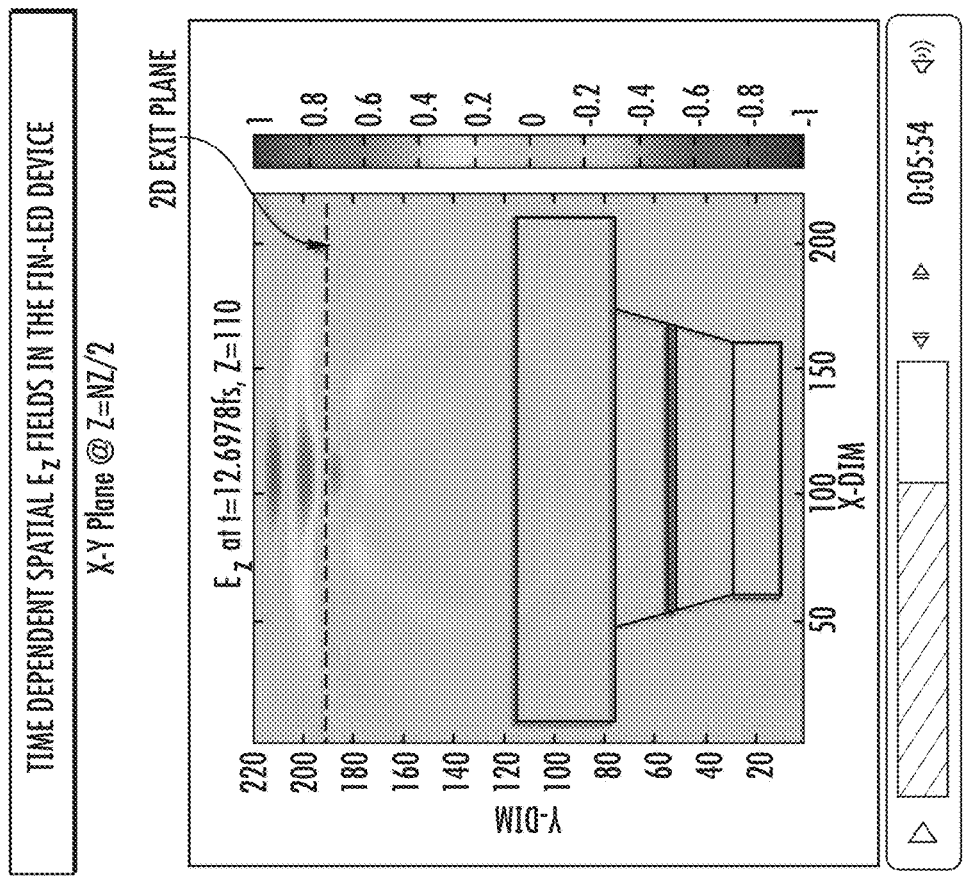

FIG. 10A shows the simulation results at a later time t=12.7 fs, at which point the emission has reached the exit plane. FIG. 10B shows a top view of emission at the exit plane, at approximately the same time point as FIG. 10A. FIG. 10B shows that a non-uniform distribution of light in the x-z plane occurs. This distribution changes over time. Thus, the prediction of the device efficiency is a complex three-dimensional problem that is uniquely addressed in this disclosure by using finite-difference time-domain modeling to optimize the position of the active region within the LED.

Figure 11A:
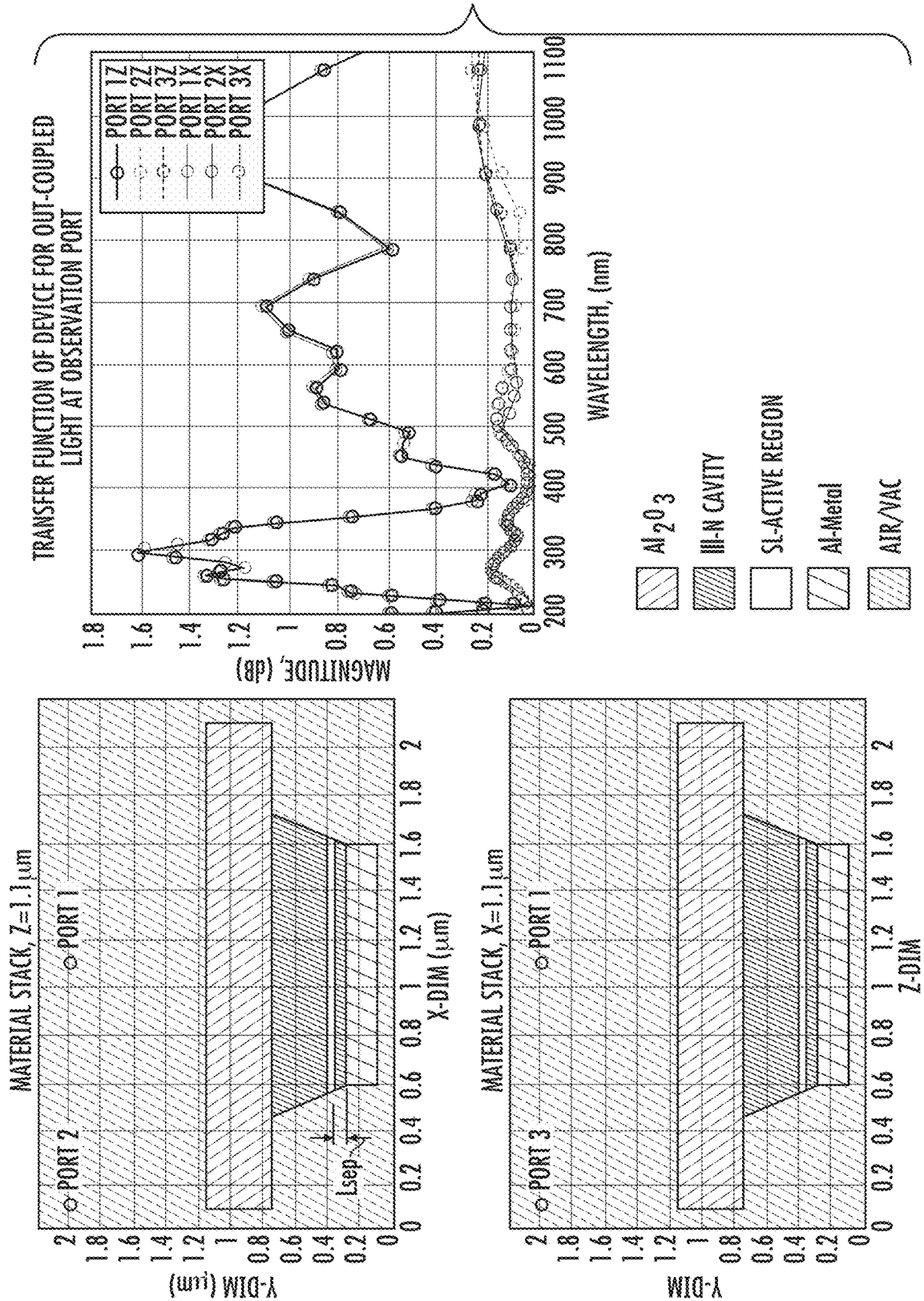
FIG. 11A shows another exemplary simulation, where the position of the light emitting region has been altered.
Figure 11B:
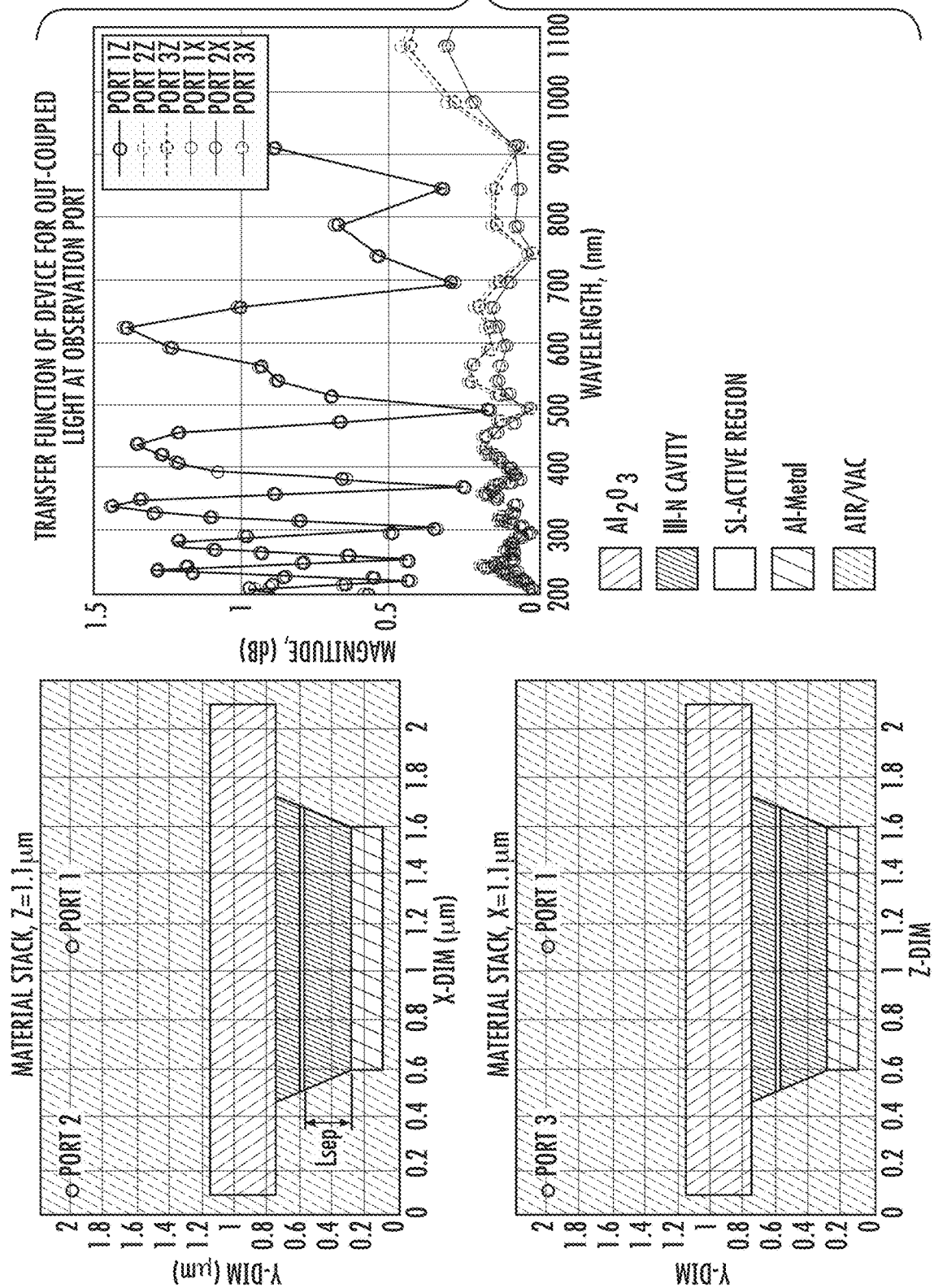
FIG. 11B shows yet another exemplary simulation, where the position of the light emitting region has been changed to a different position from FIG. 11A.
Figure 12A:
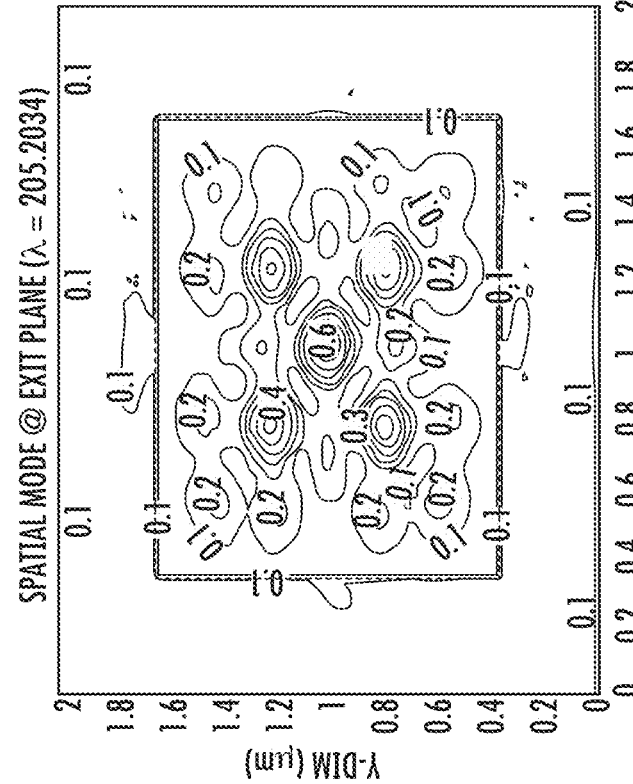
FIGS. 12A-12B show a 2D spatial mode pattern at the exit plane for wavelength $\lambda=205$ nm.
Figure 12B:
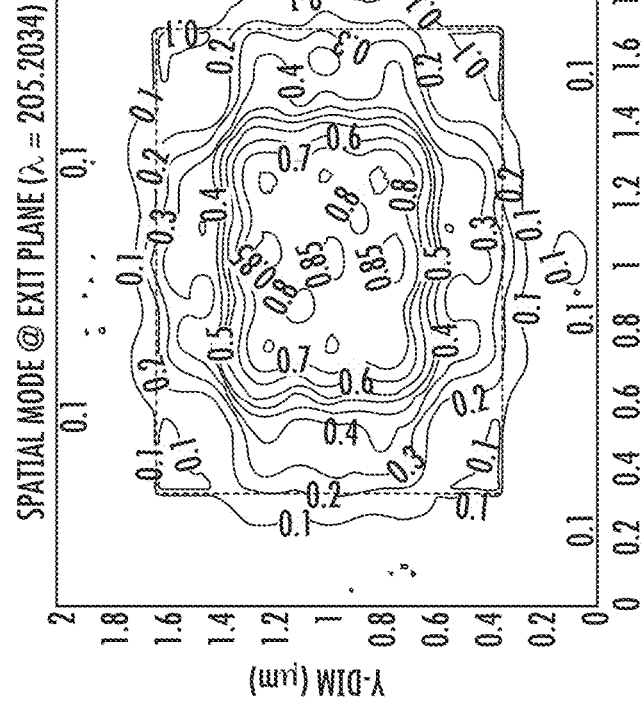
Figure 12C:
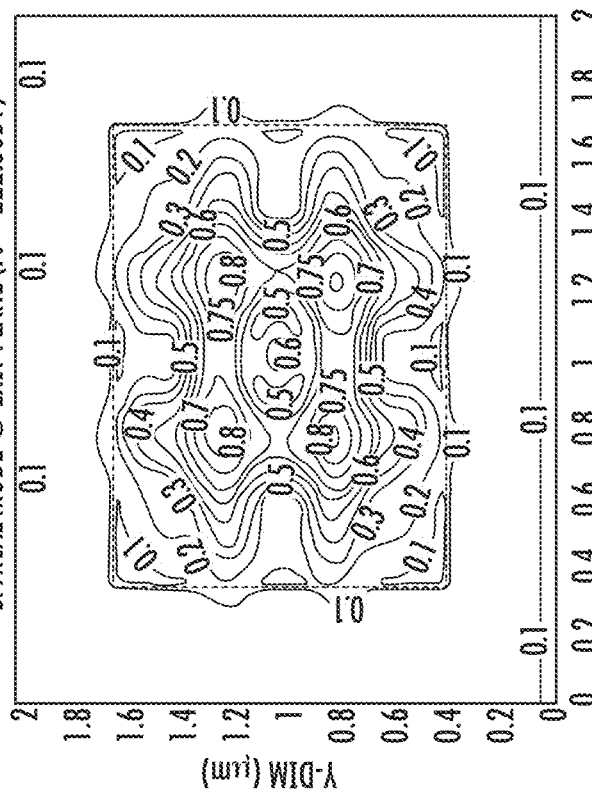
FIGS. 12C-12D show the 2D spatial mode pattern at the exit plane of the devices of FIGS. 12A-12B, for wavelength $\lambda=222$ nm.
Figure 12D:
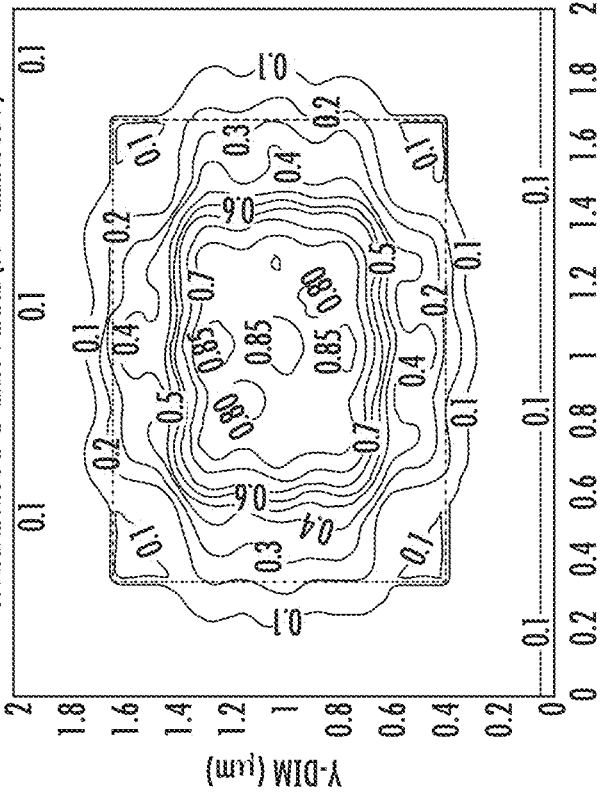
Figure 12E:
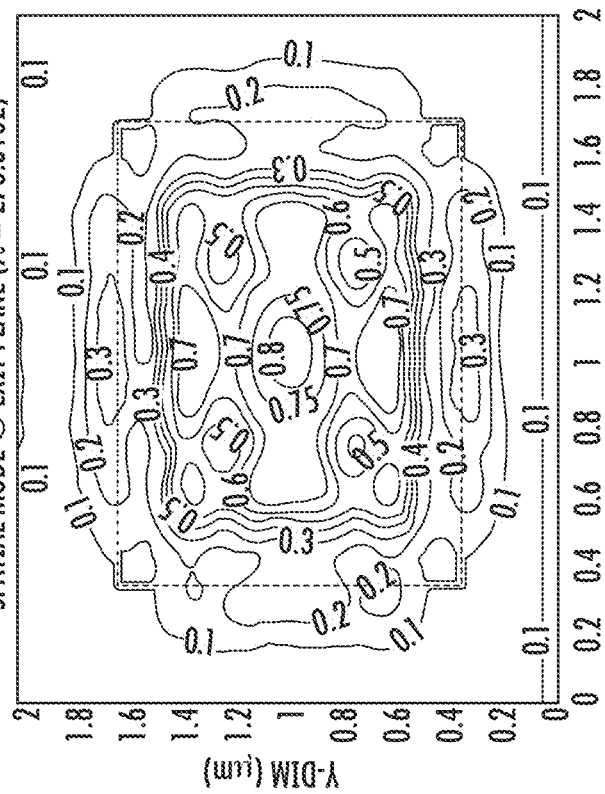
FIGS. 12E-12F show the 2D spatial mode pattern at the exit plane of the devices of FIGS. 12A-12B, for wavelength $\lambda=274$ nm.
Figure 12F:
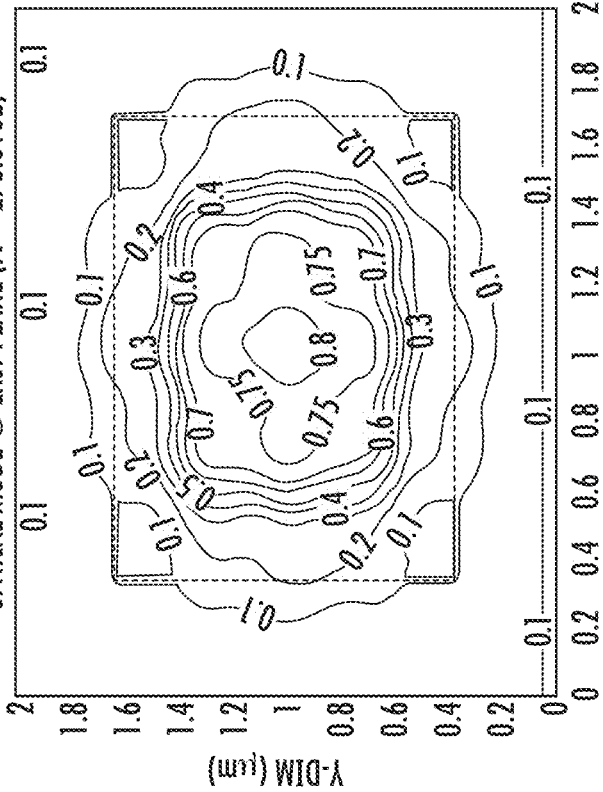

FIGS. 11A-11B show further iterations of the simulation, where the values of $L_{SEP}$ are varied and the resulting magnitudes of radiation emission are determined. In FIG. 11A $L_{SEP}$ is less than the value used in FIGS. 9-10, and in FIG. 11B $L_{SEP}$ is greater. The graphs in FIGS. 11A and 11B show the calculated magnitude of radiation emission at the ports of the exit plane, for various wavelengths produced by the device. In the graph of FIG. 11A, the radiation magnitude is best for a wavelength of approximately 300 nm, while in FIG. 11B the emission strength varies greatly with wavelength. From these graphs, through the simulation methods of the present disclosure, an optimal position of the light emitting region for the device can be determined, to provide a desired efficiency at a target wavelength.

FIG. 12A-12E show sample calculated 2D spatial optical mode profiles at the exit plane for three specific wavelengths λ=205, 222 and 275 nm, with the effect of the position of the LER within the cavity, where Δ=fraction/$L_{CAV}$ represents the fractional position relative to the total cavity length $L_{CAV}$. Selected example positions are fraction=⅙ representing an LER close to the reflector, and fraction=⅚ representing a position close to the substrate. The 2D mode pattern is shown to have uniform spatial power over a majority of the active device for fraction=⅙ for all three wavelengths, whereas the LER positioned furthest from the Al mirror (fraction=⅚) displays a multimode spatial pattern that is disadvantageous for external power coupling.

Using the methods of designing a ROCLED as described herein, a resonant optical cavity light emitting device is produced. In embodiments of the present disclosure, the ROCLED includes a substrate, a first spacer region coupled to the substrate, a light emitting region on the first spacer, a second spacer region on the light emitting region, and a reflector coupled to the second spacer region. The first spacer region is non-absorbing to a target emission deep ultraviolet wavelength, where at least a portion of the first spacer region comprises a first electrical polarity. The light emitting region is configured to generate light at the target wavelength, and is positioned at a separation distance from the reflector. The second spacer region is non-absorbing to the target wavelength, where at least a portion of the second spacer region comprises a second electrical polarity opposite of the first electrical polarity. The reflector has a metal composition comprising elemental aluminum. The resonant optical cavity light emitting device has an optical cavity between the reflector and a first surface of the substrate, the optical cavity comprising the first spacer region, the second spacer region and the light emitting region, where the optical cavity has a total thickness less than or equal to K·λ/n. K is a constant greater than zero ranging from about 0.25 to 10, such as K=0.5, 1, 1.5, 2, etc. Lambda (λ) is the desired emission wavelength, and n is the effective refractive index of the optical cavity at the desired (target) wavelength.

In some embodiments, K is a non-integer, such as a value 0<K<1, for instance K ranging from 0.25 to less than 1. Such embodiments may have the first spacer directly coupled to (i.e., directly on) the substrate, where there is no reflector (e.g., no DBR) between the first spacer and the substrate. The thickness of the light emitting region has a finite thickness and is formed to exhibit an advantageous optical response that is substantially absorbing and emissive to the operating wavelength. For example, the active region may comprise a quantum confining structure for both electrons and holes (such as a superlattice or quantum well) which further introduces a finite penetration depth and refractive index due to excitonic effects. Therefore, without including the additional contribution of the active region optical response, exact integer values of K forming the cavity between the high reflector and partial reflector may be undesirable. Furthermore, for the case of DBR structures used for reflective portions of the device there also exists a finite penetration depth of the operating wavelength into the interior of the DBR. As the DBR is an interferometric process, a finite number of periods and or layers comprising the DBR are required to form the reflection and is therefore not defined as reflecting from the first layer of the DBR. Clearly, the parameter K can have non-integer values as described in the present embodiments.

In some embodiments, the separation distance of light emitting region from the reflector is 1/10 to ½ of the total cavity thickness $L_{CAV}$ and is typically limited to a smallest value by the thickness of the p-type region used for the p-up device structure. Alternatively, in some embodiments, the separation distance of the light emitting region from the reflector is ½ to 9/10 and is typically limited to a largest value by the thickness of the p-type region used for the p-down device structure.

In some embodiments, the substrate is optically transparent to the target wavelength. In some embodiments, the substrate is opaque to the target wavelength, the substrate having an optical aperture through the substrate. In some embodiments, at least one of the light emitting region, the first spacer region, and the second spacer region each comprise a superlattice. In some embodiments, the lateral dimensions of the device perpendicular to the plane of the layers comprising the device are in the range of less than or equal to 5 microns, and greater or equal to 0.1 microns.

Figure 13A:
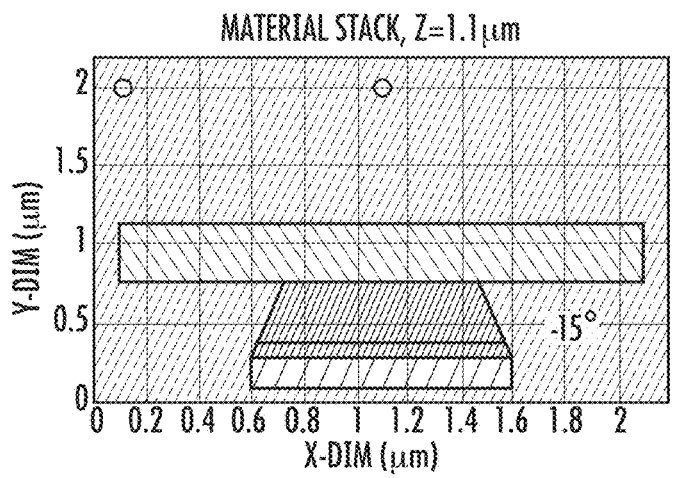
FIGS. 13A-13B demonstrate an embodiment of a device with an alternative side wall angle in accordance with some embodiments.
Figure 13B:
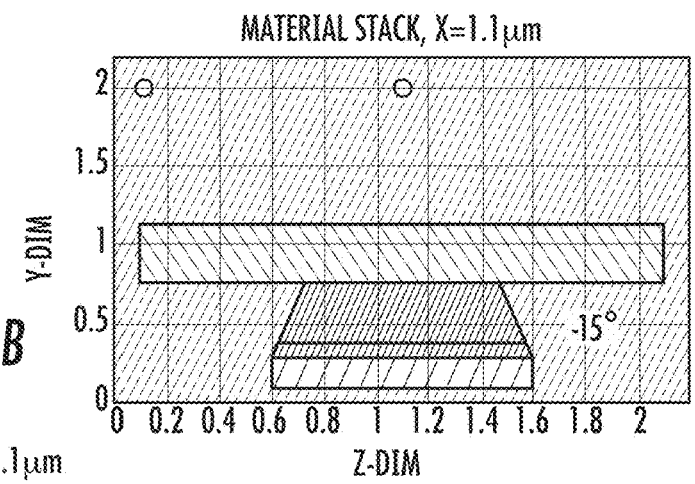
Figure 14A:
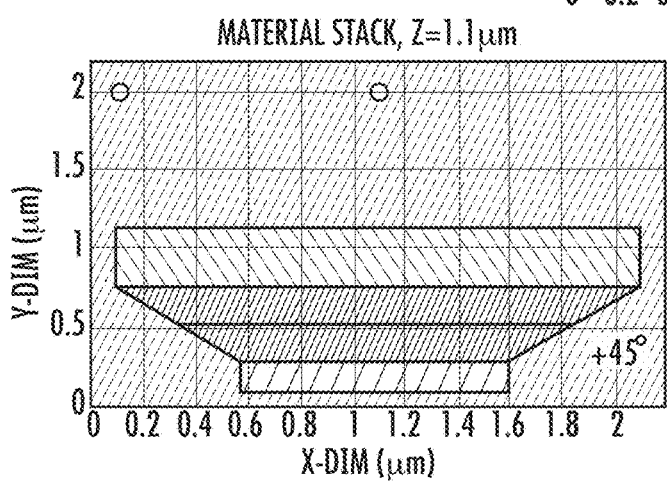
FIGS. 14A-14B demonstrate an embodiment of another device with a different side wall angle from FIGS. 13A-13B, in accordance with some embodiments.
Figure 14B:
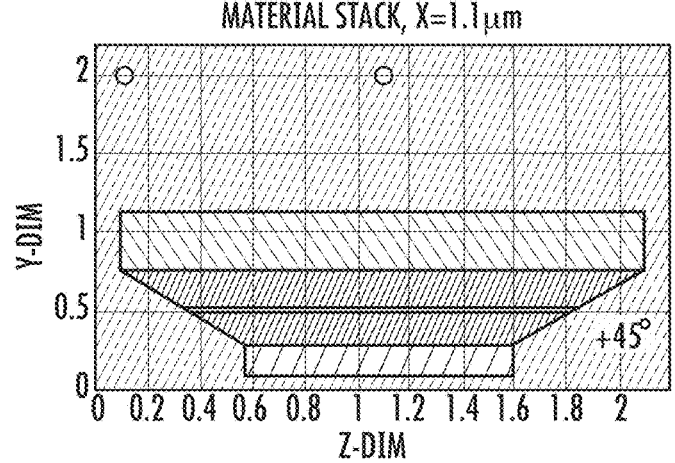

FIGS. 13-15 demonstrate the use of the present methods for modeling further device geometries. For example, in FIGS. 13A-13B a side wall angle that tapers toward the substrate is modeled, having an angle of −15° in this embodiment. In FIGS. 14A-14B a side wall angle that tapers away the substrate is modeled, having an angle of +45°. That is, for the angled side walls of FIGS. 14A-14B, a cross-sectional area of the first spacer region is greater than a cross-sectional area of the second spacer region. These configurations will impact the emission characteristics of the device and can be optimized through the simulations.

Figures 15A, 15B:
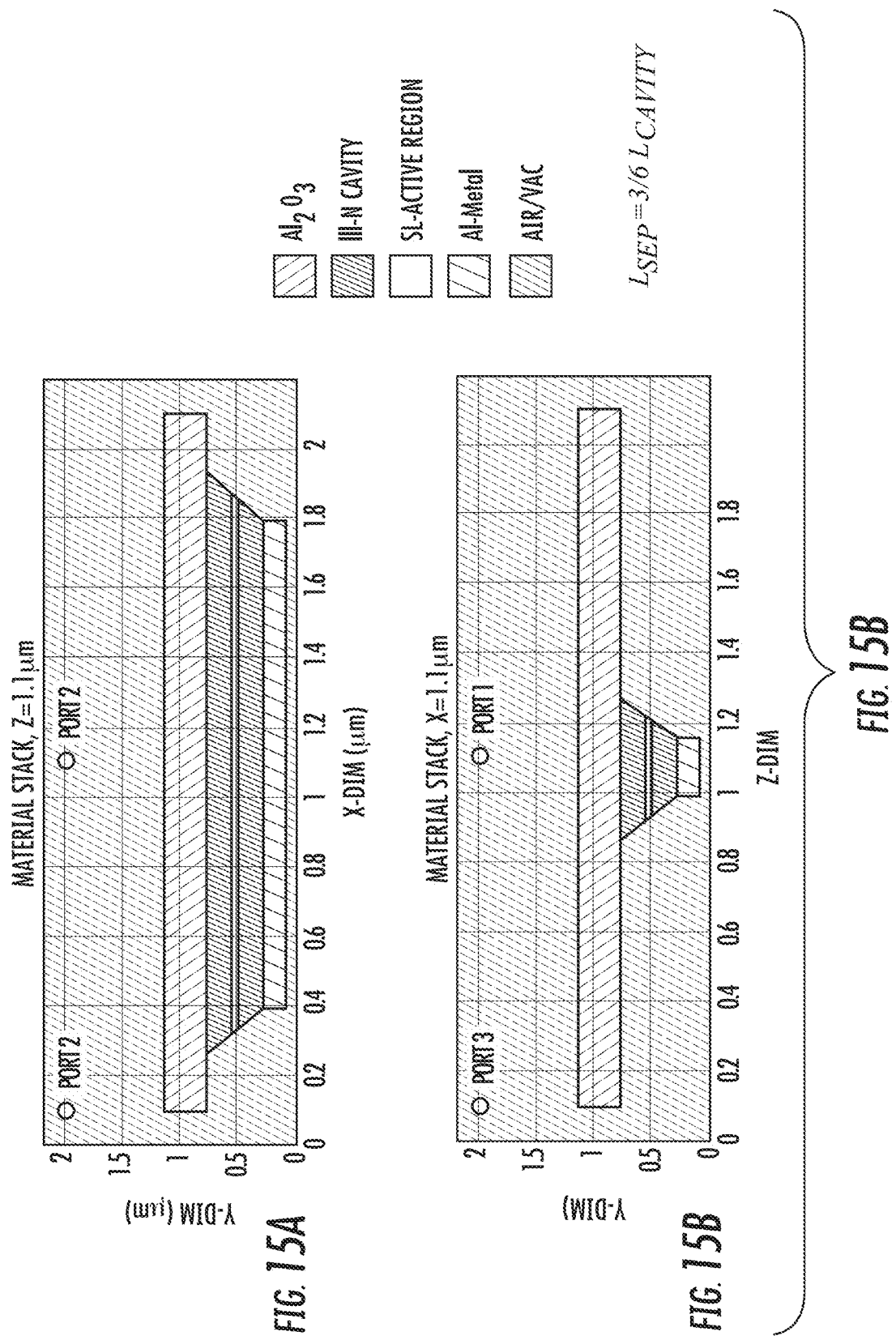
FIGS. 15A-15B demonstrate an embodiment of a rectangular device geometry in accordance with some embodiments.
Figure 15C:
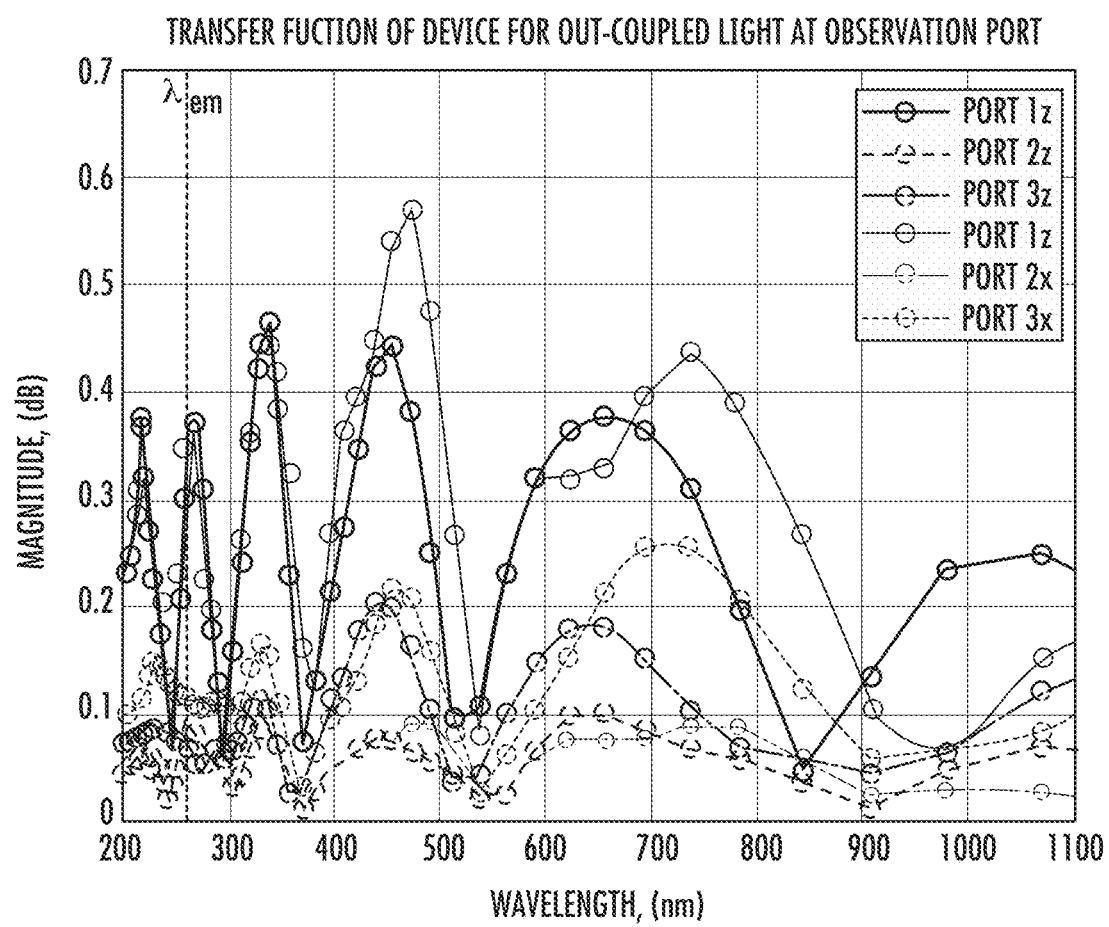
FIG. 15C shows an exemplary simulated emission output for out-coupled light at observation ports of a device.

The devices of FIGS. 13 and 14 have approximately square cross-sections in a horizontal plane, as seen by the fact that the widths of the vertical cross-section in FIG. 13A is approximately the same as FIG. 13B, and similarly for FIGS. 14A and 14B. In contrast, FIGS. 15A-15B show a rectangular geometry, where the width of the device in the x-dimension (FIG. 15A) is greater than that in the z-direction (FIG. 15B). The LER position $L_{SEP}$ is half of the cavity length. FIG. 15C shows the emission output of the device of FIGS. 15A-15B, showing that a peak of the magnitude of radiation emission approximately coincides with the desired wavelength XEM. Therefore, this device geometry is a feasible design choice for the LED.

Figure 17:
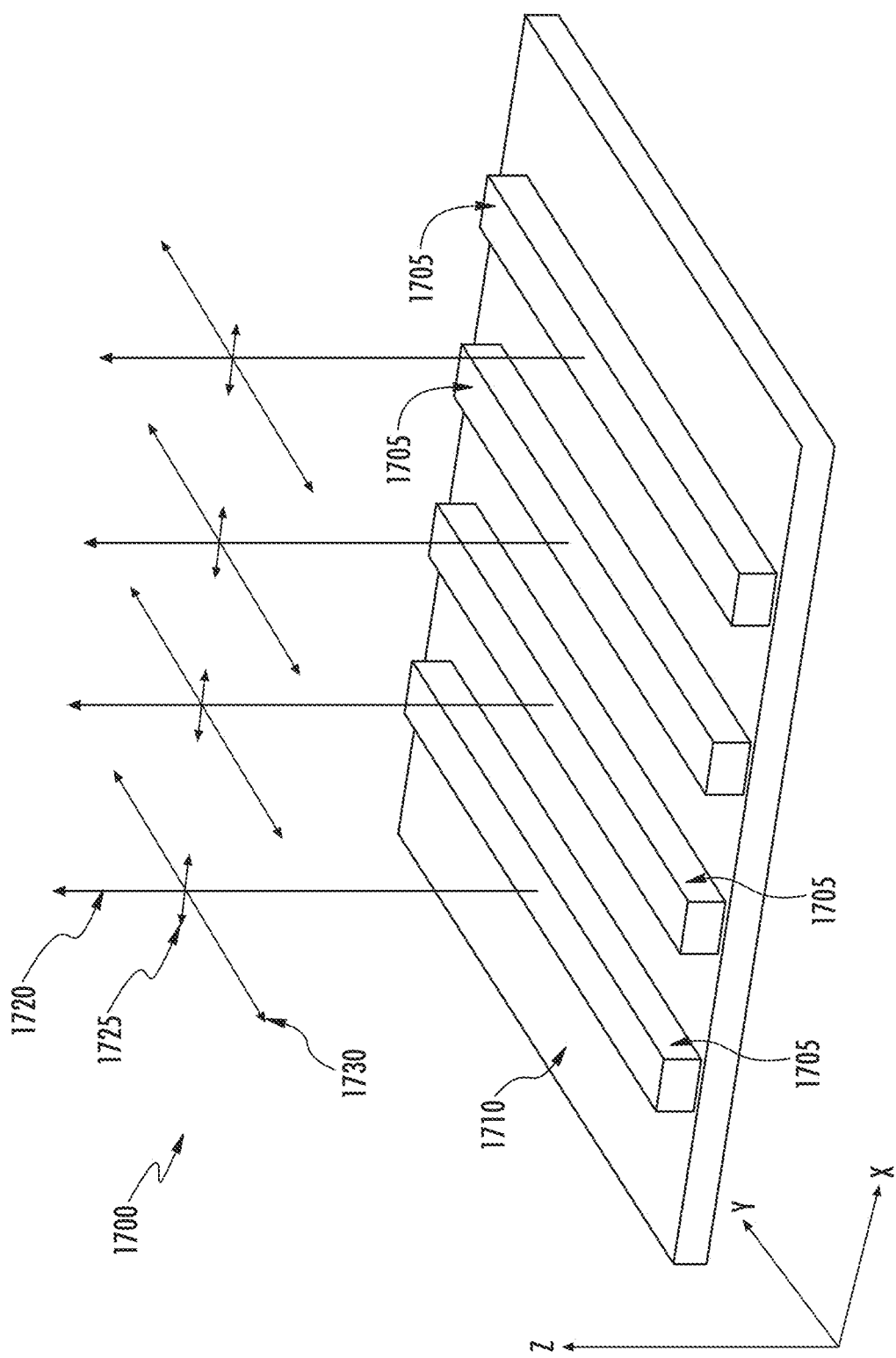
FIG. 17 is a perspective view of an exemplary device having multiple rectangular structures to create selective polarization.

In certain embodiments, it is desirable that the LED shape is asymmetrical (that is, non-axisymmetric) rather than symmetrical, such as to produce optical emission polarization that is linearly polarized or elliptically polarized. This serves to polarize the radiation emitted by the device and tends to enhance efficiency of the device. That is, rectangular shapes enable a preferred polarized radiation to be produced in a preferred direction. FIG. 17 shows a device 1700 that utilizes asymmetric geometries for selective polarization. The device 1700 includes a plurality of rectangular or fin-like LED structures 1705 parallel to each other on a substrate 1710, where LED structures 1705 may be similar to, for example, the structures of FIGS. 15A-15B. The top surfaces of the LED structures 1705—which are planes parallel to the substrate 1710—are non-axisymmetric. Breaking the axial symmetry and confining the light in the plane of the layers creates a preferred polarization field to be vertically emitted (arrows 1720) from the devices. Placing the plurality of structures displaced horizontally a multiple of half wavelengths apart further reinforces the constructive interference of the emitted radiation field. The arrows 1725 and 1730 represent the in-plane optical polarizations, with the relative magnitude representing the degree of selectivity in a particular direction due to the geometrical shape of the device fin 1705. That is, an asymmetric fin geometry 1705 would produce an elliptically polarized TE-like emission pattern directed in a direction 1720.

Figure 18A:
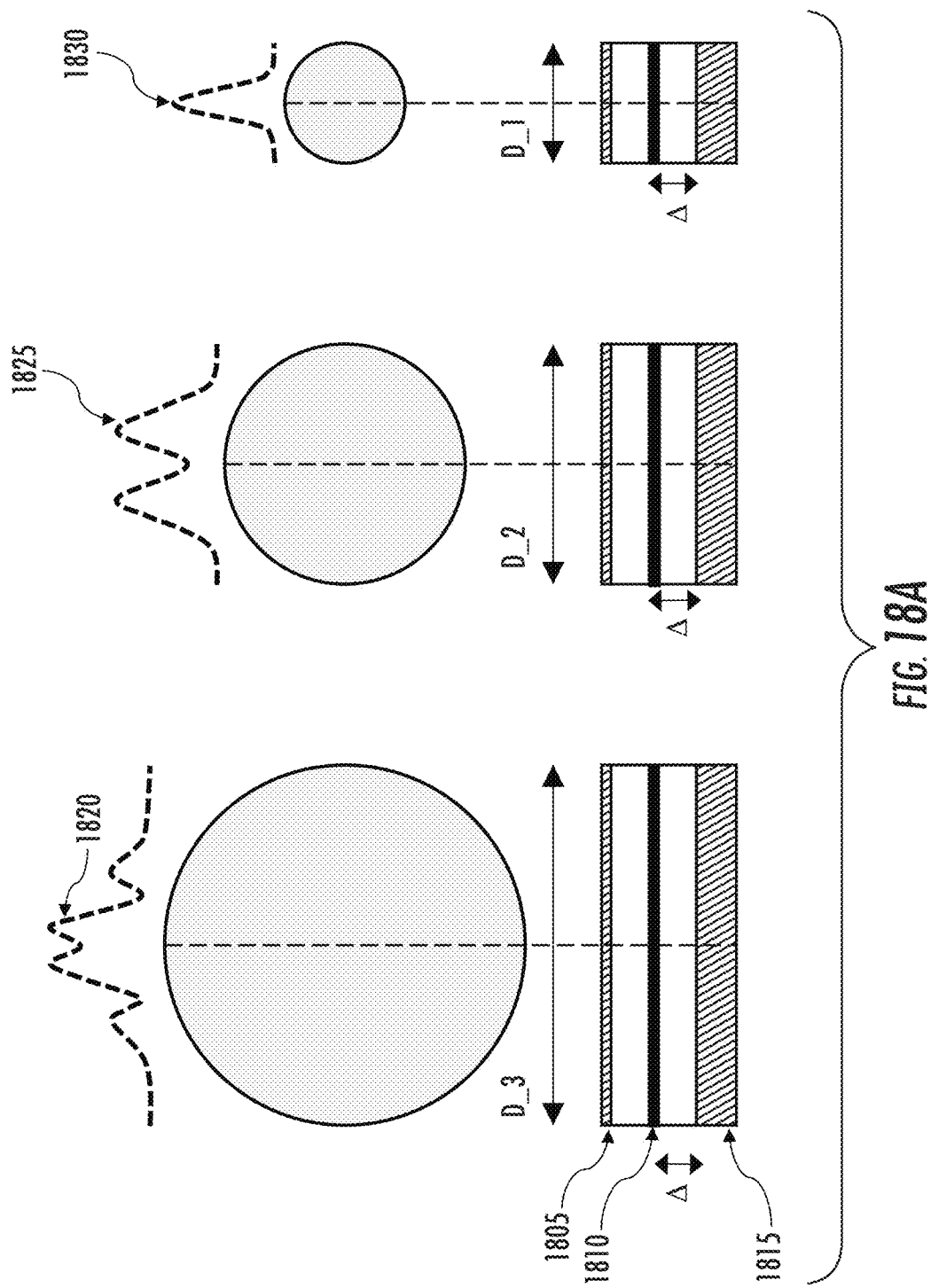
FIG. 18A is a schematic of cylindrical devices for creating a single mode output.

In other embodiments, a symmetric geometry may be chosen to create mixed polarization as shown in FIGS. 18A-18C, as an alternative to using an asymmetric structure like that shown in FIG. 17 to achieve selective polarization. If the device is symmetric such as having a horizontal cross-section being cylindrical, hexagonal or annular in shape, then radiation emitted is randomly polarized whereas rectangular-shaped (asymmetric) devices result in the emission of polarized oriented radiation in a particular direction. Thus, the emission output may be constrained as an ideal single mode emission output at an observation plane. This may be achieved by a cylindrical device having a diameter of, for example, approximately 2 µm for a III-N SL material system as shown in FIG. 18A, which provides plan and cross-sectional diagrams of cylindrically symmetric example optical cavity devices having different diameters D_1<D_2<D_3. The vertical layers include an output coupler 1805 and an optical emission region 1810 positioned at a distance A from the high reflector 1815. The plan views show the axisymmetric circular cross-sections in a plane parallel to the output coupler substrate 1805. For a given A, and operating wavelengths that are not well matched to the diameter, the near field spatial emission pattern is multimode 1820 and 1825. For the case of the diameter D_1 being well matched to the operating wavelength, the spatial emission profile is single mode or quasi—single mode 1830. As in the previous embodiments, the cavity of the device is formed between an aluminum backside reflector (1815) and a transparent substrate (1805). Devices can be constructed by etching or lateral oxidation if using III-N into III-oxides of lower refractive index. That is, lateral optical confinement can be created by selective spatial conversion of III-N by oxidation process creating an advantageously low refractive index region and insulative region. The low refractive index region or etched region can be used to further limit the planar extent of the 3D structure and thus further modify the allowed number of modes. Rotationally symmetric (i.e., disc) resonators produce transmission modes of mixed $E_X$ and $E_Z$ polarization, including unpolarized and circularly polarized. The allowed optical modes within the volume of the device are therefore controlled to produce optimal coupling to vertical propagating modes. FDTD simulations as described above may be used to optimize the device dimensions, such as to choose a desired disc radius for a given cavity length. For example, FIG. 18B illustrates a cylindrical vertical resonant optical cavity LED having a radius $R_{CAV}$ of 0.57 µm. A desirable single optical mode output is seen in at the exit plane, as demonstrated by the peak emission being centered in the disk and gradually decreasing outward. FIG. 18C simulates a radius $R_{CAV}$ of 0.85 µm, where an undesirable multi-mode output is seen due to the concentric rings of varying intensity.

Figure 19:
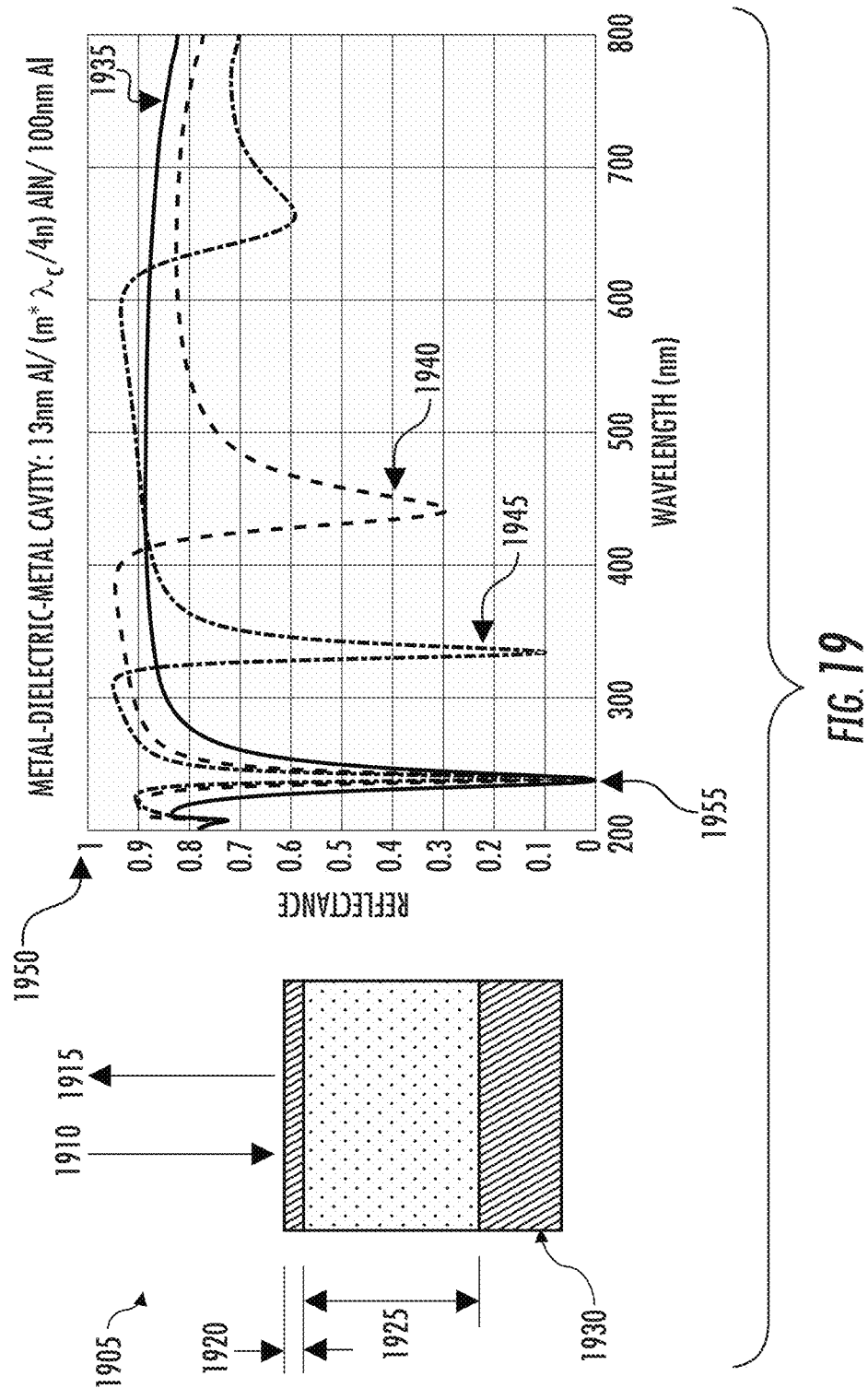
FIG. 19 is a diagram of a partially reflective mirror, in accordance with some embodiments.

In other embodiments, a Fabry Perot interferometer effect may be used to increase emission efficiency by placing a partially reflective mirror (e.g., 5%) above the substrate and between the optically transparent substrate and the first spacer region. That partial mirror and the reflective Al allow radiation to interfere positively to enhance the radiation emitted by the device. This is shown in FIG. 19 for the simple cavity structure 1905, where a partially reflective mirror 1920 acts as an output coupling material for the dielectric cavity 1925 and high reflectance mirror 1930. The example optical cavity 1905 is formed using metallic mirrors and the dielectric semiconductor cavity 1925 that comprises aluminum nitride. The normal incidence reflection spectrum 1950 is for a semitransparent 13 nm aluminum with AlN dielectric cavity and highly reflecting 100 nm aluminum reflector that forms the vertical optical cavity 1905, for the case of L_cav=m*$\lambda$/(2*n) and a desired operating wavelength of $\lambda$=240 nm (as indicated by optical mode 1955), where m=odd integer and n is the refractive index of AlN. The thickness of the semitransparent aluminum output coupling mirror 1920 is optimized for a thickness of 13 nm to achieve a sharp optical mode 1955. The spectral dependence of normal incidence 1910 and reflected light 1915 is shown in the graph 1950 for different cavity thicknesses. For example, the optical modes of the device 1905 as a function of the thickness of cavity 1925 are determined in the reflectance spectrum 1950 for the cases of (m=1) 1935, (m=3) 1940 and (m=5) 1945, as shown in FIG. 19. The optical mode 1955 can therefore be utilized advantageously for out coupling of optical energy generated from within the cavity.

Figure 20:
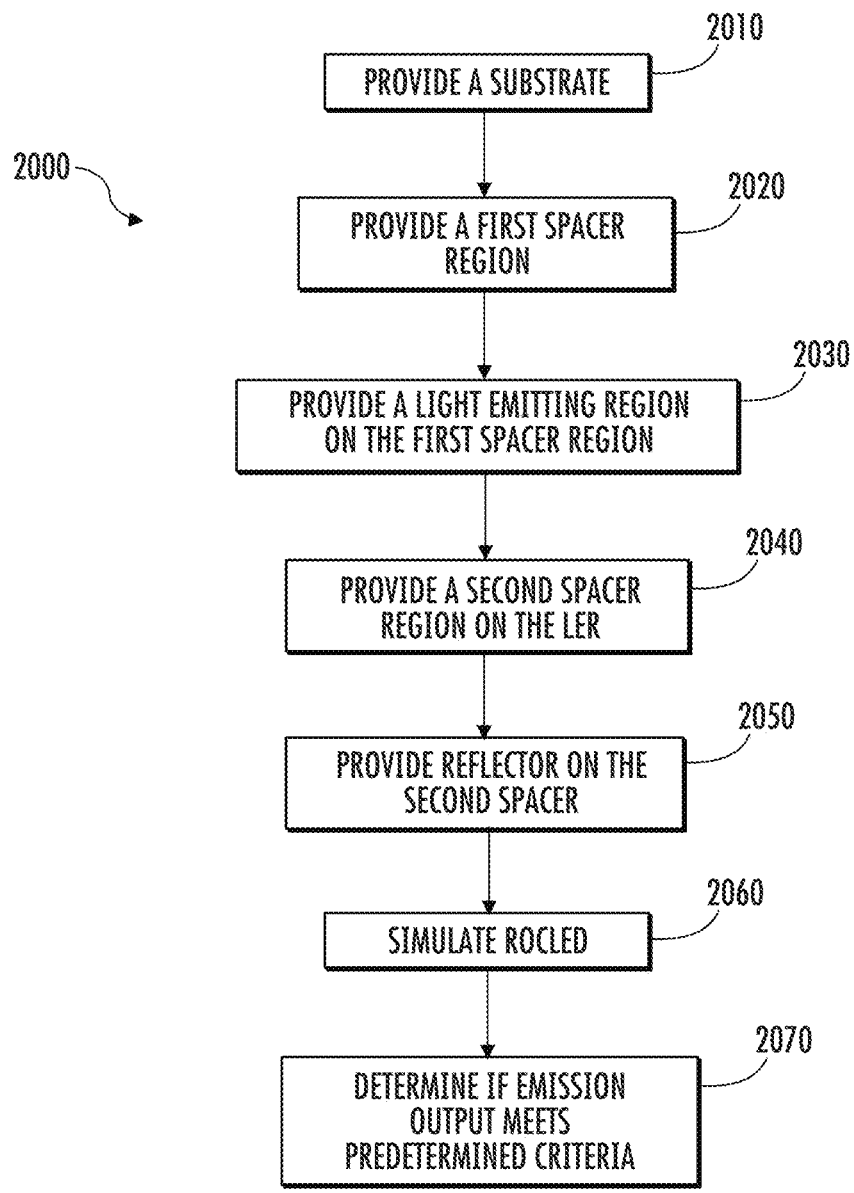
FIG. 20 is a flowchart of methods for manufacturing a deep UV resonant optical cavity light emitting device, in accordance with some embodiments.

The flowchart 2000 of FIG. 20 describes embodiments of methods for manufacturing a resonant optical cavity light emitting device of the various configurations and using the simulation methods described herein. In step 2010, a substrate is provided. In step 2020, a first spacer region is provided, the first spacer being coupled to the substrate. The first spacer region is non-absorbing to a target emission deep ultraviolet wavelength, where at least a portion of the first spacer region comprises a first electrical polarity. A light emitting region on the first spacer region is provided in step 2030, the light emitting region being configured to emit the target emission deep ultraviolet wavelength. A second spacer region is provided on the light emitting region in step 2040, the second spacer region being non-absorbing to the target emission deep ultraviolet wavelength. At least a portion of the second spacer region comprises a second electrical polarity opposite of the first electrical polarity. In step 2050 a reflector is provided, the reflector being coupled to the second spacer region. The reflector has a metal composition comprising elemental aluminum. The light emitting region is positioned at a separation distance from the reflector. In step 2060 the resonant optical cavity light emitting device is simulated using a three-dimensional electromagnetic spatial and temporal simulator. The simulation is based on the light emitting region being at the separation distance from the reflector. In step 2070 it is determined if an emission output at an exit plane relative to the substrate meets a predetermined criterion. The predetermined criterion is selected from i) an optical extraction efficiency at the exit plane with respect to the light generated from the light emission region at the target wavelength, ii) a target spatial profile of light emitted at the exit plane at the target wavelength, and iii) light extracted from the device being emitted substantially perpendicular to the substrate.

In some embodiments of the methods of flowchart 2000, the three-dimensional electromagnetic spatial and temporal simulator is a finite-difference time-domain simulator. In some embodiments, the resonant optical cavity light emitting device may comprise an electrical structure of a p-i-n diode and is a vertical cavity surface light emitting diode (VCSLED). In some embodiments, at least one of the light emitting region, the first spacer region, and the second spacer region may each comprise a superlattice. In some embodiments, the resonant optical cavity light emitting device may be configured as a p-up device, the first electrical polarity being n-type and the second electrical polarity being p-type, where the optical reflector comprises pure aluminum, and where a compound semiconductor and metallic contact is provided on the second spacer region. In some embodiments, the resonant optical cavity light emitting device may be configured as a p-down device, the first electrical polarity being p-type and the second electrical polarity being n-type, and where the optical reflector is a metal electrical contact for the resonant optical cavity light emitting device.

In some embodiments of the methods of flowchart 2000, the substrate may be optically transparent, where at the target wavelength, a first refractive index of the optically transparent substrate is less than or equal to a second refractive index of the first spacer region. In some embodiments, a cross-section of the resonant optical cavity light emitting device in a plane parallel to the substrate is non-axisymmetric, providing an optical emission polarization that is linearly polarized or elliptically polarized. In some embodiments, a cross-section of the resonant optical cavity light emitting device in a plane parallel to the substrate is axisymmetric, providing optical emission polarization that is unpolarized or circularly polarized.

In some embodiments of the methods of flowchart 2000, the resonant optical cavity light emitting device has an optical cavity between the reflector and a first surface of the substrate, the optical cavity comprising the first spacer region, the second spacer region and the light emitting region; where the substrate is optically transparent, and where the optical cavity has an total thickness comprising the distance from the first surface of the substrate to the reflector, the total thickness being less than or equal to K·$\lambda$/n. The total thickness of the optical cavity may be less than or equal to the desired emission wavelength, thereby forming a sub-wavelength resonator. The method may further comprise selecting the target wavelength, selecting a material for the optically transparent substrate, selecting a thickness of the first spacer region, and selecting a thickness of the second spacer region to match the target wavelength to at least one allowed optical mode formed by the optical cavity and the reflector.

In various embodiments, the three-dimensional ROCLED may be constructed by a process including laterally patterning the layered structure to form a 3D device by using at least one of (i) spatially selective subtractive etching of a portion of the layered structure; (ii) spatially selective high energy implantation of foreign atomic species into the layered structure; (iii) spatially selective transformation of the materials comprising the layered structure by transforming the initial material into another form of material composition that is dissimilar to the initial material; and (iv) spatially selective coating the exposed sidewalls of the 3D structure using at least one low refractive index and electrically insulating material, wherein the low refractive index material at the operating deep ultraviolet emission wavelength is less than the mean refractive index of the layer structure. The patterning process is performed such that electronic and optical confinement and or isolation of the device is achieved. In some embodiments, in-situ deposition on a second spacer region of an optical reflector may be performed prior to patterning and forming the 3D device, forming at least a portion of a final reflector structure during the layer formation process of the layered structure. In some embodiments, the 3D device construction process may include deposition of a high reflector after the layer formation step, and then patterning the 3D device. In some embodiments, the device is manufactured by using an in-situ reflectance spectrum monitoring of the layered structure during film formation to determine the optical cavity thickness, and tuning of the optical cavity thickness to a predetermined value by controlling the thickness of the second spacer region prior to deposition of at least a portion of the optical reflector.

In some embodiments of constructing the three-dimensional ROCLED by a process including laterally patterning the layered structure, the substrate is transparent to at least the operating deep ultraviolet emission wavelength. The transparent substrate may have a refractive index at the operating deep ultraviolet emission wavelength that is less than the average refractive index of the layered structure materials at the operating deep ultraviolet emission wavelength. The transparent substrate may also be patterned to form an optical element selected from an optical concentrator (such as a lens), diffractive element (such as, a planar diffraction grating element or planar Bessel beam concentric aperture). In other embodiments, the substrate is opaque and is patterned to form an optical aperture beneath at least a portion of the said layered structure and the high reflector. The opaque substrate may be patterned to form an optical aperture that substantially removes all of the opaque substrate within the aperture, where formed optical aperture may extend through the substrate and terminate to at least the interface between the substrate and the first spacer region. A second optical reflector may be formed within the formed optical aperture that is formed by depositing a reflector structure. The device may comprise an optical cavity formed by sandwiching a layered structure between an upper and a lower reflector, wherein one of the reflectors is of high reflectance at the operating deep ultraviolet emission wavelength, and the other reflector is partially reflecting at the operating deep ultraviolet emission wavelength.

In some embodiments of constructing the three-dimensional ROCLED by a process including laterally patterning the layered structure, the reflector material comprises metallic aluminum, providing high reflectivity and low loss at the operating deep ultraviolet emission wavelength. In some embodiments, the reflector material is selected from a periodic quarter wavelength bi-layered stack comprising optical materials selected from substantially transparent compositions at the operating deep ultraviolet emission wavelength and having refractive index difference of at least 0.1 between the bi-layer pairs. In some embodiments, a reflector is a metallic-dielectric metamaterial where the reflector metamaterial is selected from a periodic quarter wavelength stack comprising materials selected from substantially transparent material compositions and metallic aluminum compositions; where one of the quarter wavelength stack compositions is selected from at least one of aluminum nitride (AlN), magnesium fluoride ($MgF_2$), aluminum-oxy-nitride ($AlO_xN_y$), aluminum oxide $Al_2O_3$, and calcium fluoride ($CaF_2$); and another quarter wavelength stack composition is selected from a multilayered stack comprising an optically transparent material and metallic aluminum (Al), with the optically transparent material selected from at least one of aluminum nitride (AlN), magnesium fluoride ($MgF_2$), aluminum-oxy-nitride ($AlO_xN_y$), aluminum oxide $Al_2O_3$, and calcium fluoride ($CaF_2$). In some embodiments, the reflector is a distributed dielectric Bragg reflector selected from a periodic quarter wavelength stack comprising at least two dissimilar substantially transparent material compositions selected from at least two of aluminum nitride (AlN), magnesium fluoride ($MgF_2$), aluminum-oxy-nitride ($AlO_xN_y$), aluminum oxide ($Al_2O_3$), and calcium fluoride ($CaF_2$).

In some embodiments of constructing the three-dimensional ROCLED by a process including laterally patterning the layered structure, an optical cavity is formed between the high reflector and the substrate, where the optical cavity comprises the first spacer region, light emitting region and the second spacer region. The optical cavity may have a thickness that is less than the operating deep ultraviolet emission wavelength, thereby producing a sub-wavelength cavity. The optical cavity may have a thickness that is comparable to the operating deep ultraviolet emission wavelength, thereby producing a nano-cavity. The optical may have a thickness that is greater than the operating deep ultraviolet emission wavelength, thereby producing a sub-micron cavity.

In some embodiments of constructing the three-dimensional ROCLED by a process including laterally patterning the layered structure, the device has lateral dimensions being less than 2 microns thereby forming an optical lateral confinement structure. In certain embodiments, at least one of the two lateral dimensions is less than 2 microns thereby forming an optical lateral confinement structure. In certain embodiments, the device has at least one of the two lateral dimensions being less than 2 microns thereby forming an optical lateral confinement structure and having an output spatial optical mode that is substantially single mode. In certain embodiments, the device has at least one of the two lateral dimensions being less than 2 microns thereby forming an optical lateral confinement structure and having an output spatial optical mode that is substantially a Bessel mode.

In some embodiments of constructing the three-dimensional ROCLED by a process including laterally patterning the layered structure, the device is a P-up structure having a p-type conductivity for at least a portion of first spacer region structure is disposed near the substrate; and a n-type conductivity for at least a portion of the second spacer region structure is disposed near the reflector. The light emitting region is substantially intrinsic conductivity or not intentionally doped and is positioned at allowed optical modes of the cavity. The light emitting region is preferentially positioned near the p-type conductivity region relative to the n-type conductivity region due to the low mobility of holes compared to electrons.

In some embodiments of constructing the three-dimensional ROCLED by a process including laterally patterning the layered structure, the device is a P-down structure having a n-type conductivity for at least a portion of first spacer region structure is disposed near the substrate; and a p-type conductivity for at least a portion of the second spacer region structure is disposed near the reflector. The light emitting region is substantially intrinsic conductivity or not intentionally doped and is positioned at allowed optical modes of the cavity. The light emitting region is preferentially positioned near the p-type conductivity region relative to the n-type conductivity region due to the low mobility of holes compared to electrons.

Further embodiments for creating optical cavities for deep UV operation are shown in FIGS. 24-39. FIG. 24 shows an example optical cavity formed using metallic mirrors and dielectric semiconductor cavity comprising aluminum nitride. Normal incidence reflectance from a metal-dielectric-metal optical cavity wherein the front metal I semitransparent aluminum of thickness 15 nm and the rear high reflector is thick aluminum of 100 nm. The curves show the effect of varying the dielectric cavity thickness L_cav=m*λ/(2*n), where the operating wavelength λ is selected as 240 nm and the refractive index n is selected for Aluminum Nitride (AlN) at 240 nm, and m=1, ..., 7. The reflectance minima 2405, 2410, 2415, 2420, 2425, 2430 are used to tune the emission wavelength of the device when the dielectric cavity contains an optical emissive region. For deep ultraviolet wavelengths operating between 200 nm to 300 nm, the reflectors are preferably selected from Aluminum metal thereby reducing the penetration depth of light.

Figure 25:
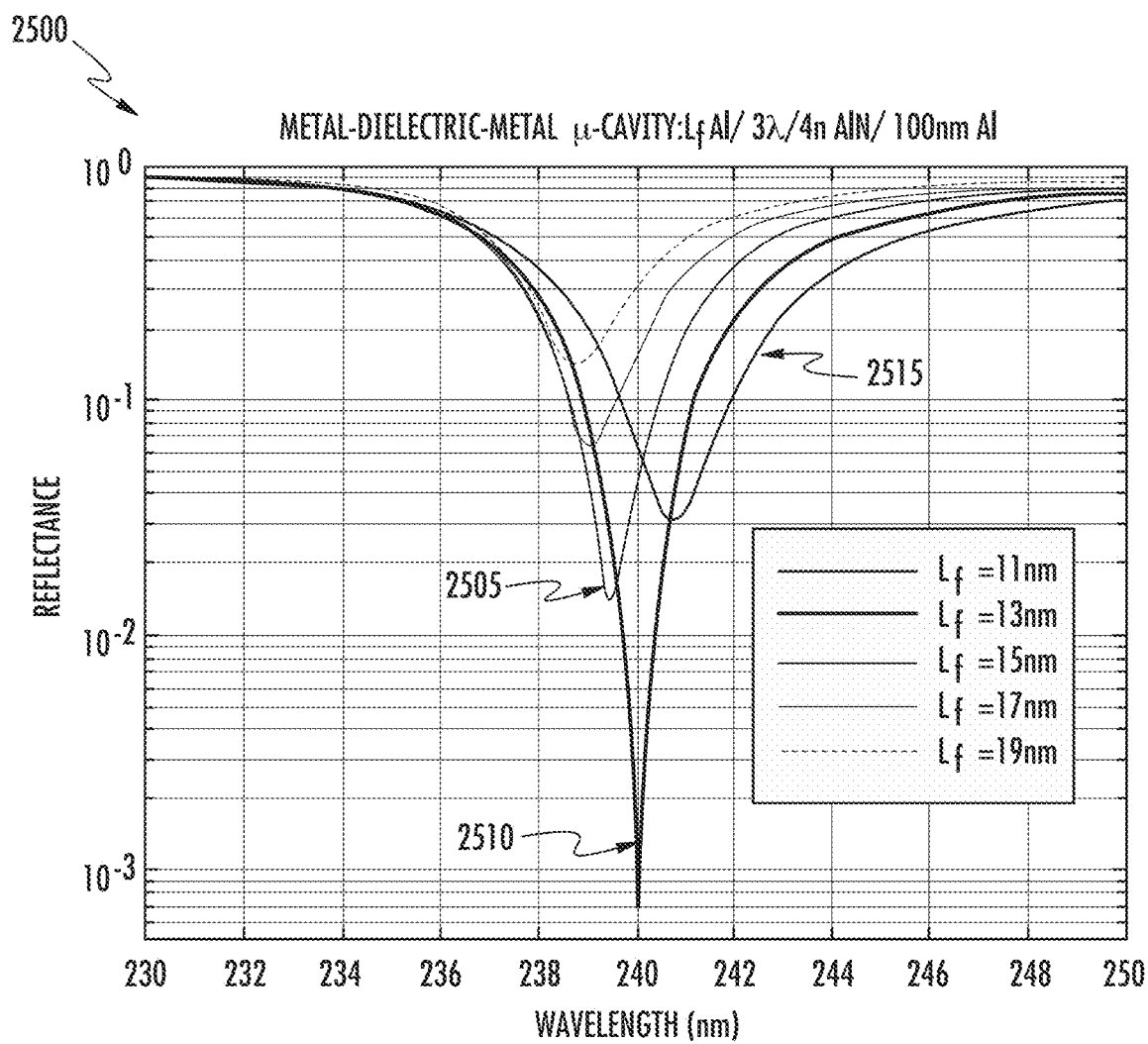
FIG. 25 is a graph of a reflectance spectrum demonstrating optimization of an optical cavity length.

FIG. 25 is an example optical cavity formed using metallic mirrors and dielectric semiconductor cavity comprising aluminum nitride. The normal incidence reflection spectrum 2500 is for a semitransparent aluminum/AlN dielectric cavity/highly reflecting aluminum reflector forming a vertical optical cavity, for L_cav=m*λ/(2*n), where m=3 and λ=240 nm. The thickness of the semitransparent aluminum output coupling mirror is optimized as indicated by curve 2510 for a thickness of 13 nm. Disadvantageous detuning of the optical resonance of the cavity occurs for 2 nm variation 2505 (L=15 nm) and 2515 (L=11 nm) from the optimal thickness of 13 nm.

Figure 26:
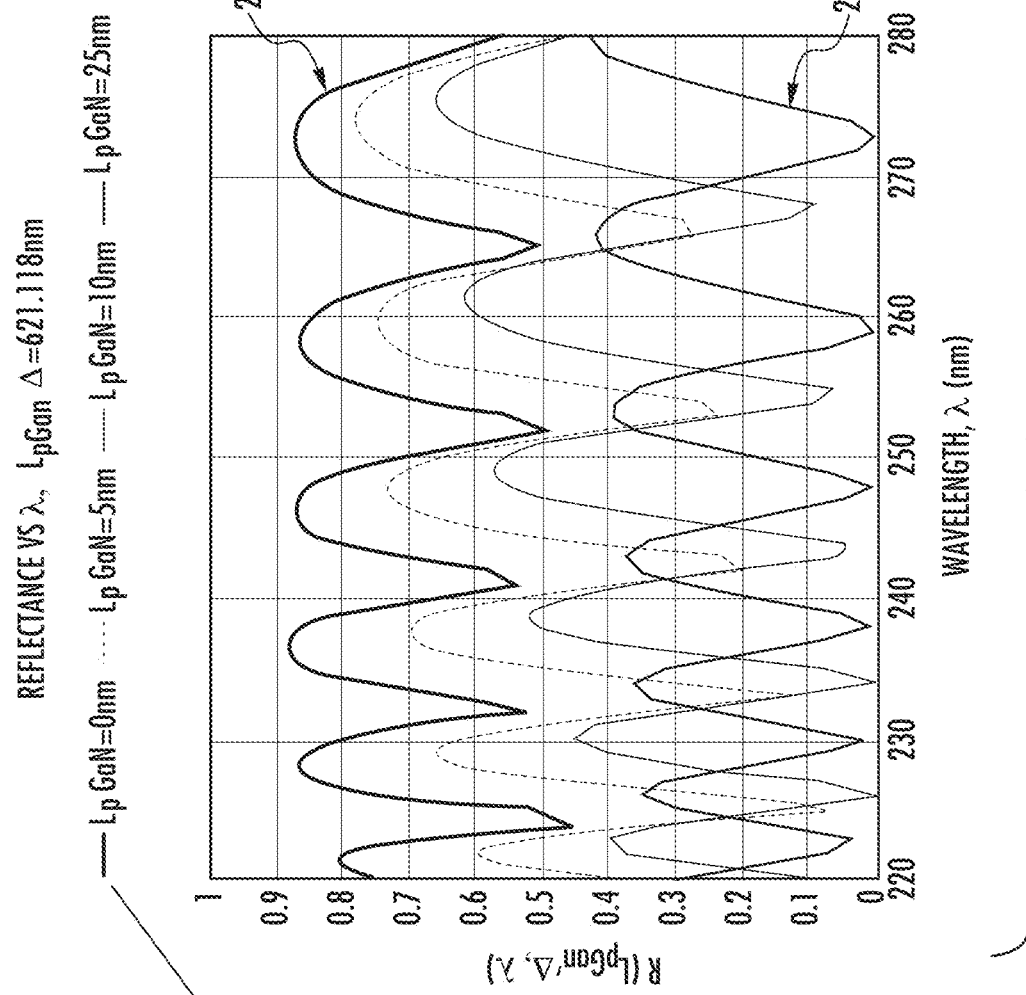
FIG. 26 shows sample values for layers of the device of FIG. 16.
Figure 27:
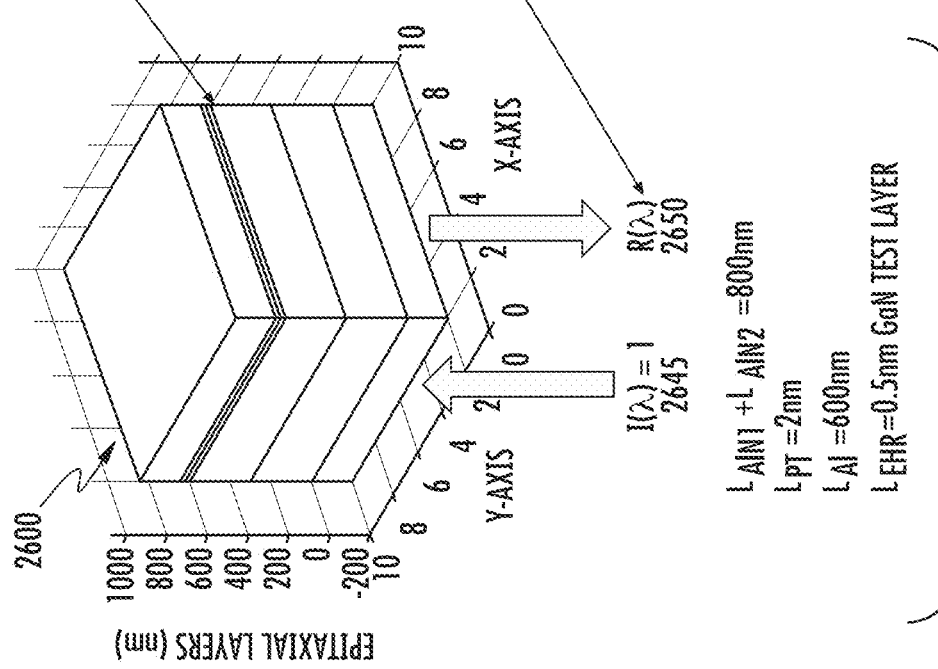
FIG. 27 is a reflectance spectrum for the device of FIG. 26.

FIG. 26 is an example optical cavity 2600 using the device of FIG. 16A, where the spacer layers 1602 and 1604 have a total length of 800 nm (i.e. the sum of the spacer layers 1602 and 1604 is 800 nm), the work function metal 1606 is platinum and has a length of 2 nm, aluminum reflector 1607 has a length of 600 nm, and GaN test layer EHR 1603 is 0.5 nm thick. Arrow 2645 indicates an incident white spectrum on the sapphire substrate, which results in a reflected spectrum 2650. The reflectance spectrum of the optical device of FIG. 26 is shown in FIG. 27. The effect of the thickness of the p-type GaN layer 1605 (L_pGaN) as a function of wavelength is shown in the curves 2715 and 2710 of FIG. 27 for the case of L_pGaN=0 nm and 25 nm, respectively. The pGaN absorber reduces the coupling of Al to the cavity. The profound absorption of the parasitic absorption of the pGaN layers alters the optical cavity as shown. High absorption of pGaN effectively reduces the influence of the rear aluminum high reflector and thus inhibits cavity operation.

Figure 28:
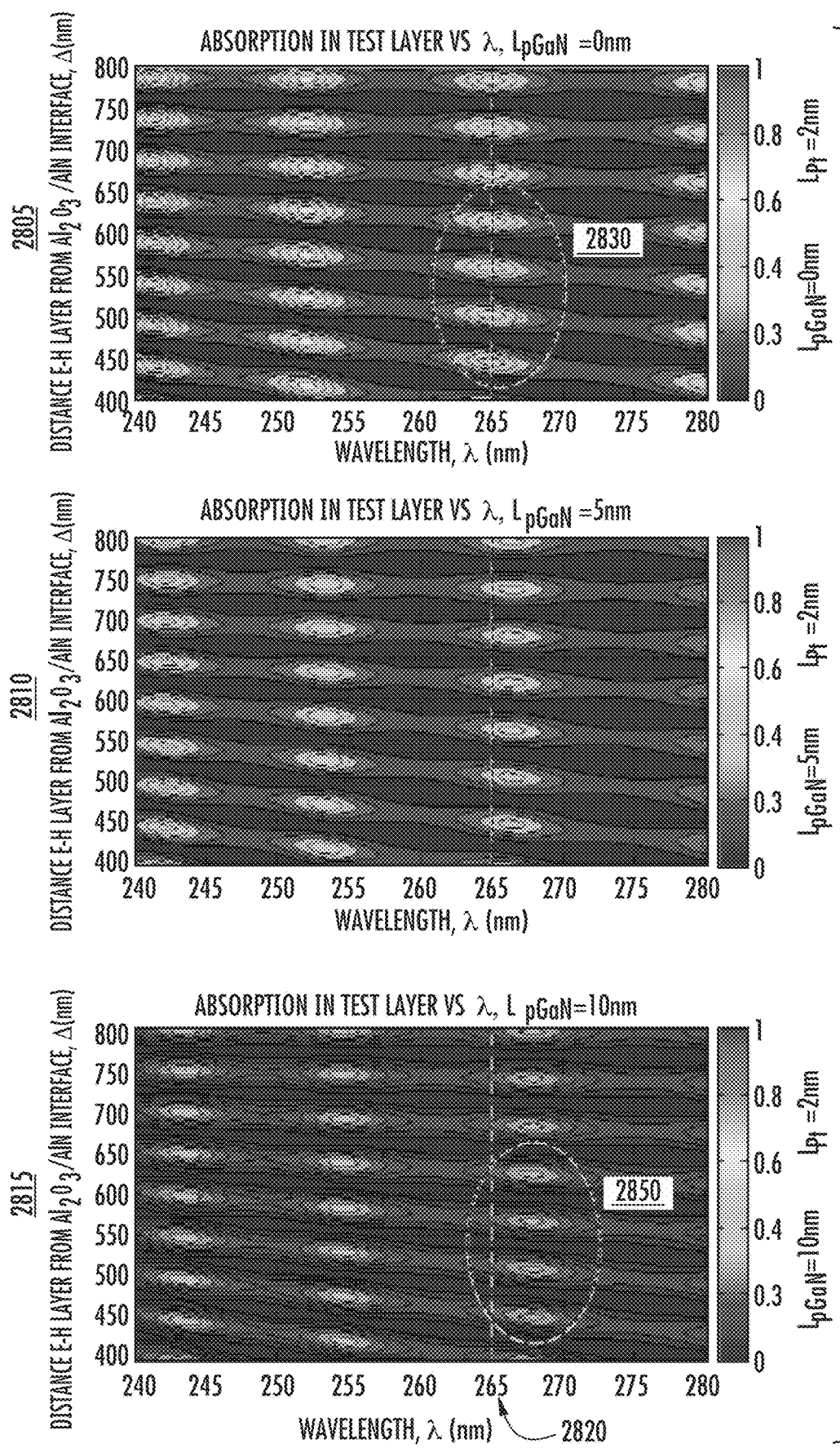
FIG. 28 shows vertical optical modes for the cavities of FIGS. 24 and 25.

In FIG. 28, the vertical optical modes within the cavity of FIGS. 24 and 25 are shown for three cases of p-type gallium nitride thickness. The plots of 2805, 2810 and 2815 describe spatial-spectral absorption as a function of position of the EHR region 1603 (FIG. 16A) within the dielectric cavity relative to the sapphire substrate surface. The three plots 2805, 2810 and 2815 are for the same device structure but varying pGaN thickness and fixed high work function layer thickness=2 nm. The absorption in the EHR region is seen to decrease as the parasitic absorption of the pGaN layer increases due to increasing L(pGaN)=0, 5 and 10 nm. That is, the pGaN absorption reduces the effect of the Al high reflector and reduces the optical mode strength within the cavity. Comparing regions 2830 and 2850 shows that the pGaN absorption not only reduces the absorption of the EHR when resonant with the cavity modes but also redshifts the cavity modes slightly. Therefore, if the device is designed to emit at wavelength 265 nm (2820) for the case of L(pGaN)=0, then increasing the L(pGaN)=10 nm will result in an apparent shift in emission wavelength >26 5 nm. Clearly, for a given EHR position 1630, the resonant modes of high absorption at specific wavelengths for light incident from the transparent sapphire substrate are observed. The introduction of a thin absorbing region of GaN is shown to modify the strength and wavelength position of the resonance. Therefore, the EHR is preferentially selected to be positioned at positions of high absorption for a given operating design wavelength. For example, the optical modes 2830 in configuration map 2805 are advantageous positions for the EHR within the cavity to operate at wavelength 2820.

Figure 29:
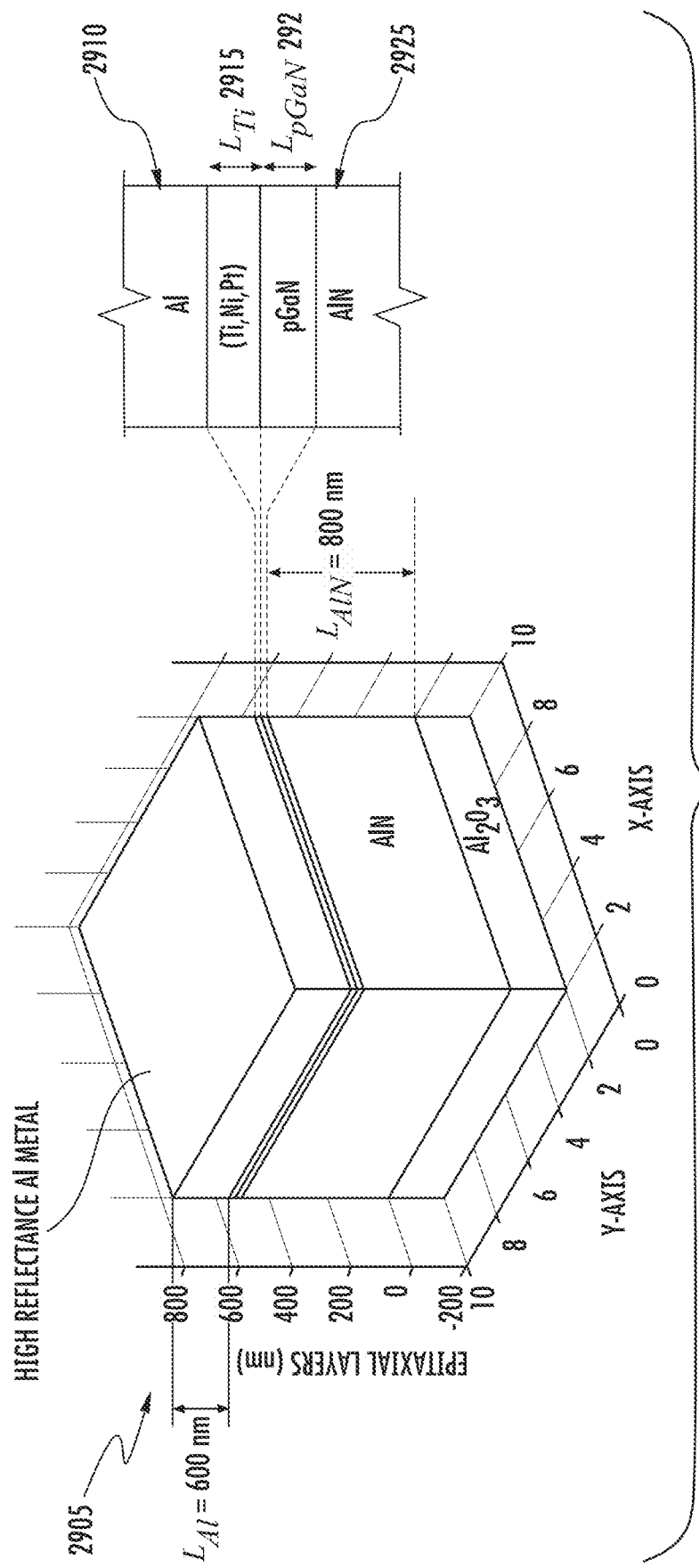
FIG. 29 shows an example reflector structure for an optical device of the present disclosure.
Figure 30:
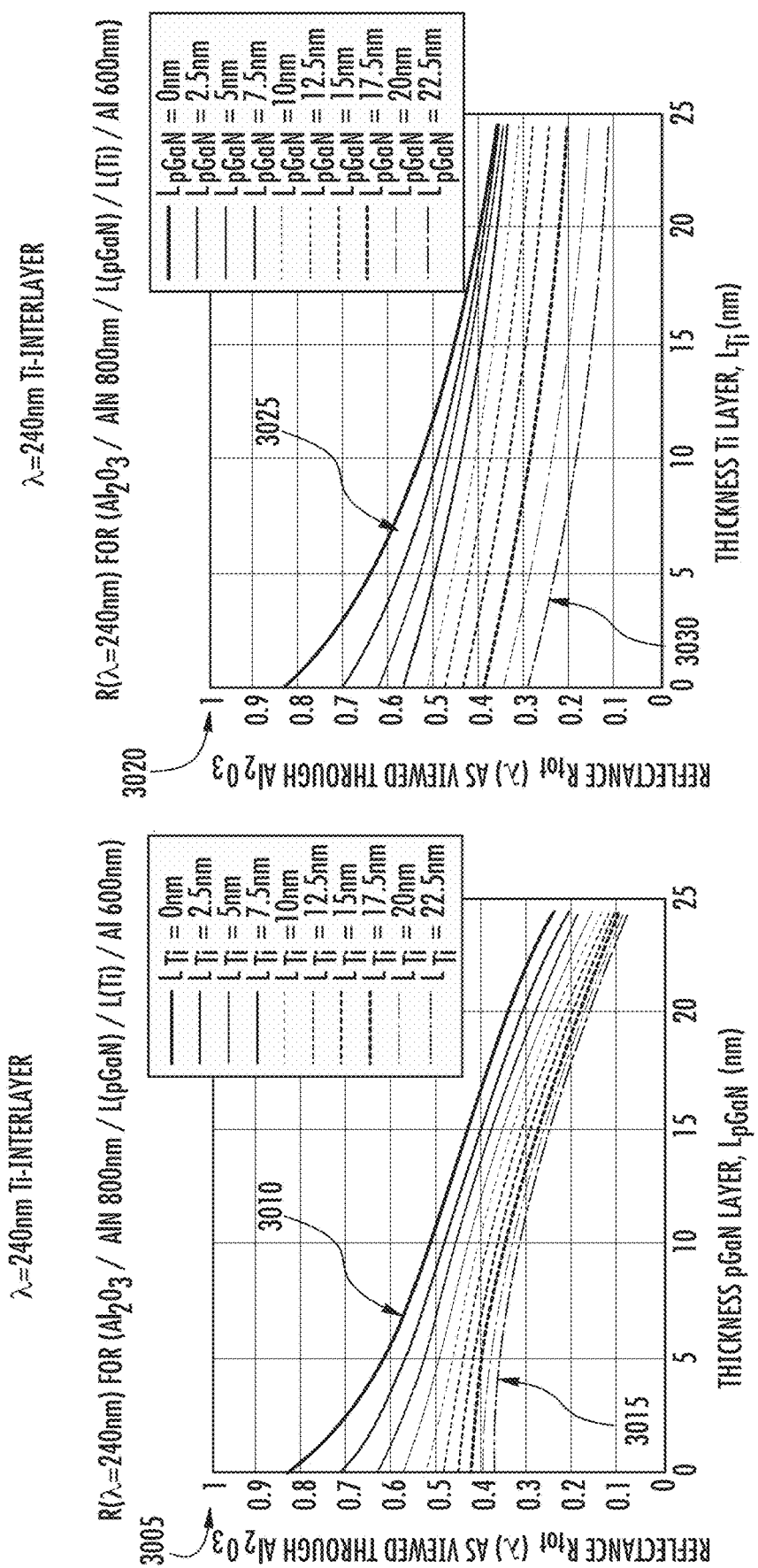
FIGS. 30A-30B demonstrate optimization of a titanium ohmic interlayer.

FIG. 29 is an example reflector structure for an optical device 2905 comprising an Aluminum Nitride dielectric cavity. The p-type contact stack comprises AlN-based dielectric cavity 2925, a p-type dielectric/semiconductor 2920 of thickness L_pGaN, an ohmic metal layer 2915 that is partially absorbing at the operating wavelength, and an aluminum high reflector 2910. For example, the thickness of AlN-based cavity is L_ALN=800 nm. The configuration of FIG. 29 may alternatively be an AlGaN, GaN, or SL(AlN/GaN) cavity instead of AlN.

FIGS. 30A and 30B show the effect of the optical reflectance at a design wavelength of 240 nm as observed through the sapphire substrate of the device in FIG. 26. FIG. 30A shows the reflectance 3005 as a function of pGaN thickness (L_pGaN) for the cases of various titanium ohmic metal thickness. The ideal case 3010 is shown and the least preferred case is 3015. FIG. 30B shows the reflectance 3020 vs. titanium ohmic metal thickness (L_Ti), with the best case curve 3025 and least preferred 3030. The calculation shows the optimization process for device operation for a given p-type GaN and ohmic metal configuration. Therefore, the necessary use of advantageously ohmic electrical contact materials, such as 2915, 2920 of FIG. 29 but having disadvantageously optical absorption property can be optimized by minimizing the thickness of the materials between the highly reflecting Al mirror 2910 and the dielectric cavity and preserve the optical cavity effect of the present disclosure.

FIG. 31 is a schematic representation of optical cavities that are possible using dielectric mirrors (device 3105) or metal-dielectric-metal (device 3150). The dielectric mirrors of device type 3105 comprise quarter wavelength thicknesses of at least two dissimilar materials 3110 and 3115 of sufficient number of periods to create the desired reflectance at an operating wavelength. The dielectric cavity 3120 of thickness 3130 and the EHR 3125 are shown. The emission spectrum of the EHR is matched to the optical modes of the cavity (example as shown in FIG. 28). Device 3150 is metal-dielectric-metal optical cavity including the high reflector metal 3155 and dielectric cavity 3160. Dielectric cavity 3160 includes an EHR 3125 that also acts as the light emission region and may also provide an emission gain spectrum as shown in graph 3140. The partially reflecting/transmitting thin film metal output coupler 3165 completes the optical cavity device 3150. Graph 3140 represents the longitudinal optical modes created by the mirrors and cavity material, whereas the gain spectrum is the emission profile of EHR 3125. Overlap of the gain spectrum with an allowed optical mode enables light generated from within the cavity to escape the devices as on optical beam 3145.

Figure 32:
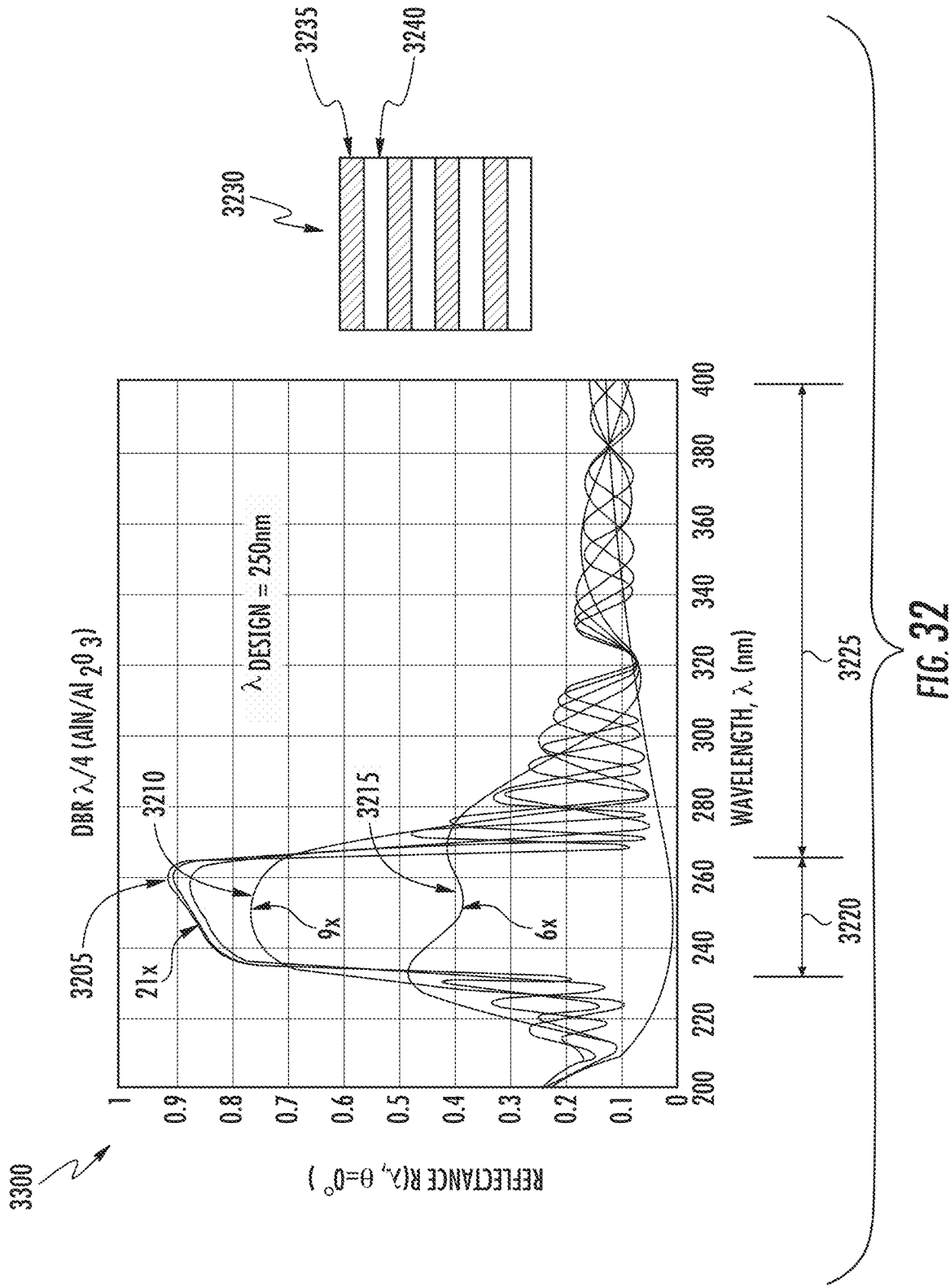
FIG. 32 shows a reflectance spectrum for an embodiment of dielectric reflectors with bilayers of aluminum nitride and aluminum oxide.

FIG. 32 shows a reflectance spectrum 3200 for example dielectric reflectors 3230 comprising quarter wavelength bilayers of aluminum nitride (AlN) 3235 and aluminum oxide ($Al_2O_3$) 3240. The reflectance spectrum 3200 within a desired wavelength band 3220 is shown for various dielectric mirrors of 21-periods 3205, 9-periods 3210 and 6-periods 3215. These dielectric mirrors can be used to form optical cavity devices of the type 3105 of FIG. 31. The penetration depth 3170 of wavelengths (FIG. 31) is much deeper than an equivalent metal-dielectric device. Region 3225 represents an out of band portion of the spectrum that does not produce advantageous reflectance increase. The region of wavelength band 3220 represents the in-band reflectance spectrum that is desired for increased reflectance.

Figure 33:
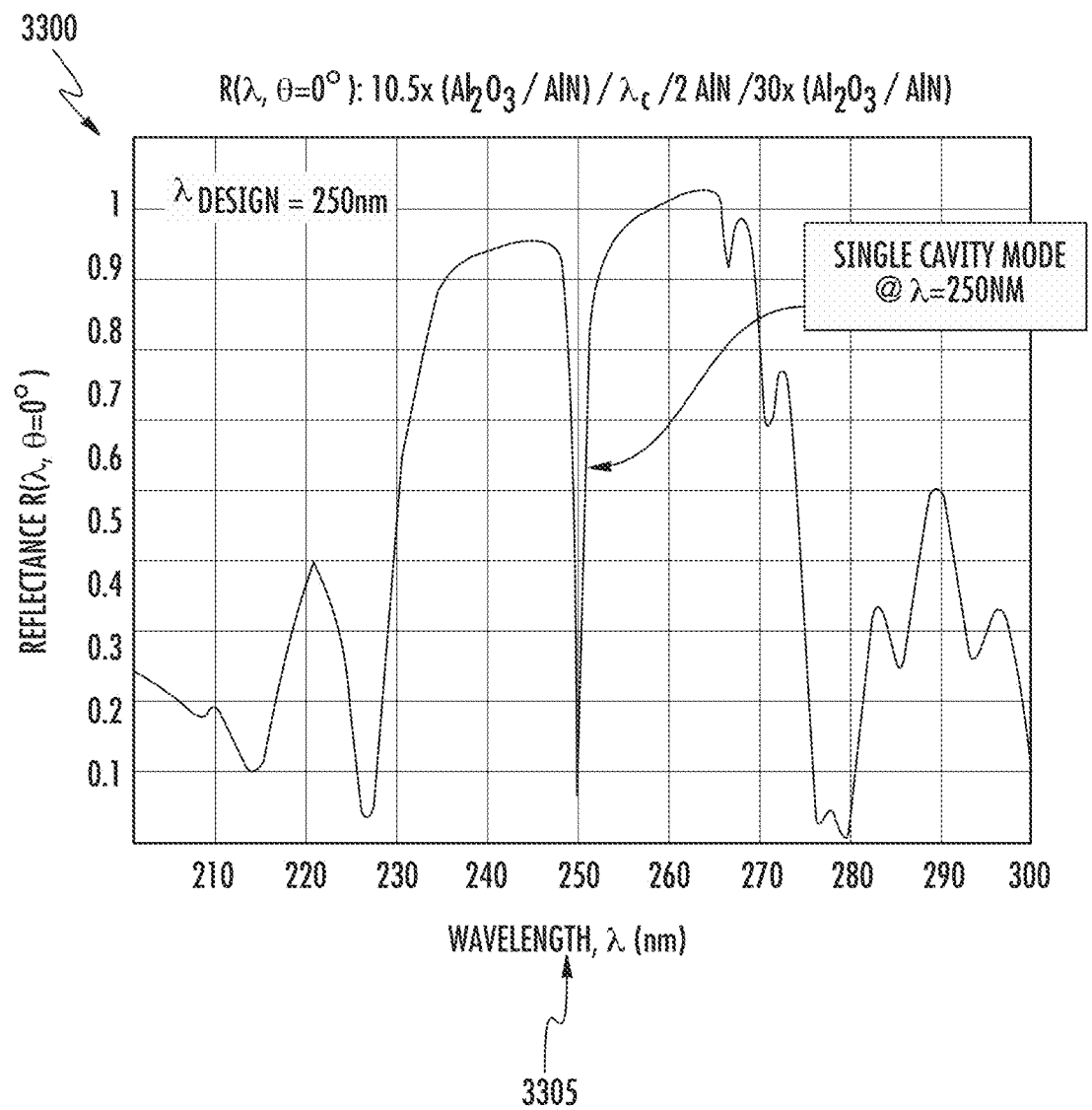
FIG. 33 shows a reflectance spectrum for an embodiment of a dielectric-semiconductor mirror.

FIG. 33 shows the reflectance spectrum of an example dielectric-semiconductor mirror that can be used to form an optical cavity of the present disclosure. The optical cavity comprises AlN, and the high reflector comprises a 30-period $Al_2O_3$/AlN quarter wavelength stack and a 10.5-period output coupler for a design wavelength. In the reflectance spectrum 3300, the optical cavity mode 3305 is shown at 250 nm.

Figure 34:
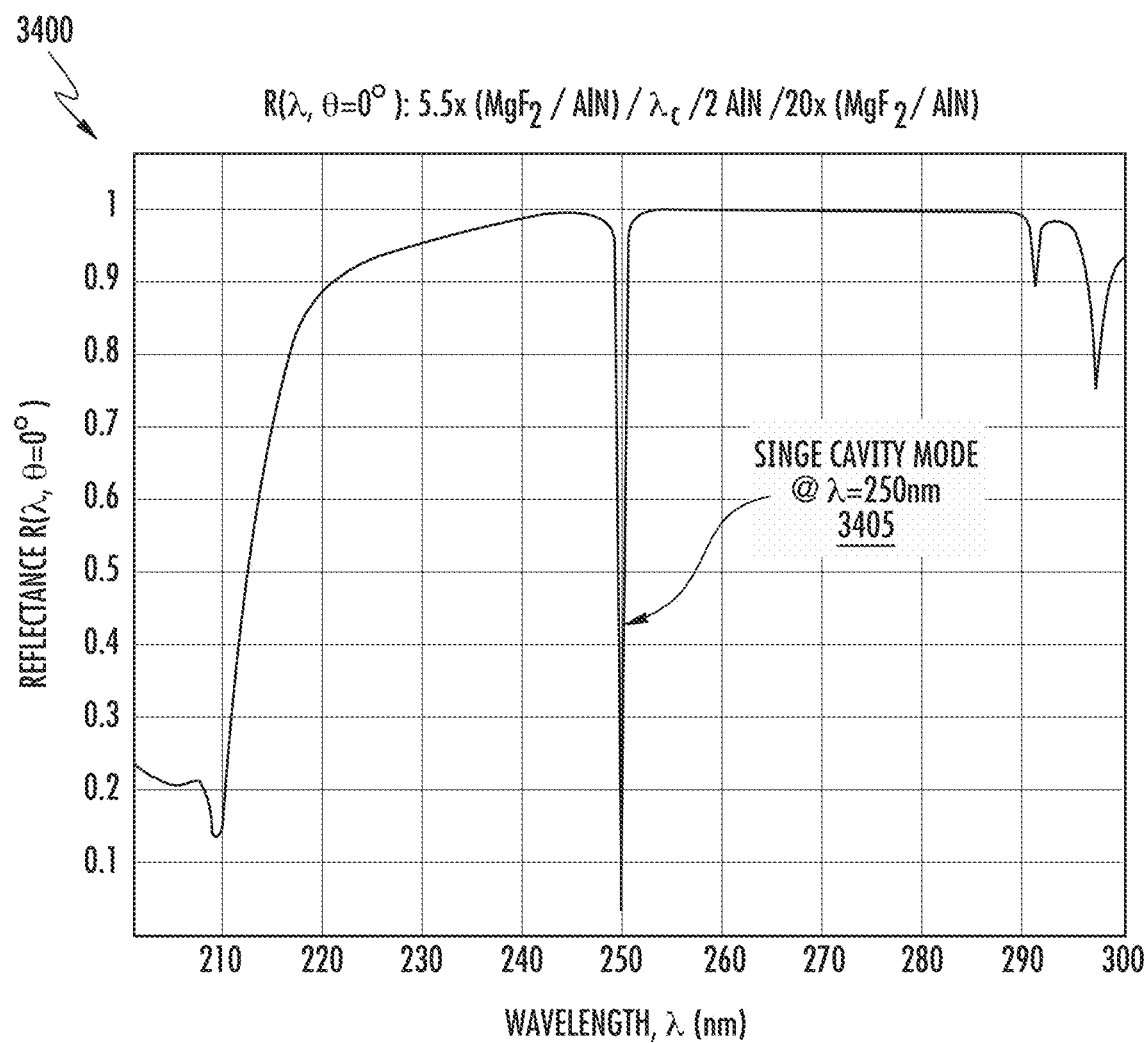
FIG. 34 shows a reflectance spectrum for another embodiment of a dielectric-semiconductor mirror.

FIG. 34 shows the reflectance spectrum of another example dielectric-semiconductor mirror that can be used to form an optical cavity of the present disclosure. The optical cavity comprises AlN, and the high reflector comprises a 20-period MgF$_2$/AlN quarter wavelength stack and a 5.5-period output coupler for a design wavelength. In the reflectance curve 3400, the optical cavity mode 3405 is shown at 250 nm. The large refractive index difference between magnesium fluoride (MgF$_2$) and aluminum nitride (AlN) provides superior optical cavity mode 3405 compared to 3305.

Figure 35:
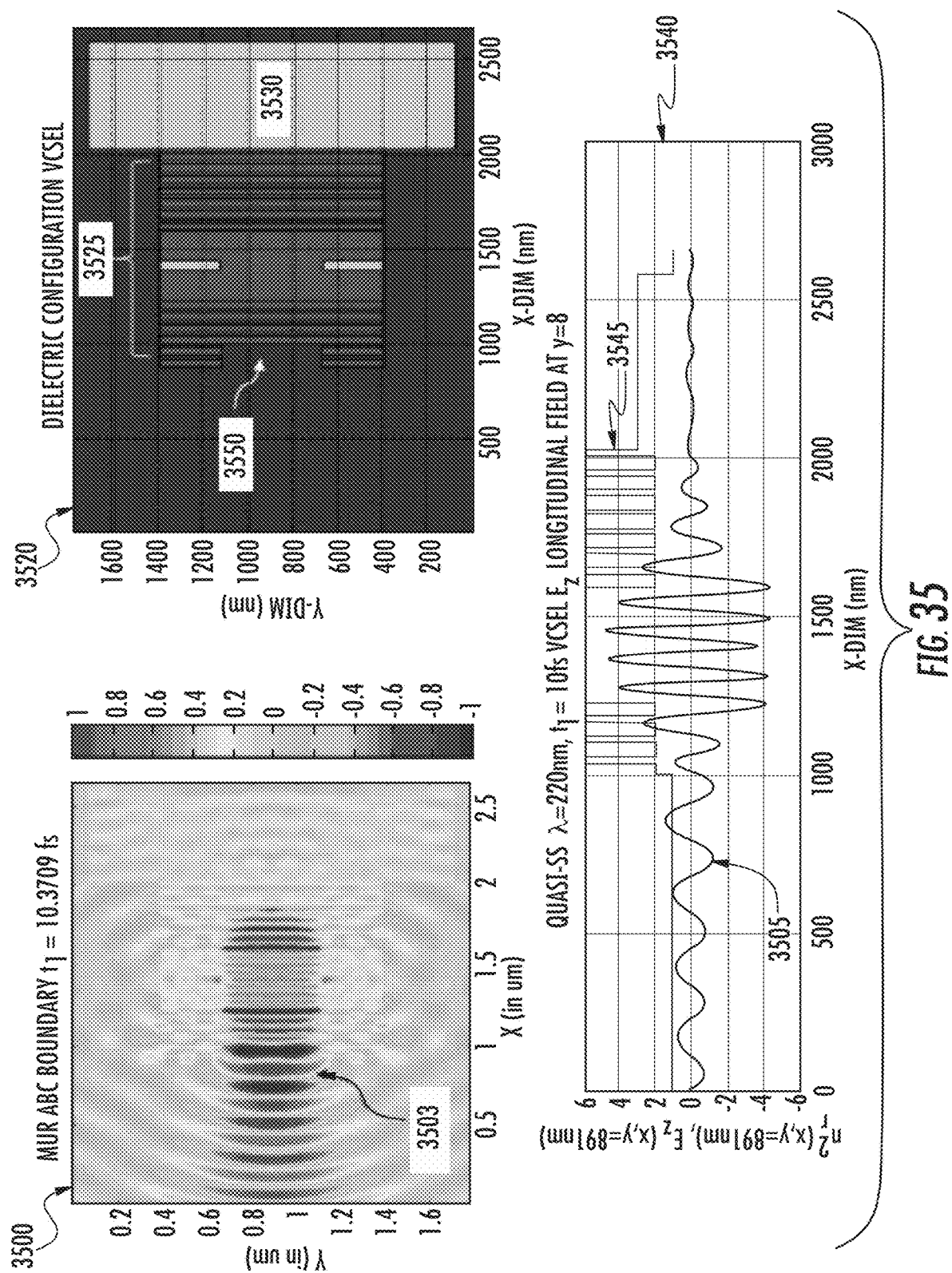
FIG. 35 provides a view of an optical cavity device with an etched region in the output coupling mirror, along with a corresponding simulation map and electric field graph.

FIG. 35 is an example vertically emitting optical cavity device 3520 comprising a substrate 3530 and optical cavity 3525. Optical cavity 3525 includes Al$_2$O$_3$/AlN mirrors, an AlN cavity with Al$_2$O$_3$ apertures to control the transverse optical mode and an etched region 3550 in the output coupling mirror. The device structure 3520 is simulated with an EHR position within the middle of the AlN cavity, and the FDTD results are shown in simulation map 3500 and electric field graph 3540. The optical emission beam 3503 shows the out coupled wavelength. The on-axis electric field intensity 3505 is plotted in graph 3540 showing the penetration depth into the dielectric mirrors. The refractive index variation 3545 shows the high and low refractive indices used for the optical cavity.

Figure 36B:
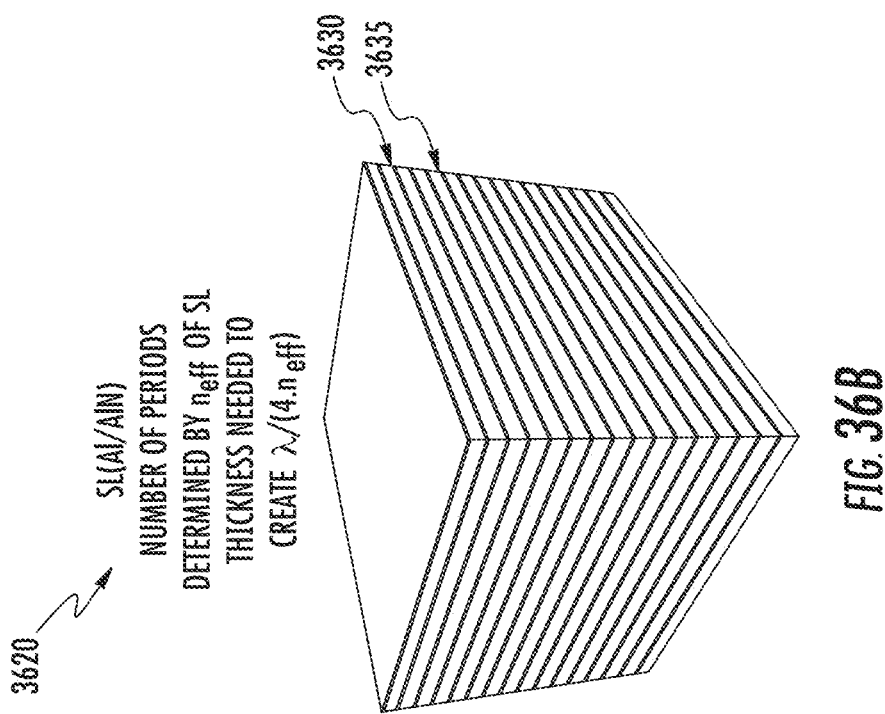
FIGS. 36A-36B show a refractive index graph and a layer stack for an embodiment of a superlattice mirror structure.
Figure 36A:
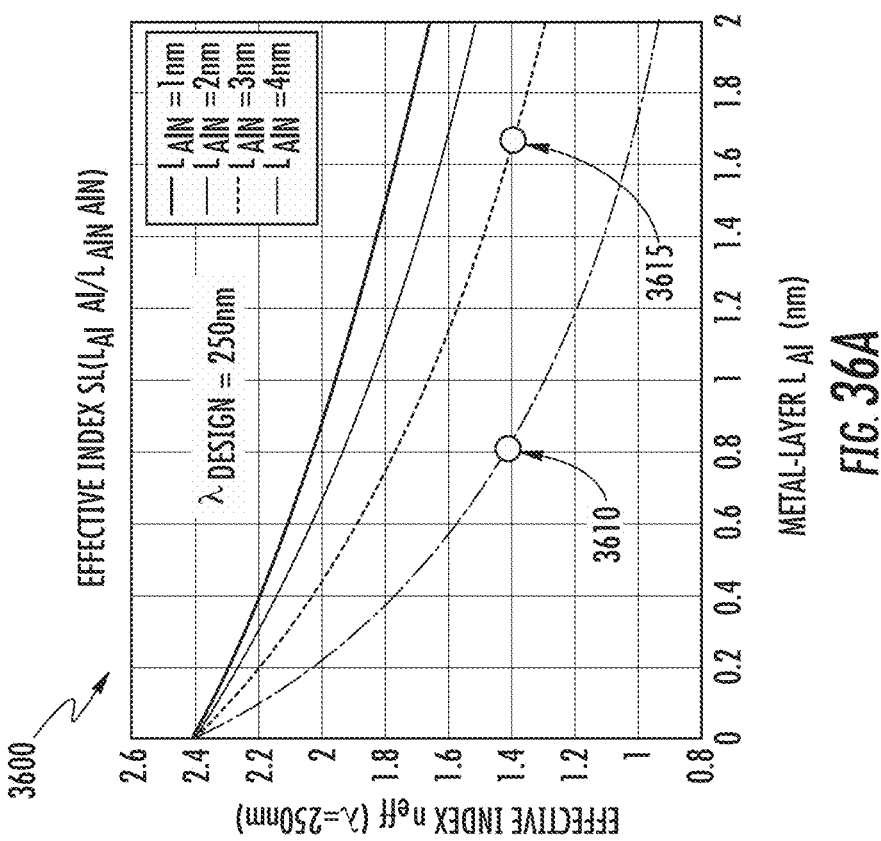

FIGS. 36A-36B show yet a further example of a deep ultraviolet mirror formed using a metalo-semiconductor combination 3620 of thin nanostructured aluminum metal layers and dielectric layers. Each thin aluminum metal layer is sandwiched between wide bandgap energy aluminum nitride semiconductor/dielectric. The effective refractive index n_eff of the bi-layered slab is designed by selecting the thicknesses of the aluminum layer 3630 (L_Al) and the AlN layer 3635 (L_AlN), as shown in FIG. 36B. For operating wavelength of λ=250 nm as shown in graph 3600 of FIG. 36A, the bilayer pairs comprise the unit cell of the periodic metalo-dielectric slab (L_Al, L_AlN)=(0.8 nm, 1 nm) 3610 and (1.6 5 nm, 2 nm) 3615 resulting in n_eff=1.4. Selecting the total number of periods for a given (L_Al, L_AlN) pair to equal an optical thickness of λ/(4*n_eff) enables utility as a reflective material operating in the deep UV range. Furthermore, using the metalo-dielectric slab functioning as a quarter wavelength layer further comprising a distributed Bragg reflector (DBR) can be used advantageously to create a highly reflecting medium suitable for an optical cavity. That is, the metalo-dielectric periodic thin film layers comprise a superlattice SL[Al/AlN] forming one type of effective index material of the DBR. An example of a DBR suitable for optical cavity herein is formed comprising at least two different two materials types M1 and M2, wherein M1 and M2 are both quarter wavelength thickness materials of refractive indices n_M1 and n_M2, where ΔM=M2−M2, and further comprising a number P of periodic repetition stack of [M1/M2]_1, [M1/M2]_2, . . . , [M1/M2]_P and the M1 comprises the disclosed SL[Al/AlN] slab which is of total thickness equal to one quarter wavelength and M2 is selected from a quarter wavelength thick layer of bulk AlN. An advantage of such a metalo-dielectric DBR is the large change in refractive index Δn between M1 and M2 and thus a small number of periods P is required to achieve high reflectivity in the deep UV range. This DBR type is particularly advantageous during in-situ deposition of AlN-based optoelectronic devices, such as LEDs and vertically emitting lasers of the type 3105 (refer FIG. 31). The metalo-dielectric DBR superlattice (e.g., a superlattice of Al and AlN layers) corresponding to the graph and device of FIGS. 36A-36B can be used as either a high reflector or partial reflector in the embodiments described throughout this disclosure.

Figure 37A:
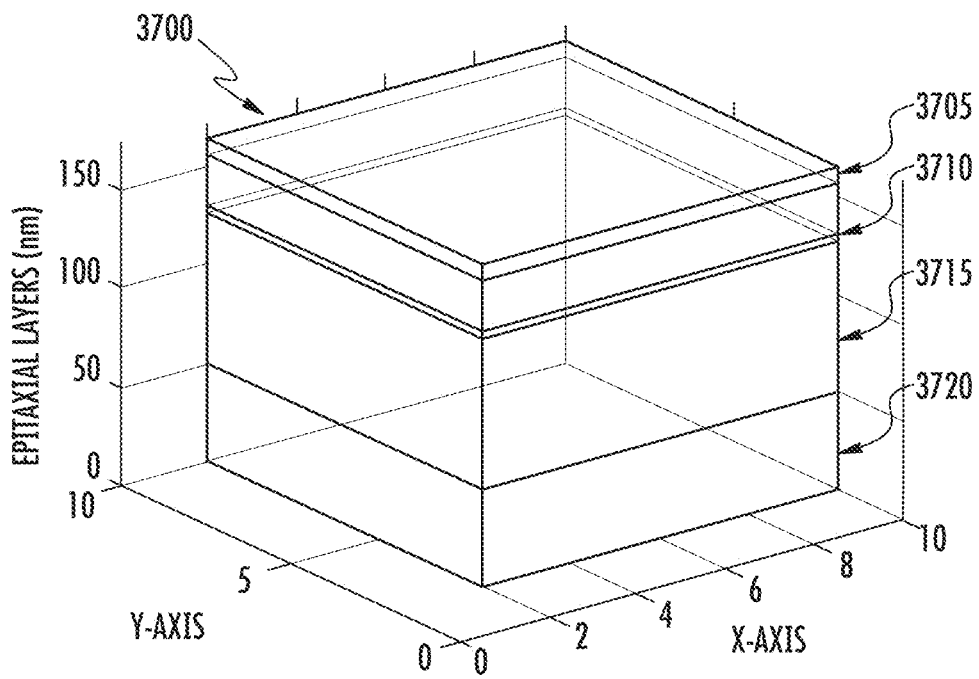
FIGS. 37A-37B illustrate yet another embodiment of an optical cavity device, and a corresponding exciton absorption coefficient spectrum.
Figure 37B:
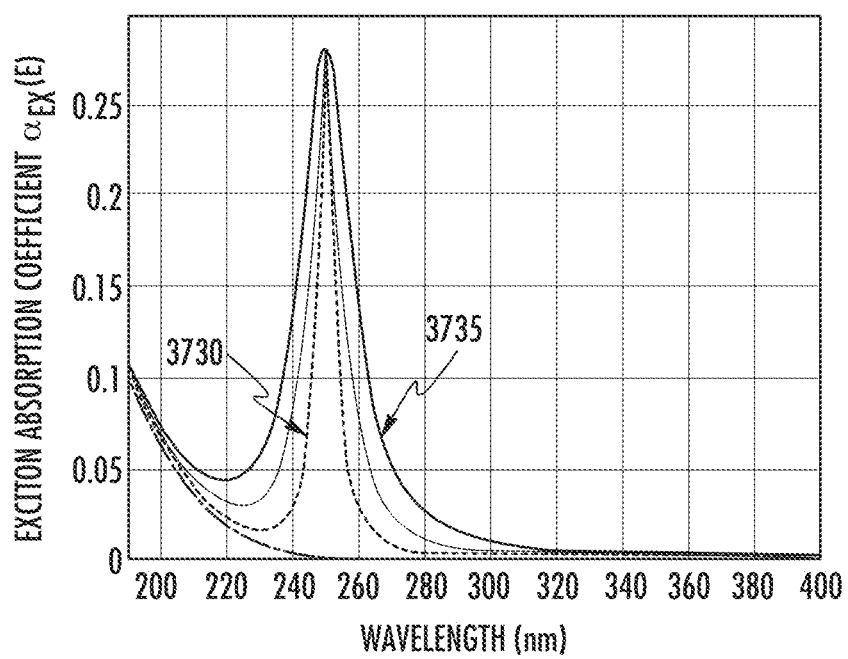

FIGS. 37A-37B show an example optical cavity 3700 operating in the deep UV range of the type 3150 (FIG. 31). The highly reflecting aluminum rear reflector 3705 sandwiches an AlN-based dielectric cavity 3715 by a low refractive index transparent substrate 3720. The effective output coupler is the formed by the step index between the refractive indices of the dielectric 3715 and substrate 3720. An optional buried semitransparent reflector can be positioned between the dielectric and the substrate. A nanostructured emissive/absorption region 3710 is positioned a distance from the high reflector 3705 within the AlN-based dielectric cavity. The region 3710 can be a quantum well or superlattice material comprising aluminum gallium nitride (AlGaN) designed to achieve an optical emission/absorption spectrum as shown in FIG. 37B. For example, a layered structure of materials AlN/GaN/AlN forming a quantum well or superlattice SL[AlN/GaN] can be used for region 3710. The spectral width of the predetermined spectrum 3730 and 3735 and the peak position with respect to wavelength are controlled by selecting the material thickness and composition in the angstrom to nanometer regime forming quantum confined states, such as excitons. The insertion of the nonlinear optical region 3710 acts as the EHR region. The EHR spectrum influences the optical cavity formed by the dielectric 3715 between substrate 3720 and reflector 3705.

In some embodiments, the thickness $L_{SEP}$ of the second spacer region can be less than 100 nm; that is, the light emitting region can be positioned at a separation distance from the reflector from $0 < L_{SEP} \leq 100$ nm. For a second spacer region having a high refractive index material and operating at a deep UV wavelength (e.g., 200-280 nm), these aspects will limit the possible thicknesses of the second spacer region. For example, for a second spacer region of AlN, the refractive index n of AlN is n=2.4 at a target wavelength of λ=250 nm. Consequently, the high refractive index of the second spacer region can support a larger number of optical wavelength periods thereby effectively making the optical length larger than for example a half cycle of operating wavelength. Conversely, in some embodiments the second spacer region includes a p-type or hole source layer. In general, holes have lower mobility than electrons and the transport length of holes can be extremely short in defective crystalline material or large bandgap compositions. To efficiently inject holes into the active region it is advantageous to position the hole source layer relatively close to the active layer. The structure of the second spacer layer therefore can be constructed with a small separation distance (e.g., $0 < L_{SEP} \leq 100$ nm) so that the optical properties of the cavity and the electronic transport property of the materials are optimized.

Figure 38:
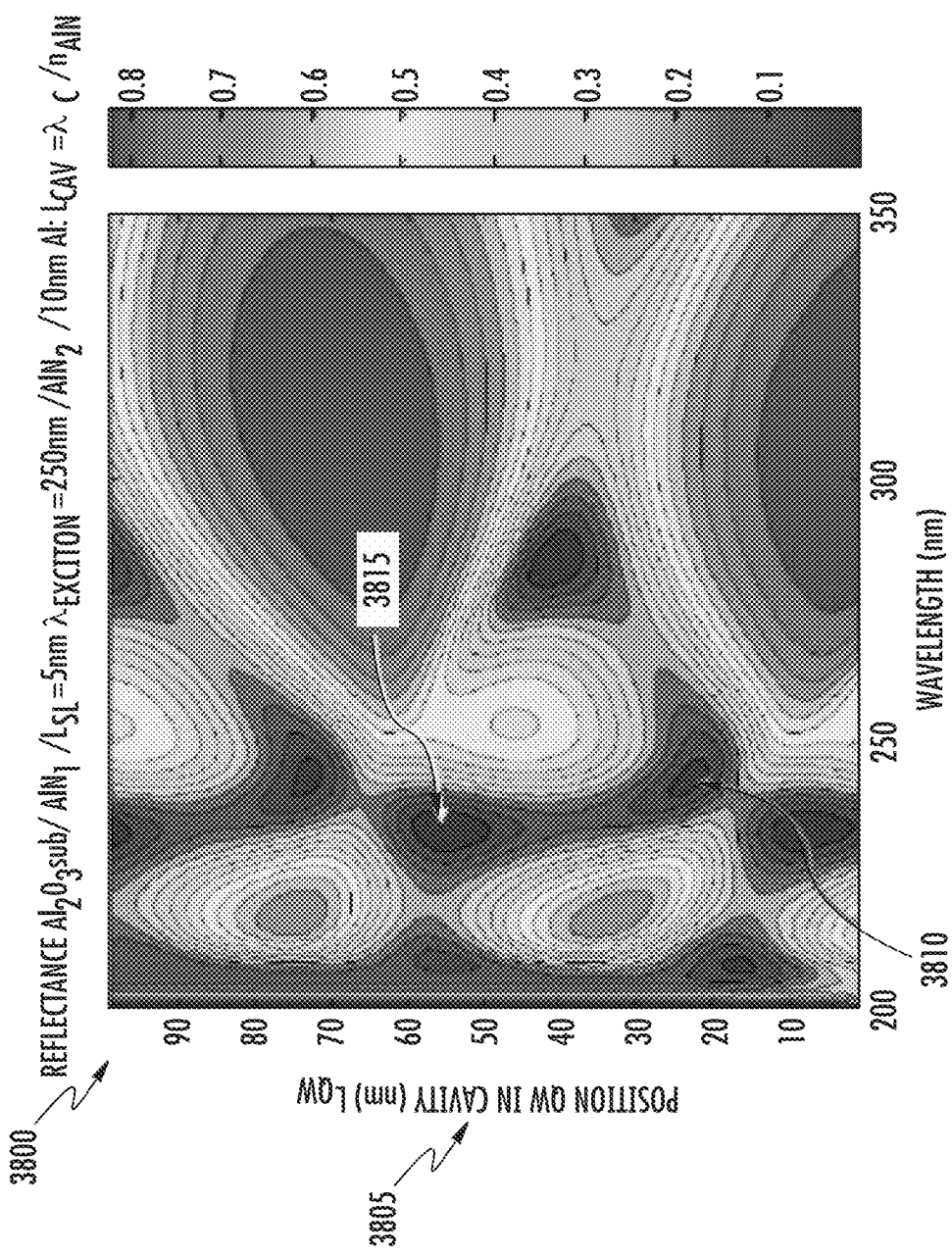
FIG. 38 is a reflectance map corresponding to the device of FIG. 37A.
Figure 39:
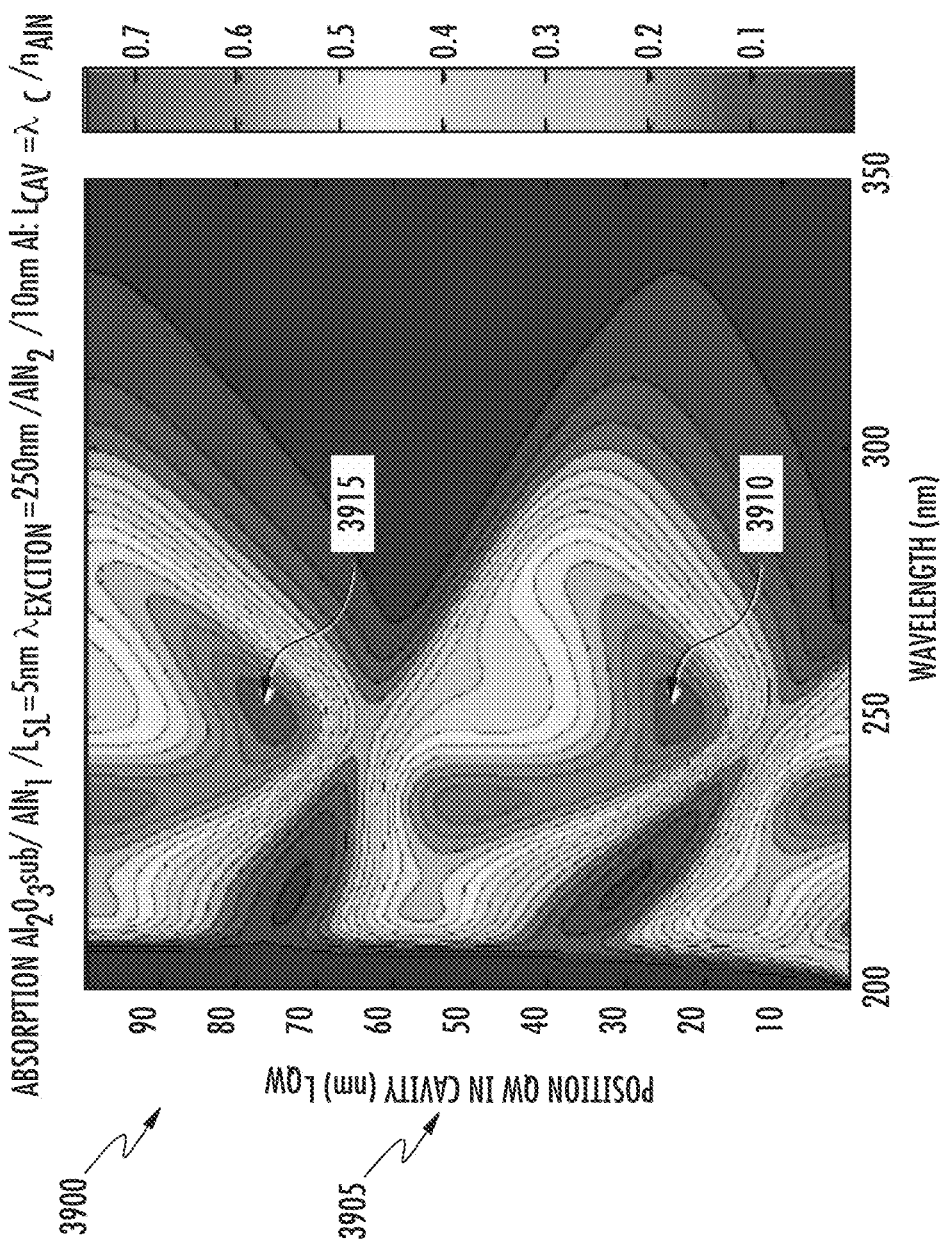
FIG. 39 is an absorption map corresponding to the device of FIG. 37A.

FIGS. 38 and 39 show the operation of examples devices with $0 < L_{SEP} \leq 100$ nm. In FIG. 38, the operation of the optical cavity described in FIG. 37A is shown by the reflectance map 3800 as viewed through the transparent sapphire substrate 3720. The position 3805 of the EHR region 3710 dramatically influences the operation of the device. For a given operating wavelength, for example, 240 nm or 250 nm, the maxima and minima can be selected advantageously by positioning the EHR within the AlN-based optical cavity, as shown. For example, the incident white spectrum indicated by arrow 2645 on the sapphire substrate results in a reflected spectrum 2650 (FIG. 26) as shown in the reflectance map 3800. The reflectance as viewed through the sapphire is influenced by the optical cavity effect as described herein. A high absorption within the EHR region 3710 is achieved by positioning the region 3710 at an optical cavity mode selected by 3805 and results in a reflectance minimum, for example 3810 and 3815. The reciprocal process is also understood wherein the EHR is an optically emissive region and the goal is to extract maximum light out through the sapphire substrate. Therefore, by designing the optical cavity and placing the EHR region 3710 advantageously at an absorption maximum will result in a high extraction efficiency optical emitter using the optical cavity.

FIG. 39 is an absorption map 3900 within only the EHR (i.e., LER) region 3710 of the device of FIG. 37A, where the EHR region 3710 is scanned vertically through the AlN-based dielectric cavity at a position 3905 relative to the dielectric-substrate interface. Clearly, for an operating wavelength of 250 nm, the absorption maxima, for example, 3910 and 3915, are advantageous positions for the EHR region at approximately 25 nm and 75 nm in this embodiment. Other positions of the EHR region within the AlN-based dielectric cavity will result in poor optical extraction efficiency of light generated from the EHR region at 250 nm.

Figure 40:
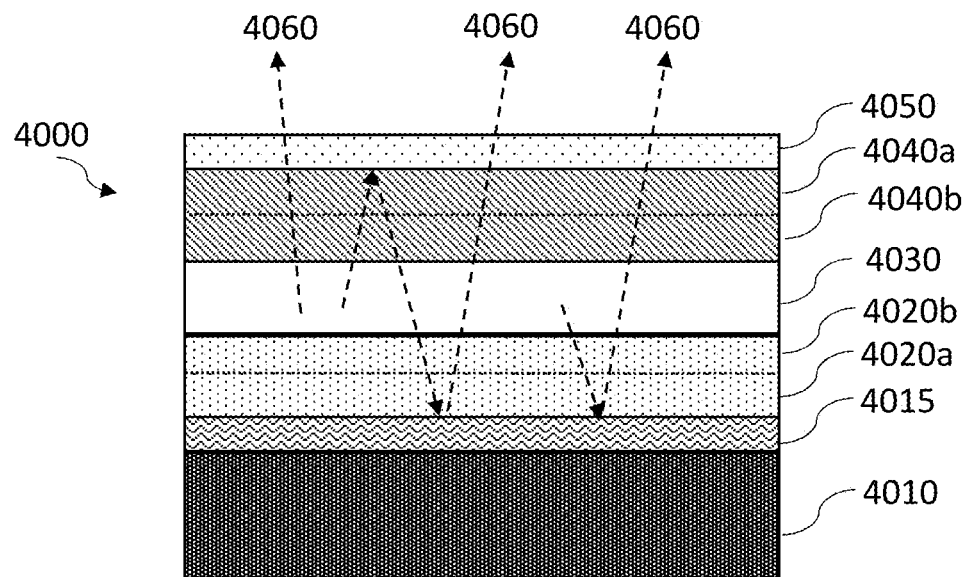
FIG. 40 is a vertical cross-section of a deep ultraviolet resonant optical cavity light emitting device having an opaque substrate, in accordance with some embodiments.

In further embodiments, resonant optical cavity LEDs may have an opaque substrate without an optical aperture, where light is emitted out of the opposite (top) end of the stack rather than through the substrate. FIG. 40 is a vertical cross-sectional view of one such embodiment, where a device 4000 has an opaque substrate 4010, a first reflective layer 4015 on the substrate 4010, a first spacer region 4020a/b coupled to the first reflective layer 4015, a light emitting region 4030 on the first spacer region 4020a/b, a second spacer region 4040a/b on the LER 4030 and a second reflective layer 4050 coupled to the top of the device stack. As indicated by the arrows in FIG. 40, light 4060 emitted from the light emitting region 4030 is output through the second reflective layer 4050, either directly or after being reflected by first reflective layer 4015 and/or second reflective layer 4050.

First reflective layer 4015 is in practice challenging to construct, as layer 4015 must possess three properties simultaneously. Firstly, layer 4015 must exhibit high optical reflectance at the operating emission wavelengths, with reflectance in the range of 70% to 100%, and preferably approaching 90% to 100%. Secondly, if the opaque substrate 4010 is electrically conductive and the device 4000 is a vertically conductive device then layer 4015 must exhibit sufficient electrical conductivity to enable electrical transport between adjacent n-type or p-type conductivity layer 4020a and the underlying conductive and opaque substrate 4010. Thirdly, layer 4015 must exhibit crystal structure commensurate with both that of the substrate 4010 and active layers forming the device 4000. In preference all three properties are sought to be obtained by the materials selected for layer 4015. For the case where layer 4015 comprises a plurality of dissimilar optical refractive index materials—forming, for example, a DBR stack—then all three requirements are sought.

Conventionally, non-absorbing materials are utilized for a DBR which are wider bandgap materials compared to those used within the active region of the device. Wider bandgap materials typically result in disadvantageously lower electrical conductivity compared to lower bandgap materials. This results in resistive losses across layer 4015 for the case of a fully vertical conductive device utilizing an opaque conductive substrate. Materials selection to achieve high optical transparency (low optical loss at the operating wavelength) and sufficient change in refractive index are further constraints to form a DBR. For example, devices operating in the deep UV range limits the material selection. The materials used for the DBR may be similar or of a different crystal type to those of the active region and/or substrate. For the case of a DBR using the same crystal type as the active region and/or substrate, the change in available refractive index is small and thus necessitates the use of many repeating periods to construct a suitable DBR section reflectance. This further increases the thickness of layer 4015 and may also increase the resistive losses. For the case where crystal type layers are used for layer 4015 that are dissimilar from the substrate or active layer crystal type, a further challenge occurs in the ability to form low crystal defect density deposited layers. Crystal defects limit the electrical and optical properties of the materials and subsequent materials deposited upon them.

Therefore, the inclusion of first reflective layer 4015 in the present devices has new challenges compared to conventional devices. In some embodiments, manufacturing methods such as wafer bonding are utilized to overcome these manufacturing issues. For example, wafer bonding can be utilized for the case where the opaque substrate provides good thermal conductivity and electrical conductance. Yet another example utilizes the material properties of opaque substrate 4010 to create the refractive index change between the layer 4015 and the substrate 4010, thus providing improved reflectance. Yet a further example is the use of an epitaxially deposited DBR structure to form layer 4015 on the crystalline and opaque substrate 4010. Subsequent deposition of the active layers or wafer bonding of the active region starting at 4020a to the surface of layer 4015 may be performed.

Opaque substrate 4010 may be, for example, a semiconductor type, such as, Silicon, Germanium, Silicon-Carbide, Gallium-Oxide, Aluminium-Gallium-Oxide, Aluminium-Oxide, Gallium-Nitride, Lithium-Niobate, and GaAs. For example, a p-type GaN (p-GaN) substrate may be utilized for a closer crystal structure match of deposited layers forming the active layers and/or the reflective layer 4010. This enables a vertically conductive device but offers an opaque substrate, such as for a device operating at wavelengths where the p-type GaN substrate is optically absorbing. Other substrate materials such as pure metal can be used such as single crystal Aluminum and the like. First reflective layer 4015 is a DBR that is highly reflective to the target wavelength, such as having a reflectivity of greater than 90% for the target wavelength produced by the active region (LER 4030). The first reflective layer 4015 may comprise, for example, Al, $MgF_2$ or AlN, and may exclude AlGaN materials in some embodiments. A metal-dielectric DBR is also possible, where the use of two dissimilar materials (e.g., "A" and "B") are used for creating two different refractive index layers (e.g., "n_A" and "n_B"), and further used to construct the period stack of the DBR (that is A-B-A-B-... stack). Material A may, for example, be a quarter wavelength of AlN, and material B may comprise a superlattice material itself comprising a periodic stack of ultrathin Aluminium metal and a wide bandgap material (e.g. AlN). The thickness of material B is also selected to be of quarter wave thickness. The DBR formed in this manner enables use of direct epitaxial film formation method and provides the ability to form the layer 4015 in-situ to the device formation process.

First spacer region 4020a/b is non-absorbing to the target wavelength, and at least a portion of the first spacer region 4020a/b comprises a first electrical polarity. In some embodiments, the first spacer region 4020a/b may include two layers, a doped layer 4020a of the first electrical polarity (e.g., n or p conductivity) and an undoped layer 4020b. Similarly, second spacer region 4040a/b is non-absorbing to the target wavelength, and at least a portion of the second spacer region 4040a/b comprises a second electrical polarity opposite of the first electrical polarity. In some embodiments, the second spacer region 4040a/b may include a doped layer 4040a of the second electrical polarity (e.g., p or n conductivity) and an undoped layer 4040b. Second reflective layer 4050 is coupled to the second spacer region 4040a/b. The second reflective layer 4050 is a thin film metal reflector, such as less than 15 nm thick, of a material that is highly reflective for the target wavelength. For example, for deep UV wavelengths, the second reflective layer 4050 may be a metal composition comprising elemental aluminum.

The device 4000 may have resonant optical cavity characteristics as described throughout this disclosure. For example, an optical cavity between the second reflective layer 4050 and first reflective layer 4015 of the resonant optical cavity light emitting device 4000 may include the first spacer region 4020a/b, the second spacer region 4040a/b and the light emitting region 4030. The light emitting region 4030 is positioned at a separation distance from the second reflective layer 4050. The optical cavity has a total thickness less than or equal to K·λ/n. K is a constant ranging from 0.25 to 10, where λ is the target wavelength and n is an effective refractive index of the optical cavity at the target wavelength.

In some embodiments of the device 4000 where the device is configured as a p-up device, the separation distance is ¹⁄₁₀ to ½ of the total thickness of the optical cavity, the first electrical polarity is n-type, and the second electrical polarity is p-type. In some embodiments of the device 4000 where the device is configured as a p-down device, the separation distance is ½ to ⁹⁄₁₀ of the total thickness of the optical cavity, the first electrical polarity is p-type, and the second electrical polarity is n-type. In some embodiments, the separation distance is less than 100 nm. In some embodiments, at least one of the light emitting region 4030, the first spacer region 4020a/b, and the second spacer region 4040a/b comprise a superlattice.

Figure 41:
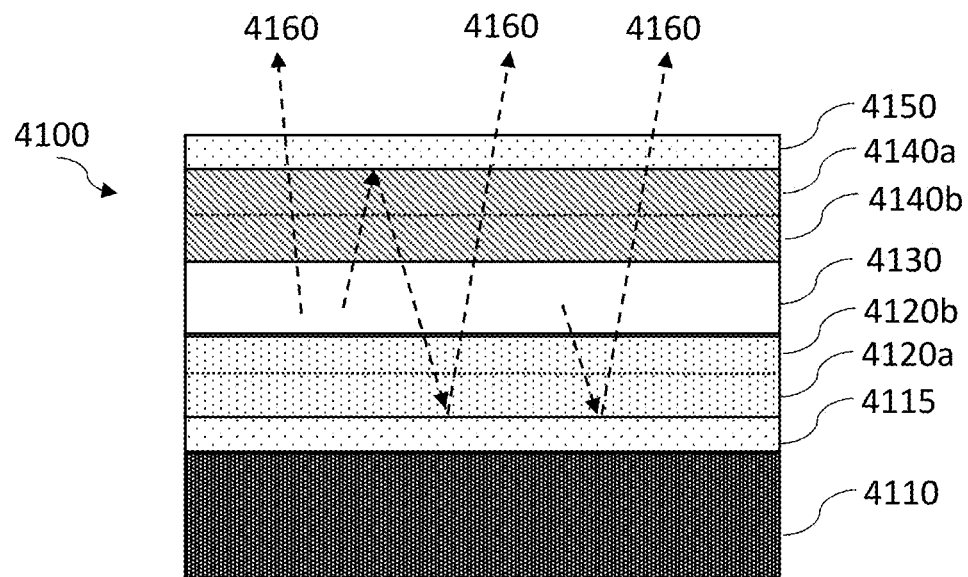
FIG. 41 is a vertical cross-section of another embodiment of a deep ultraviolet resonant optical cavity light emitting device having an opaque substrate.

FIG. 41 shows another embodiment of a resonant optical cavity LED having an opaque substrate and emitting light out of a top end of the device stack rather than through the substrate. In this vertical cross-sectional view, a device 4100 has an opaque substrate 4110, a first reflective layer 4115 on the substrate 4110, a first spacer region 4120a/b coupled to the first reflective layer 4115, a light emitting region 4130 on the first spacer region 4120a/b, a second spacer region 4140a/b on the LER 4130, and a second reflective layer 4150 coupled to the top of the device stack. As indicated by the arrows in FIG. 41, light 4160 emitted from the light emitting region 4130 is output through the second reflective layer 4150, either directly or after being reflected by first reflective layer 4115 and/or second reflective layer 4150. The same issues arise as described in relation to FIG. 40; however, reflective layer 4115 of FIG. 41 can be selected from a pure metallic reflector or a low optical refractive index material. Both of these criteria potentially limit the materials that can be selected for the device owing to at least one of: a difference in crystal structure mismatch between substrate and/or active layers, poor electrical conductivity, and poor thermal conductivity. For example, in one embodiment of the device 4100, epitaxial Gallium Oxide and Aluminium Oxide are deposited on a single crystal Silicon substrate. The Silicon substrate is preferably of high electrical conduction but optically opaque. The layer 4115 may be selected from reflective metal or dielectric semiconductor and deposited as a quarter wavelength optically reflective layer for light emanating toward it and generated from the active region. Such a device offers the ability for direct epitaxy of an AlGaN based active layer.

Substrate 4110 may be, for example, Silicon, Silicon-Carbide, Gallium-Oxide, Aluminium-Gallium Oxide, Gallium Arsenide, Germanium and other oxide substrates. The thickness of the substrate can be optionally thinned to enable electrical contact penetrations from the opaque substrate into the active region layers punctuating insulating reflective layer 4115. First reflective layer 4115 is a thick metal film having a metal composition comprising elemental aluminum and having a thickness greater than 15 nm. First spacer region 4120a/b is non-absorbing to the target wavelength, and at least a portion of the first spacer region 4120a/b comprises a first electrical polarity. In some embodiments, the first spacer region 4120a/b may include two layers, a doped layer 4120a of the first electrical polarity (e.g., n or p conductivity) and an undoped layer 4120b. Similarly, second spacer region 4140a/b is non-absorbing to the target wavelength, and at least a portion of the second spacer region 4140a/b comprises a second electrical polarity opposite of the first electrical polarity. In some embodiments, the second spacer region 4140a/b may include a doped layer 4140a of the second electrical polarity (e.g., p or n conductivity) and an undoped layer 4140b. Second reflective layer 4150 is coupled to the second spacer region 4140a/b. The second reflective layer 4150 is a thin film metal reflector, such as less than 15 nm thick, of a material that is highly reflective for the target wavelength. For example, for deep UV wavelengths, the second reflective layer 4150 may be a metal composition comprising elemental aluminum.

The device 4100 may have resonant optical cavity characteristics as described throughout this disclosure. For example, an optical cavity between the second reflective layer 4150 and the first reflective layer 4115 of the resonant optical cavity light emitting device 4100 may include the first spacer region 4120a/b, the second spacer region 4140a/b and the light emitting region 4130. The light emitting region 4130 is positioned at a separation distance from the second reflective layer 4150. The optical cavity has a total thickness less than or equal to K·λ/n. K is a constant ranging from 0.25 to 10, where λ is the target wavelength and n is an effective refractive index of the optical cavity at the target wavelength.

In some embodiments of the device 4100 where the device is configured as a p-up device, the separation distance is ¹⁄₁₀ to ½ of the total thickness of the optical cavity, the first electrical polarity is n-type, and the second electrical polarity is p-type. In some embodiments of the device 4100 where the device is configured as a p-down device, the separation distance is ½ to ⁹⁄₁₀ of the total thickness of the optical cavity, the first electrical polarity is p-type, and the second electrical polarity is n-type. In some embodiments, the separation distance is less than 100 nm. In some embodiments, at least one of the light emitting region 4130, the first spacer region 4120a/b, and the second spacer region 4140a/b comprise a superlattice.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A resonant optical cavity light emitting device comprising:
a substrate;
a first reflective layer on the substrate, the first reflective layer having a metal composition comprising elemental aluminum and having a thickness greater than 15 nm;
a first spacer region coupled to the first reflective layer, the first spacer region being non-absorbing to a target emission deep ultraviolet wavelength (target wavelength), wherein at least a portion of the first spacer region comprises a first electrical polarity;
a light emitting region on the first spacer region, the light emitting region being configured to emit the target wavelength;
a second spacer region on the light emitting region, the second spacer region being non-absorbing to the target wavelength, wherein at least a portion of the second spacer region comprises a second electrical polarity opposite of the first electrical polarity; and
a second reflective layer coupled to the second spacer region, the second reflective layer having a metal composition comprising elemental aluminum and having a thickness less than or equal to 15 nm;
wherein the substrate is optically opaque to the target wavelength;
wherein the first spacer region, the light emitting region and the second spacer region comprise AlN or AlGaN;
wherein the light emitting region is positioned at a separation distance from the second reflective layer; and
wherein the resonant optical cavity light emitting device has an optical cavity between the second reflective layer and the first reflective layer, the optical cavity comprising the first spacer region, the second spacer region and the light emitting region, wherein the optical cavity has a total thickness less than or equal to K·λ/n, wherein K is a constant ranging from 0.25 to 10, λ is the target wavelength, and n is an effective refractive index of the optical cavity at the target wavelength.

2. The device of claim 1, wherein the separation distance is 1/10 to 1/2 of the total thickness of the optical cavity; and
wherein the resonant optical cavity light emitting device is configured as a p-up device, the first electrical polarity being n-type, the second electrical polarity being p-type.

3. The device of claim 1, wherein the separation distance is 1/2 to 9/10 of the total thickness of the optical cavity; and
wherein the resonant optical cavity light emitting device is configured as a p-down device, the first electrical polarity being p-type, the second electrical polarity being n-type.

4. The device of claim 1, wherein the first spacer region comprises AlN, the light emitting region comprises AlN or AlGaN, and the second spacer region comprises AlN.

5. The device of claim 1, wherein at least one of the light emitting region, the first spacer region, and the second spacer region comprise a superlattice.

6. The device of claim 1, wherein the substrate is optically transparent to the target wavelength.

7. A resonant optical cavity light emitting device comprising:

a substrate that is opaque to a target emission deep ultraviolet wavelength (target wavelength);
a first reflective layer on the substrate, the first reflective layer being a distributed Bragg reflector (DBR) superlattice that has a reflectivity of greater than 90% for the target wavelength;
a first spacer region coupled to the first reflective layer, the first spacer region being non-absorbing to the target wavelength, wherein at least a portion of the first spacer region comprises a first electrical polarity;
a light emitting region on the first spacer region, the light emitting region being configured to emit the target wavelength;
a second spacer region on the light emitting region, the second spacer region being non-absorbing to the target wavelength, wherein at least a portion of the second spacer region comprises a second electrical polarity opposite of the first electrical polarity; and
a second reflective layer coupled to the second spacer region, the second reflective layer having a metal composition comprising elemental aluminum and having a thickness less than 15 nm;
wherein the light emitting region is positioned at a separation distance from the second reflective layer; and
wherein the resonant optical cavity light emitting device has an optical cavity between the second reflective layer and the first reflective layer, the optical cavity comprising the first spacer region, the second spacer region and the light emitting region, wherein the optical cavity has a total thickness less than or equal to K·λ/n, wherein K is a constant ranging from 0.25 to 10, λ is the target wavelength, and n is an effective refractive index of the optical cavity at the target wavelength.

8. The device of claim 7, wherein the DBR superlattice is a metal-dielectric stack.

9. The device of claim 8, wherein a first material of the metal-dielectric stack and a second material of the metal-dielectric stack each have a quarter wavelength thickness.

10. The device of claim 8, wherein a first material of the metal-dielectric stack is AlN and a second material of the metal-dielectric stack comprises aluminum metal.

11. The device of claim 8, wherein a first material of the metal-dielectric stack is AlN and a second material is a periodic stack of aluminum metal and AlN.

12. The device of claim 7, wherein the substrate is a semiconductor material.

13. The device of claim 7, wherein the substrate is a metal.

14. The device of claim 7, wherein at least one of the light emitting region, the first spacer region, and the second spacer region comprise a superlattice.

15. A resonant optical cavity light emitting device comprising:
a substrate that is opaque to a target emission deep ultraviolet wavelength (target wavelength);
a first reflective layer on the substrate, the first reflective layer comprising a dielectric semiconductor;
a first spacer region coupled to the first reflective layer, the first spacer region being non-absorbing to the target wavelength, wherein at least a portion of the first spacer region comprises a first electrical polarity;
a light emitting region on the first spacer region, the light emitting region being configured to emit the target wavelength;
a second spacer region on the light emitting region, the second spacer region being non-absorbing to the target wavelength, wherein at least a portion of the second spacer region comprises a second electrical polarity opposite of the first electrical polarity; and a second reflective layer coupled to the second spacer region, the second reflective layer having a metal composition comprising elemental aluminum and having a thickness less than 15 nm;

wherein the light emitting region is positioned at a separation distance from the second reflective layer; and wherein the resonant optical cavity light emitting device has an optical cavity between the second reflective layer and the first reflective layer, the optical cavity comprising the first spacer region, the second spacer region and the light emitting region, wherein the optical cavity has a total thickness less than or equal to $K \cdot \lambda/n$, wherein K is a constant ranging from 0.25 to 10, $\lambda$ is the target wavelength, and n is an effective refractive index of the optical cavity at the target wavelength.

16. The device of claim 15, wherein the dielectric semiconductor comprises gallium oxide and aluminum oxide.

17. The device of claim 16, wherein the substrate is single crystal silicon.

\* \* \* \* \*